(12) United States Patent
Di et al.

(10) Patent No.: US 12,235,558 B2
(45) Date of Patent: Feb. 25, 2025

(54) SUBSTRATE, METHOD FOR MANUFACTURING SAME, AND DISPLAY PANEL

(71) Applicant: BOE Technology Group Co., Ltd., Beijing (CN)

(72) Inventors: Yunping Di, Beijing (CN); Lizhong Wang, Beijing (CN); Ce Ning, Beijing (CN); Binbin Tong, Beijing (CN); Liping Lei, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/017,413

(22) PCT Filed: Mar. 31, 2022

(86) PCT No.: PCT/CN2022/084574
§ 371 (c)(1),
(2) Date: Jan. 23, 2023

(87) PCT Pub. No.: WO2023/184406
PCT Pub. Date: Oct. 5, 2023

(65) Prior Publication Data
US 2024/0255820 A1    Aug. 1, 2024

(51) Int. Cl.
G02F 1/1368    (2006.01)
G02F 1/1362    (2006.01)
H01L 27/12    (2006.01)

(52) U.S. Cl.
CPC ...... G02F 1/1368 (2013.01); G02F 1/136209 (2013.01); G02F 1/136227 (2013.01);
(Continued)

(58) Field of Classification Search
CPC ............. G02F 1/1368; G02F 1/136209; G02F 1/136227; G02F 1/136295; H01L 27/1244; H01L 27/1288
See application file for complete search history.

(56) References Cited

U.S. PATENT DOCUMENTS 6,856,360 B1    2/2005    Higuchi et al.
7,893,438 B2    2/2011    Kim et al.
(Continued)

FOREIGN PATENT DOCUMENTS

CN    101819988 A    9/2010
CN    104282696 A    1/2015
(Continued)

*Primary Examiner* — James A Dudek
(74) *Attorney, Agent, or Firm* — XSENSUS LLP

(57) ABSTRACT

Provided is a substrate. The substrate includes a base substrate; and a plurality of sub-pixel structures arranged in an array on the base substrate, wherein the sub-pixel structure comprises: a thin film transistor disposed on the base substrate, the thin film transistor comprising a source and a drain; an insulating layer disposed on a side of the thin film transistor distal from the base substrate, a first via hole being formed in the insulating layer; a pixel electrode disposed on a side of the insulating layer distal from the base substrate, the pixel electrode being electrically connected to either the source or the drain through the first via hole; and a filling block disposed at the first via hole.

19 Claims, 31 Drawing Sheets

(52) U.S. Cl.
 CPC .... *G02F 1/136295* (2021.01); *H01L 27/1244* (2013.01); *H01L 27/1288* (2013.01)

(56) References Cited

U.S. PATENT DOCUMENTS

| | | |
|---|---|---|
| 8,283,219 B2 | 10/2012 | Kim et al. |
| 9,917,198 B2 | 3/2018 | Xie |
| 11,296,162 B2 | 4/2022 | Yuan et al. |
| 11,462,602 B2 | 10/2022 | Huang et al. |
| 11,594,064 B2 | 2/2023 | Niu et al. |
| 2005/0082534 A1 | 4/2005 | Kim et al. |
| 2011/0117687 A1 | 5/2011 | Kim et al. |
| 2016/0260840 A1 | 9/2016 | Xie |
| 2019/0013409 A1 | 1/2019 | Li et al. |
| 2019/0333938 A1 | 10/2019 | Wang |
| 2020/0411619 A1 | 12/2020 | Huang et al. |
| 2021/0134905 A1 | 5/2021 | Zhang et al. |
| 2021/0233982 A1 | 7/2021 | Yuan et al. |
| 2022/0019755 A1 | 1/2022 | Niu et al. |
| 2022/0278182 A1 | 9/2022 | Yuan et al. |
| 2022/0308377 A1* | 9/2022 | Ozeki ................. H01L 29/7869 |

FOREIGN PATENT DOCUMENTS

| | | |
|---|---|---|
| CN | 105931986 A | 9/2016 |
| CN | 106531692 A | 3/2017 |
| CN | 108461505 A | 8/2018 |
| CN | 109904211 A | 6/2019 |
| CN | 110289270 A | 9/2019 |
| CN | 110752220 A | 2/2020 |
| CN | 111708203 A | 9/2020 |

\* cited by examiner

A1-A2

B1-B2

SUBSTRATE, METHOD FOR MANUFACTURING SAME, AND DISPLAY PANEL

CROSS-REFERENCE TO RELATED APPLICATION

This application is a U.S. national stage of international application No. PCT/CN2022/084574, filed on Mar. 31, 2022, the disclosure of which is incorporated herein by reference in its entirety.

TECHNICAL FIELD

The application relates to the field of display technologies, and in particular, relates to a substrate, a method for manufacturing the same, and a display panel.

BACKGROUND OF THE INVENTION

A display panel generally includes a substrate, and the substrate is a device for controlling the display panel.

SUMMARY OF THE INVENTION

Embodiments of the present disclosure provide a substrate, a method for manufacturing the same, and a display panel. The technical solutions are as follows.

According to an aspect of the present disclosure, a substrate is provided. The substrate includes:
a base substrate; and
a plurality of sub-pixel structures arranged in an array on the base substrate, wherein the sub-pixel structure includes:
a thin film transistor disposed on the base substrate, the thin film transistor including a source and a drain;
an insulating layer disposed on a side of the thin film transistor distal from the base substrate, a first via hole being formed in the insulating layer;
a pixel electrode disposed on a side of the insulating layer distal from the base substrate, the pixel electrode being electrically connected to either the source or the drain through the first via hole; and
a filling block disposed at the first via hole.

Optionally, the thin film transistor further includes an active layer and a gate line; wherein the active layer is disposed on a side, proximal to the base substrate, of the source and the drain, and the active layer is electrically connected to the source and the drain; and the gate line is disposed on a side of the active layer distal from the base substrate, and an orthographic projection of the gate line on the base substrate is overlapped with an orthographic projection of the active layer on the base substrate;
wherein an orthographic projection of a center of the first via hole on the base substrate is between orthographic projections of two active layers adjacent in a first direction on the base substrate, the first direction being parallel to an extension direction of the gate line.

Optionally, the base substrate further includes a connecting line disposed on a side of the gate line distal from the base substrate; wherein an orthographic projection of one end of the connecting line on the base substrate is overlapped with an orthographic projection of the first via hole on the base substrate, and an orthographic projection of the other end of the connecting line on the base substrate is overlapped with an orthographic projection of a first electrode on the base substrate, the first electrode being the source or drain that is electrically connected to the pixel electrode; and
a material of the connecting line includes a light-transmitting conductive material, one end of the connecting line is electrically connected to the pixel electrode, and the other end of the connecting line is electrically connected to the first electrode.

Optionally, the thin film transistor further includes an active layer and a gate line; wherein the active layer is disposed on a side, proximal to the base substrate, of the source and the drain, and the active layer is electrically connected to the source and the drain; and the gate line is disposed on a side of the active layer distal from the base substrate, and an orthographic projection of the gate line on the base substrate is overlapped with an orthographic projection of the active layer on the base substrate;
the substrate further includes: a light shielding pattern disposed on a side of the active layer proximal to the base substrate, wherein an orthographic projection of the light shielding pattern on the base substrate is overlapped with the orthographic projection of the active layer on the base substrate, and a surface of the light shielding pattern facing the base substrate is a reflective surface.

Optionally, the light shielding pattern includes: a first base, and a reflective layer disposed on a surface of the first base facing the base substrate; wherein a material of the first base includes at least one of titanium, tin and molybdenum, and a material of the reflective layer includes aluminum; or
a material of the light shielding pattern includes an aluminum alloy.

Optionally, the active layer includes a source contact portion, a drain contact portion, and an intermediate portion disposed between the source contact portion and the drain contact portion; wherein a size of the source contact portion in a first direction and a size of the drain contact portion in the first direction are greater than a size of the intermediate portion in the first direction; and the orthographic projection of the active layer on the base substrate is at least partially overlapped with the orthographic projection of the light shielding pattern on the base substrate; an extension direction of the gate line being parallel to the first direction.

Optionally, the light shielding pattern includes a plurality of light shielding portions and a plurality of connecting portions; wherein the light shielding portion is connected to the connecting portion, the light shielding portion is extended along a first direction, and the plurality of light shielding portions are arranged along a second direction; and the connecting portions are disposed on two sides of the light shielding portion in the second direction, the connecting portion is extended along the second direction, and the plurality of connecting portions are arranged along the first direction; wherein the second direction intersects the first direction.

Optionally, wherein edges, in the first direction, of an orthographic projection of the connecting portion on the base substrate are flush with edges, in the first direction, of orthographic projections of the source contact portion and the drain contact portion of the active layer on the base substrate.

Optionally, an edge, in the second direction, of an orthographic projection of the light shielding portion on the base substrate is flush with an edge, in the second direction, of the orthographic projection of the gate line on the base substrate.

Optionally, the substrate further includes: a data line disposed on a side, distal from the base substrate, of the source and the drain;
wherein the insulating layer includes a first insulating layer and a planarization layer sequentially laminated in a direction distal from the base substrate, wherein the first insulating layer is disposed on the side, distal from the base substrate, of the source and the drain; and the planarization layer is disposed on a side of the data line distal from the base substrate; wherein a second via hole is formed in the first insulating layer, and the data line is electrically connected to either the source or the drain through the second via hole.

Optionally, the insulating layer further includes a second insulating layer disposed between the first insulating layer and the planarization layer, wherein the second insulating layer is disposed on the side of the data line distal from the base substrate.

Optionally, an extension direction of the data line is parallel to the second direction, and an orthographic projection of the connecting portion on the base substrate is within an orthographic projection of the data line on the base substrate.

Optionally, the substrate further includes a common electrode pattern disposed on a side of the pixel electrode distal from the base substrate; wherein the common electrode pattern includes a first electrode portion, wherein a material of the first electrode portion includes metal, the first electrode portion includes a plurality of first strip-shaped electrodes, and an orthographic projection of the connecting portion on the base substrate is within an orthographic projection of the first electrode portion on the base substrate.

Optionally, the substrate further includes a data line disposed on a side, distal from the base substrate, of the source and the drain, wherein an orthographic projection of the data line on the base substrate and the orthographic projection of the active layer on the base substrate are within the orthographic projection of the first electrode portion on the base substrate.

Optionally, the common electrode pattern further includes a transparent electrode layer; wherein the first electrode portion is disposed on a side of the transparent electrode layer proximal to the base substrate.

Optionally, the common electrode pattern further includes a transparent electrode layer; wherein the first electrode portion is disposed on a side of the transparent electrode layer distal from the base substrate.

Optionally, the common electrode pattern further includes a second electrode portion; wherein a material of the second electrode portion includes a light-transmitting conductive material, the second electrode portion includes a plurality of second strip-shaped electrodes, and the first strip-shaped electrodes and the second strip-shaped electrodes are alternately arranged.

Optionally, the substrate further includes a compensation electrode and a data line; wherein the insulating layer includes a first insulating layer, a third insulating layer, a second insulating layer and a planarization layer which are sequentially laminated along a direction distal from the base substrate; wherein the first insulating layer is disposed on a side, distal from the base substrate, of the source and the drain; the compensation electrode is disposed between the first insulating layer and the third insulating layer; the data line is disposed between the third insulating layer and the second insulating layer; the common electrode pattern is disposed on a side of the planarization layer distal from the base substrate; and the compensation electrode is electrically connected to the common electrode pattern, and an orthogonal projection of the compensation electrode on the base substrate is overlapped with an orthogonal projection of the data line on the base substrate.

Optionally, at least one of the plurality of sub-pixel structures includes a first filling block protruding from the first via hole.

Optionally, a distance between a surface of a side of the first filling block distal from the base substrate and a surface of a side of the insulating layer distal from the base substrate in a thickness direction of the substrate is greater than 0 μm and less than 1 μm.

Optionally, the intermediate portion includes two lightly drain doping regions and a channel region, the lightly drain doping regions being disposed on two sides of the channel region; wherein
an orthographic projection of the channel region on the base substrate is within an orthographic projection of the light shielding portion on the base substrate, and orthographic projections of the source contact portion, the drain contact portion and the two lightly drain doping regions on the base substrate are within an orthographic projection of the connecting portion on the base substrate.

Optionally, the intermediate portion includes three lightly drain doping regions and two channel regions, the lightly drain doping regions and the channel regions being alternately arranged; wherein
orthographic projections of the two channel regions on the base substrate and an orthographic projection of the lightly drain doping region between the two channel regions on the base substrate are within an orthographic projection of the light shielding portion on the base substrate, and orthographic projections of the source contact portion, the drain contact portion and the lightly drain doping regions on two sides of the two channel regions on the base substrate are within an orthographic projection of the connecting portion on the base substrate.

Optionally, the intermediate portion includes three lightly drain doping regions and two channel regions, the lightly drain doping regions and the channel regions being alternately arranged; wherein
orthographic projections of the two channel regions on the base substrate and an orthographic projection of the lightly drain doping region between the two channel regions on the base substrate are within an orthographic projection of the light shielding portion on the base substrate, and an orthographic projection of the connecting portion on the base substrate is within orthographic projections of the source contact portion, the drain contact portion and the lightly drain doping regions on two sides of the two channel regions on the base substrate.

Optionally, the intermediate portion includes four lightly drain doping regions, two channel regions and one heavily drain doping region, the lightly drain doping regions and the channel regions being alternately arranged, and the heavily drain doping region being disposed between the two lightly drain doping regions between the two channel regions; wherein
an orthographic projection of the intermediate portion on the base substrate is within an orthographic projection of the light shielding portion on the base substrate.

According to an aspect of the present disclosure, a method for manufacturing a substrate is provided. The method includes:

acquiring a base substrate; and forming a plurality of sub-pixel structures on the base substrate, the plurality of sub-pixel structures being arranged in an array on the base substrate;

wherein forming the sub-pixel structure on the base substrate includes:

forming a thin film transistor on the base substrate, the thin film transistor including a source and a drain;

forming an insulating layer on the base substrate on which the thin film transistor is formed, a first via hole being formed in the insulating layer;

forming a pixel electrode on the base substrate on which the insulating layer is formed, the pixel electrode being electrically connected to either the source or the drain through the first via hole; and forming a filling block on the base substrate on which the pixel electrode is formed, the filling block being disposed at the first via hole.

Optionally, forming the thin film transistor on the base substrate includes:

forming an active material pattern on the base substrate;

forming a fifth insulating layer and a first metal material layer on the base substrate on which the active material pattern is formed;

processing the first metal material layer through a dry etching process to acquire a gate line;

implanting ions into a surface of a side of the active material pattern distal from the base substrate through a first ion implantation process by using the gate line as a mask to form an undoped region and a lightly drain doping region;

forming a first photoresist pattern on the base substrate on which the lightly drain doping region is formed;

implanting ions into the surface of the side of the active material pattern distal from the base substrate through a second ion implantation process by using the first photoresist pattern as a mask to form a heavily drain doping region and a lightly drain doping region; and removing the first photoresist pattern to form an active layer including two heavily drain doping regions, three lightly drain doping regions and two undoped regions.

Optionally, forming the thin film transistor on the base substrate includes:

forming an active material pattern on the base substrate;

forming a fifth insulating layer and a first metal material layer on the base substrate on which the active material pattern is formed;

forming a second photoresist pattern on the base substrate on which first metal material layer is formed and processing the first metal material layer through a wet etching process to acquire a gate pattern;

implanting ions into a surface of a side of the active material pattern distal from the base substrate through a first ion implantation process by using the second photoresist pattern as a mask to form an undoped region and a heavily drain doping region;

forming a third photoresist pattern on the base substrate on which the heavily drain doping region is formed, and processing the gate pattern through a dry etching process to acquire a gate line; and removing the third photoresist pattern, and implanting ions into the surface of the side of the active material pattern distal from the base substrate through a second ion implantation process by using the gate line as a mask to form a lightly drain doping region and an undoped region, so as to acquire an active layer including two heavily drain doping regions, three lightly drain doping regions and two undoped regions.

Optionally, forming the thin film transistor on the base substrate includes:

forming an active material pattern on the base substrate;

forming a fifth insulating layer and a first metal material layer on the base substrate on which the active material pattern is formed;

forming a fourth photoresist pattern on the base substrate on which first metal material layer is formed and processing the first metal material layer through a wet etching process to acquire a gate line;

implanting ions into a surface of a side of the active material pattern distal from the base substrate through a first ion implantation process by using the fourth photoresist pattern as a mask to form an undoped region and a heavily drain doping region; and removing the fourth photoresist pattern, and implanting ions into the surface of the side of the active material pattern distal from the base substrate through a second ion implantation process by using the gate line as a mask to form a lightly drain doping regions and an undoped region, so as to acquire an active layer including three heavily drain doping regions, four lightly drain doping regions and two undoped regions.

Optionally, forming the thin film transistor on the base substrate includes:

forming an active material pattern on the base substrate;

forming a fifth insulating layer and a first metal material layer on the base substrate on which the active material pattern is formed;

forming a fifth photoresist pattern on the base substrate on which first metal material layer is formed;

processing the first metal material layer through a wet etching process to acquire a gate pattern;

implanting ions into a surface of a side of the active material pattern distal from the base substrate through a first ion implantation process by using the fifth photoresist pattern as a mask to form an undoped region and a heavily drain doping region;

ashing the fifth photoresist pattern to form a sixth photoresist pattern, and processing the gate pattern through a dry etching process to acquire a gate line; and removing the sixth photoresist pattern, implanting ions into the surface of the side of the active material pattern distal from the base substrate through a second ion implantation process by using the gate line as a mask to form a lightly drain doping region and an undoped region, so as to acquire an active layer including three heavily drain doping regions, four lightly drain doping regions and two undoped regions.

Optionally, forming the thin film transistor on the base substrate includes:

forming an active material pattern and a seventh photoresist pattern on the base substrate;

implanting ions into a surface of a side of the active material pattern distal from the base substrate through a first ion implantation process by using the seventh photoresist pattern as a mask to form an undoped region and a heavily drain doping region;

removing the seventh photoresist pattern, and forming a fifth insulating layer and a first metal material layer on the base substrate on which the active material pattern is formed;

processing the first metal material layer through a dry etching process to acquire a gate line; and implanting ions into the surface of the side of the active material pattern distal from the base substrate through a second ion implantation process by using the gate line as a mask to form a lightly drain doping region and an undoped region, so as to acquire an active layer including two heavily drain doping regions, three lightly drain doping regions and two undoped regions.

Optionally, forming the thin film transistor on the base substrate includes:

forming an active material pattern and an eighth photoresist pattern on the base substrate;

implanting ions into a surface of a side of the active material pattern distal from the base substrate through a first ion implantation process by using the eighth photoresist pattern as a mask to form an undoped region and a heavily drain doping region;

exposing the eighth photoresist pattern to acquire a ninth photoresist pattern, and implanting ions into the surface of the side of the active material pattern distal from the base substrate through a second ion implantation process by using the ninth photoresist pattern as a mask to form a lightly drain doping region and an undoped region, so as to acquire an active layer including two heavily drain doping regions, three lightly drain doping regions and two undoped regions;

forming a fifth insulating layer and a first metal material layer on the base substrate on which the active layer is formed; and processing the first metal material layer through a dry etching process to acquire a gate line.

Optionally, forming the thin film transistor on the base substrate further includes:

forming a gate insulating layer on the base substrate on which the gate line is formed;

forming a third via hole and a fourth via hole in the gate insulating layer and the fifth insulating layer, the third via hole and the fourth via hole being on a side of the heavily drain doping region distal from the base substrate; and forming a source/drain layer on the base substrate on which the gate insulating layer is formed, wherein the source/drain layer includes a source and a drain which are electrically connected to the heavily drain doping region through the third via hole and the fourth via hole respectively.

According to still another aspect of the present disclosure, a display panel is provided. The display panel includes: a first base substrate, and the substrate described in the above aspect, wherein the substrate is disposed on the base substrate.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

Figure 1:
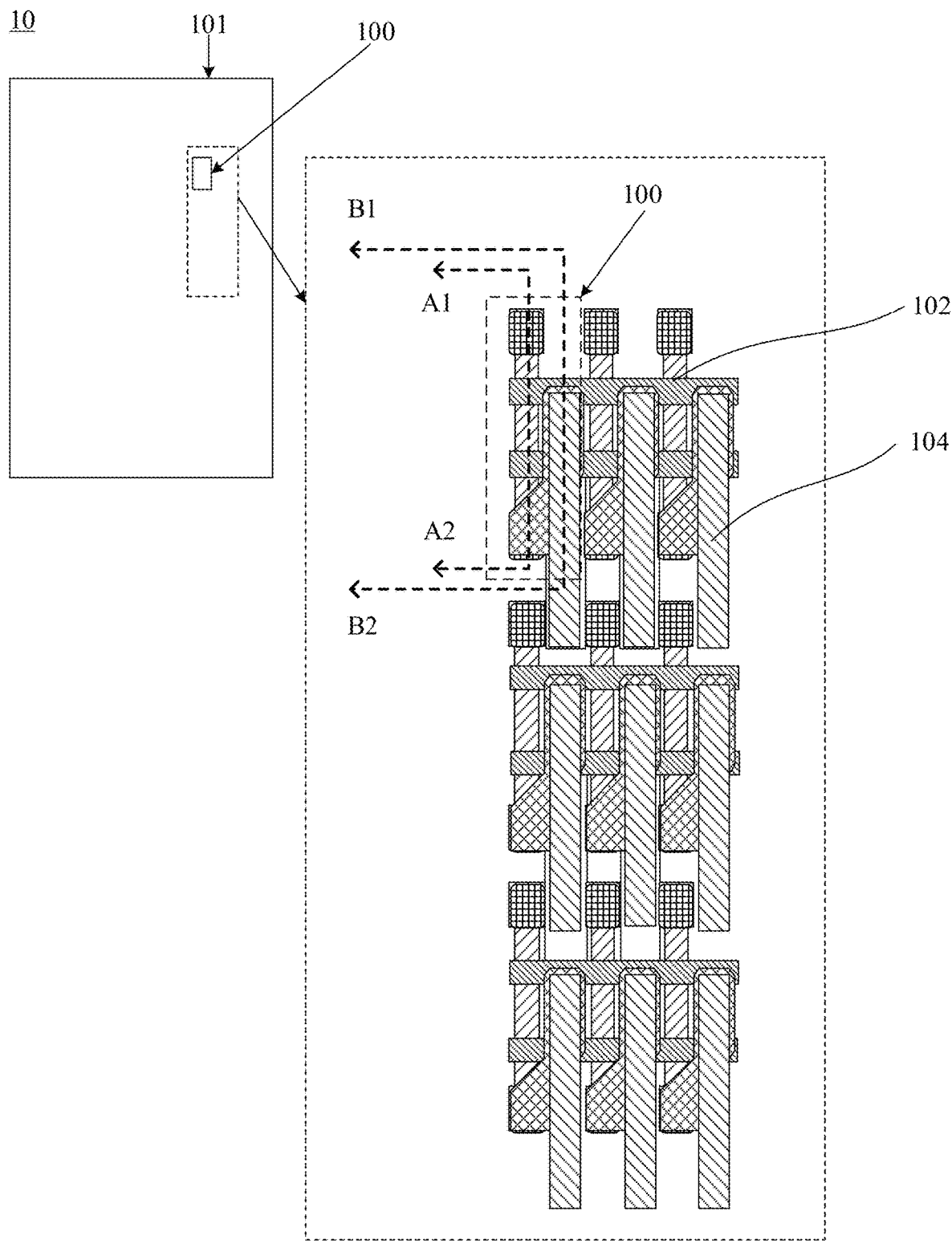
FIG. 1 is a schematic structural diagram of a substrate according to an embodiment of the present disclosure.

Specific embodiments of the present disclosure have been shown by means of the above accompanying drawings, and will be described in more detail below. These accompanying drawings and textual descriptions are not intended to limit the scope of the concept of the present disclosure by any means, but are used to illustrate the concept of the present disclosure to those skilled in the art with reference to the specific embodiments.

DETAILED DESCRIPTION

For clearer descriptions of the objectives, technical solutions, and advantages of the present disclosure, the embodiments of the present disclosure are described in detail hereinafter with reference to the accompanying drawings.

With the development of virtual reality (VR) technologies, there is an increasing demand for display panels with high pixels per inch (PPI) and a large aperture ratio. The aperture ratio may be a ratio of the area of a part that allows light to transmit in a sub-pixel region to the area of the whole sub-pixel. The larger the aperture ratio of the display panel is, the higher the efficiency of light emitted from the interior of the display panel passing through the film layers of the display panel is.

In the related art, a display panel includes a substrate, a liquid crystal layer disposed on the substrate, and a black matrix disposed on the side, distal from the substrate, of the liquid crystal layer. The substrate may include a pixel electrode, a thin film transistor, and an insulating layer disposed between the pixel electrode and the thin film transistor. The thin film transistor includes a source and a drain; and the pixel electrode is connected to the source or the drain of the thin film transistor through a first via hole in the insulating layer, such that the pixel electrode is controlled through the thin film transistor. The pixel electrode may be configured to drive liquid crystals in the liquid crystal layer.

However, due to the relatively large size of the first via hole in the insulating layer, the film layer above the insulating layer is relatively poor in flatness. For example, liquid crystals in the liquid crystal layer above the first via hole cannot deflect normally, resulting in light leakage of the display panel. The liquid crystals that cannot deflect normally can only be shielded by using a black matrix, so as to prevent light leaked out of the liquid crystal layer from exiting the display panel. However, the black matrix with the shielding effect reduces a light-emitting area of the display panel, thereby reducing the aperture ratio of the display panel.

Part and all of the above technical problems can be optimized by the following limited embodiments of the present disclosure.

The substrate according to the embodiments of the present disclosure may be applied to a display region of a display panel.

The substrate according to the embodiments of the present disclosure may be applied to a small-sized mobile device, a notebook computer (NB), a tablet computer, a small and medium-sized monitor (MNT), a large and medium-sized television (TV), a large and medium-sized MNT and other products.

The substrate according to the embodiments of the present disclosure may be applicable to the display field or the chip field. The display field may be technical fields of liquid crystal display (LCD) panels, organic light-emitting diode (OLED) display panels, quantum dot light-emitting diodes (QLED) display panels, micro light-emitting diode (Micro LED) display panels, sensors and others.

Figure 2:
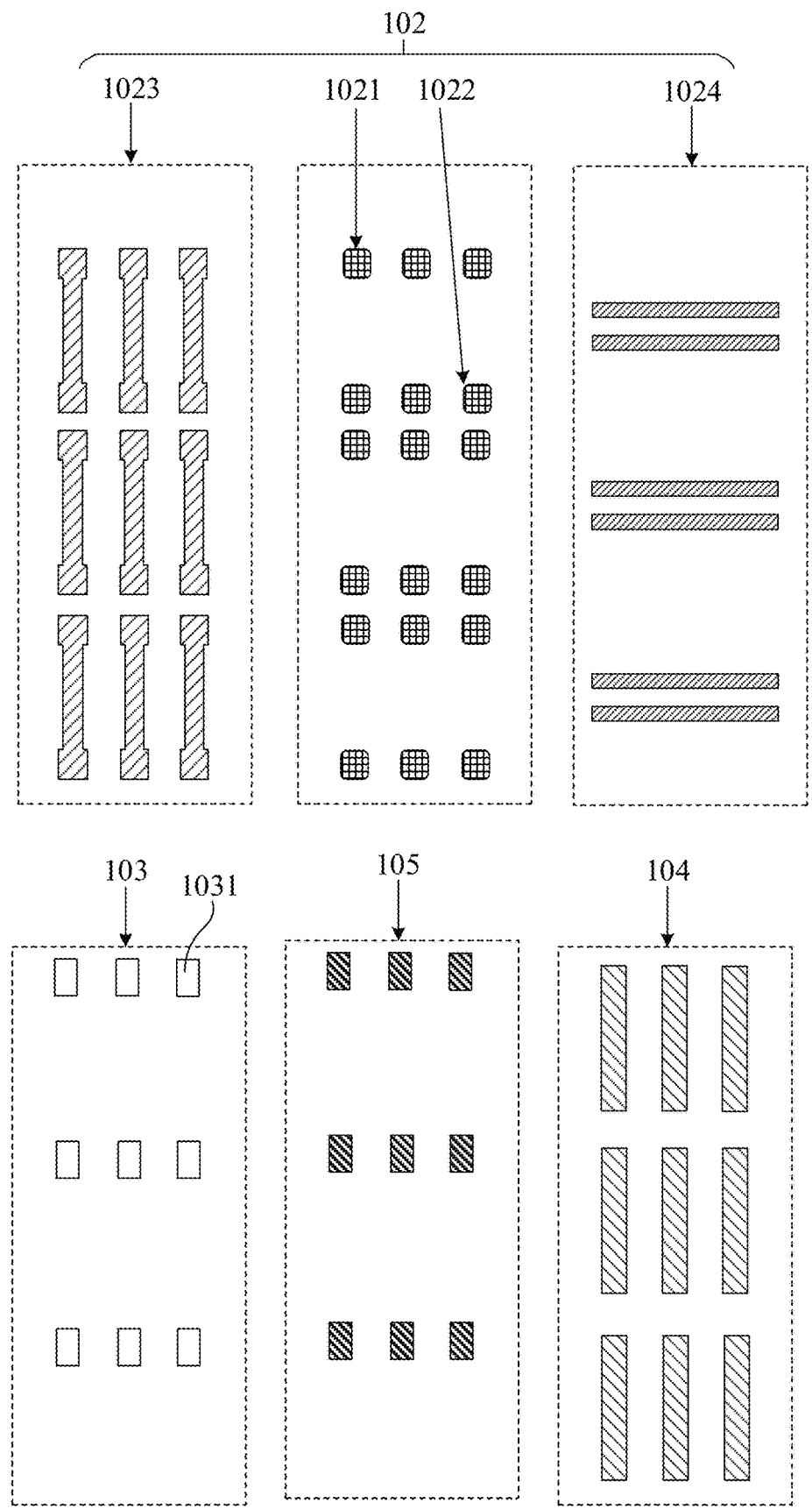
FIG. 2 is a schematic diagram of partial film layers of the substrate shown in FIG. 1.
Figure 3:
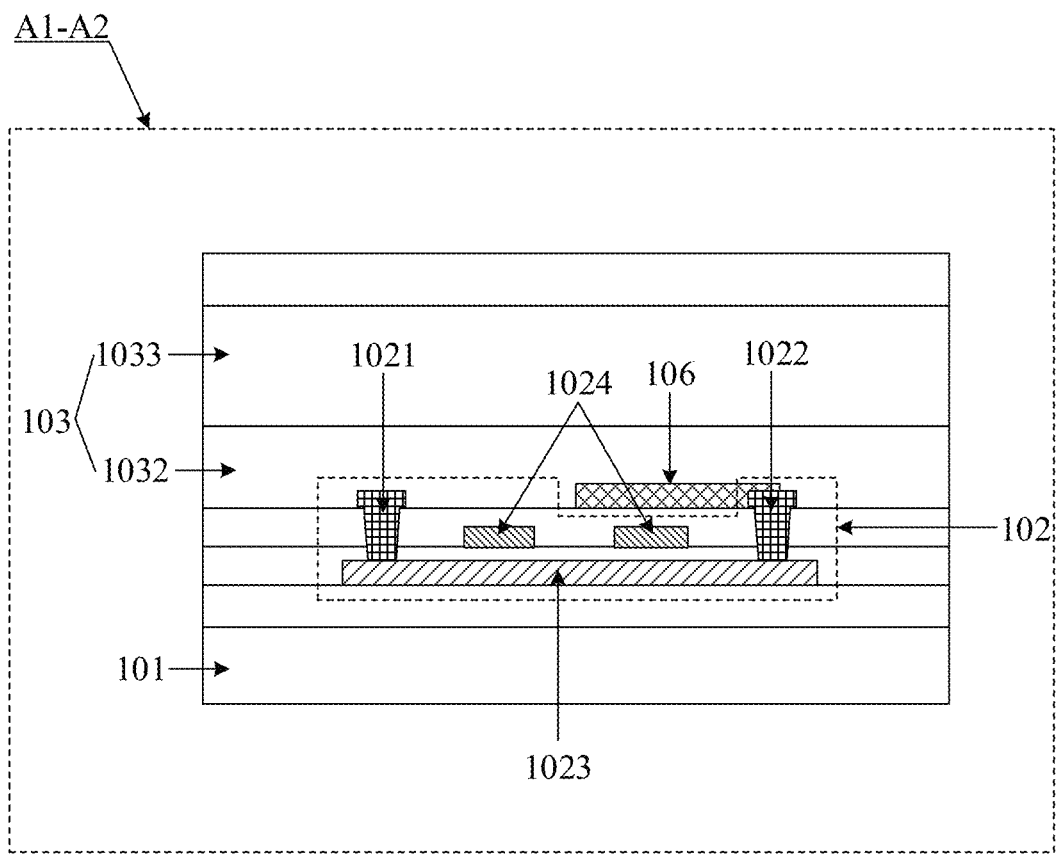
FIG. 3 is a schematic structural diagram of sections of the substrate shown in FIG. 1 along A1-A2 and B1-B2.
Figure 3:
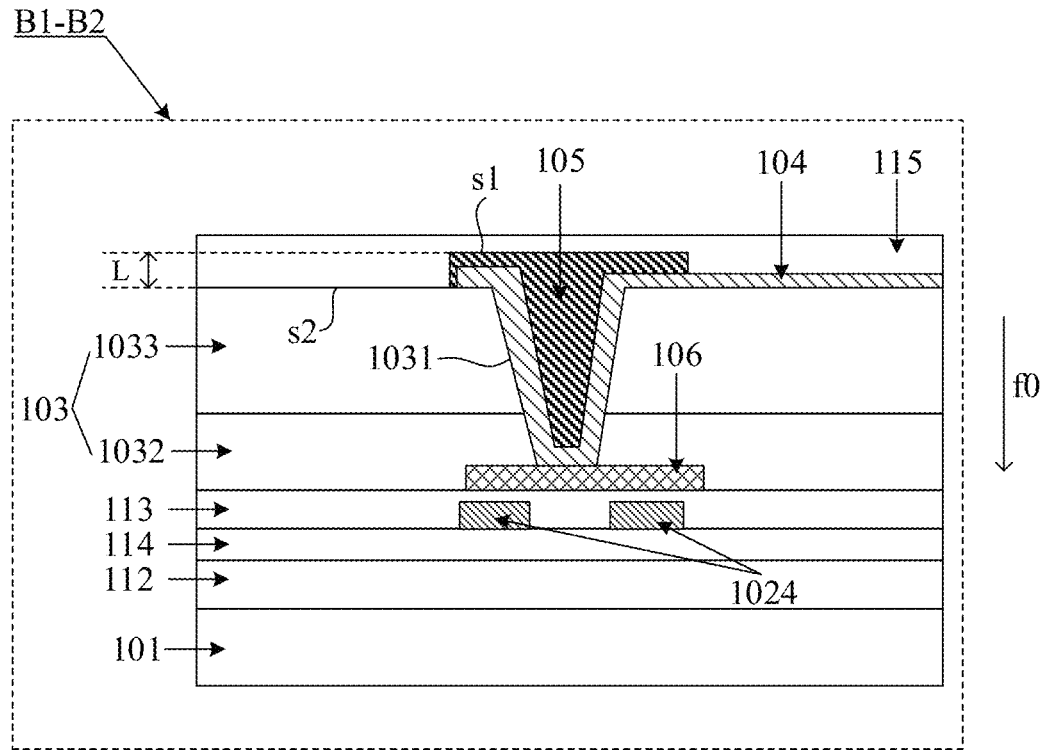

FIG. 1 is a schematic structural diagram of a substrate according to an embodiment of the present disclosure; FIG. 2 is a schematic diagram of partial film layers of the substrate shown in FIG. 1; and FIG. 3 is a schematic structural diagram of sections of the substrate shown in FIG. 1 along A1-A2 and B1-B2. The substrate 10 may include a base substrate 101 and a plurality of sub-pixel structures 100. The sub-pixel structures 100 may be arranged in an array on the base substrate 101. The sub-pixel structure 100 may include a thin film transistor 102, an insulating layer 103, a pixel electrode 104 and a filling block 105.

FIG. 2 shows six film layers along the direction distal from the base substrate 101 in the substrate 10. The six film layers include: an active layer 1023, a gate line 1024, and source and drain (a source 1021 and a drain 1022) of the thin film transistor 102, an insulating layer 103 and a first via hole 1031 therein, a filling block 105, and a pixel electrode 104.

The thin film transistor 102 may be disposed on the base substrate 101, and may include a source 1021 and a drain 1022. The source 1021 and the drain 1022 may be disposed on the same layer and may be prepared by the same patterning process. It should be noted that, in the embodiments of the present disclosure, the function of the "source" and the function of the "drain" are interchangeable sometimes in the case that a thin film transistor with opposite polarity is used or in the case that the direction of current changes in a circuit. Therefore, in this description, the "source" and the "drain" may be interchangeable, which is not limited in the embodiments of the present disclosure.

The insulating layer 103 may be disposed on the side of the thin film transistor 102 distal from the base substrate 101, and a first via hole 1031 may be formed in the insulating layer 103. The pixel electrode 104 may be disposed on the side of the insulating layer 103 distal from the base substrate 101, and may be electrically connected to either the source 1021 or the drain 1022 of the thin film transistor 102 through the first via hole 1031. In this way, the on/off state of the pixel electrode 104 can be controlled through the thin film transistor 102. The insulating layer 103 may be a single-layer structure or a multi-layer structure.

The filling block 105 may be disposed on the side of the pixel electrode 104 distal from the base substrate 101, and may be disposed at the first via hole 1031. The filling block 105 may be disposed in the first via hole 1031 to fill up the first via hole 1031, such that the film layer on the side of the insulating layer 103 distal from the base substrate 101 has good flatness.

For example, the film layer on the side of the insulating layer 103 distal from the base substrate 101 includes a liquid crystal layer in the display panel. As the filling block 105 is disposed at the first via hole 1031, the liquid crystal layer has good flatness, thereby avoiding the phenomenon of light leakage caused by the abnormal deflection of liquid crystals in the liquid crystal layer disposed on a side, distal from the base substrate, of the first via hole 1031. Therefore, the aperture ratio of the display panel can be increased without arranging a black matrix on the side, distal from the base substrate 101, of the liquid crystal layer above the first via hole 1031.

In summary, the embodiment of the present disclosure provides a substrate. The thin film transistor in the substrate may be electrically connected to the pixel electrode through the first via hole in the insulating layer. In addition, by arranging the filling block in the first via hole of the insulating layer, the flatness of the film layer above the first via hole of the insulating layer is good, thereby improving the quality of the film layer above the insulating layer.

Figure 4:
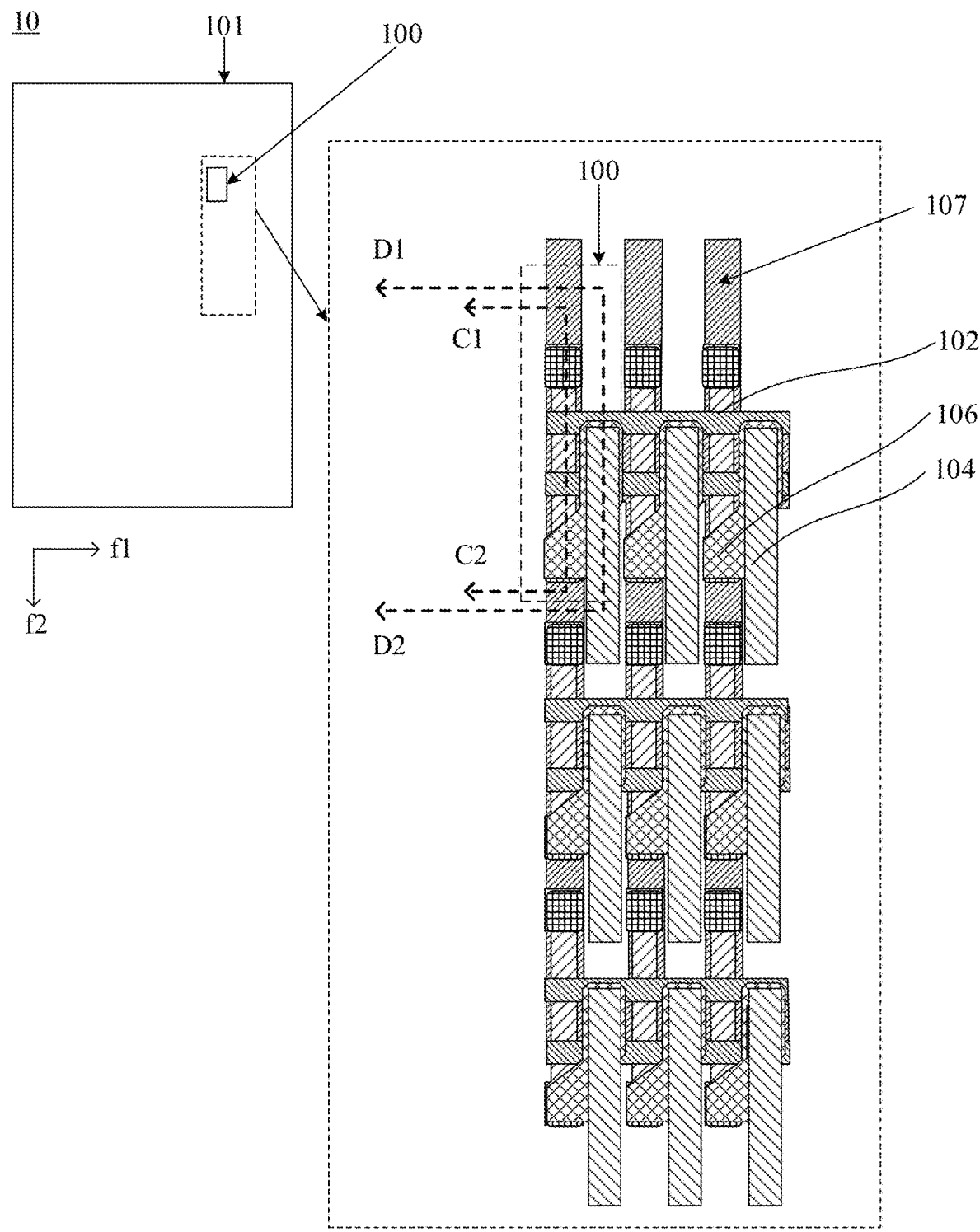
FIG. 4 is a schematic structural diagram of another substrate according to an embodiment of the present disclosure.
Figure 5:
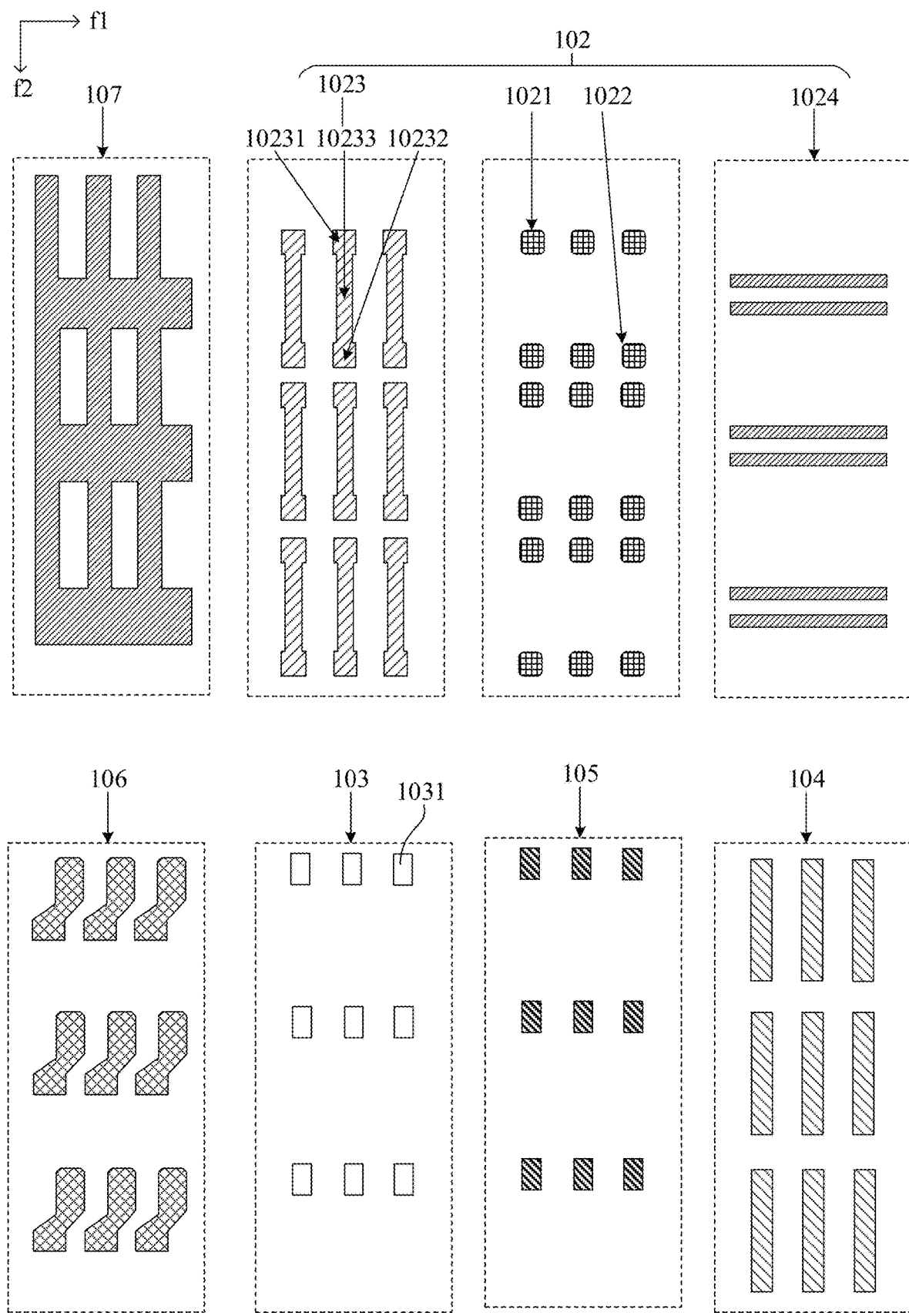
FIG. 5 is a schematic diagram of partial film layers of the substrate shown in FIG. 4.
Figure 6:
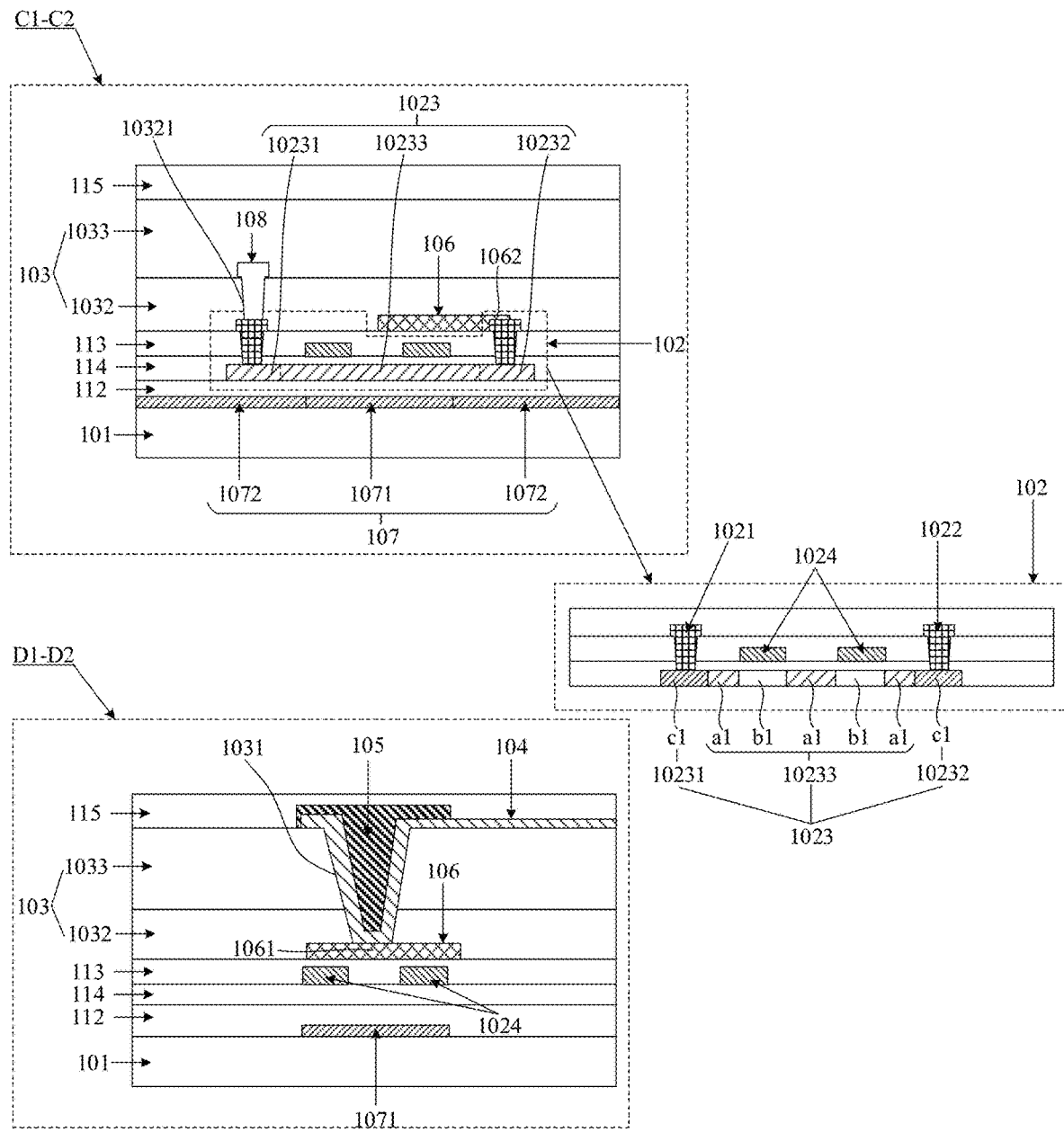
FIG. 6 is a schematic structural diagram of sections of the substrate shown in FIG. 4 along C1-C2 and D1-D2.

Optionally, FIG. 4 is a schematic structural diagram of another substrate according to an embodiment of the present disclosure; FIG. 5 is a schematic diagram of partial film layers of the substrate shown in FIG. 4; and FIG. 6 is a schematic structural diagram of sections of the substrate shown in FIG. 4 along C1-C2 and D1-D2.

FIG. 5 shows eight film layers along the direction distal from the base substrate 101 in the substrate 10. The eight film layers include: a light shielding layer 107, an active layer 1023, a gate line 1024 and a source and a drain (a source 1021 and a drain 1022) of the thin film transistor 102, a connecting line 106, an insulating layer 103 and a via first hole 1031 therein, a filling block 105, and a pixel electrode 104.

The thin film transistor 102 may further include the active layer 1023 and the gate line 1024. The active layer 1023 may be disposed on the side, proximal to the base substrate 101, of the source 1021 and the drain 1022, and the active layer 1023 is electrically connected to the source 1021 and the drain 1022. The gate line 1024 is disposed on the side, distal from the base substrate 101, of the active layer 1023. An orthographic projection of the gate line 1024 on the base substrate 101 is overlapped with an orthographic projection of the active layer 1023 on the base substrate 101.

The gate line 1024 is a gate of the thin film transistor 102. The plurality of sub-pixel structures 100 may include a row of sub-pixel structures 100. Gates of the thin film transistors 102 in one row of sub-pixel structures 100 may be electrically connected to each other to form the gate line 1024.

Figure 7:
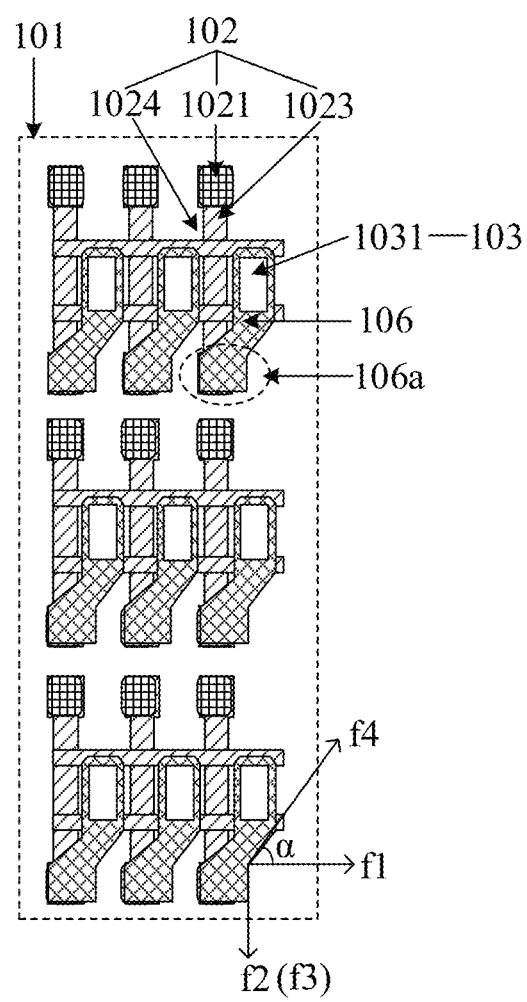
FIG. 7 is a schematic structural diagram of a laminated structure of partial film layers in the substrate shown in FIG. 5.

FIG. 7 is a schematic structural diagram of a laminated structure of partial film layers in the substrate shown in FIG. 5. FIG. 7 shows the schematic diagram of the laminated structure of the active layer 1023, the source 1021 and the drain of the thin film transistor 102 (in the schematic diagram of the laminated structure in FIG. 7, the connecting line 106 shields the drain in the direction perpendicular to the base substrate 101, so the drain is not marked in FIG. 7), the gate line 1024, the connecting line 106, and the first via hole 1031 in the active layer 103. In FIG. 7, the connecting line 106 is electrically connected to the drain at position 106*a*.

Referring to FIG. 7, an orthographic projection of the center of the first via hole 1031 on the base substrate 101 may be between orthographic projections of two active layers 1023 adjacent in the first direction f1 on the base substrate 101. The first direction f1 may be parallel to the extension direction of the gate line 1024. Compared with the related art in which the orthographic projection of the first via hole 1031 on the base substrate 101 may be between orthographic projections of two active layers 1023 adjacent in the third direction f3 (the third direction f3 may be perpendicular to the first direction, and may also be the length direction of the active layer 1023) on the base substrate 101, in the embodiments of the present disclosure, the orthographic projection of the first via hole 1031 on the base substrate 101 is set between the orthographic projections of two active layers 1023 adjacent in the first direction f1 on the base substrate 101, which can reduce the distance between active layers adjacent in the third direction f3. Therefore, the density of the active layers 1023 in the third direction f3 can be increased, thereby increasing the density of the thin film transistors 102 in the third direction f3 and the corresponding PPI of the thin film transistors 102 and increasing the PPI of the display panel including the substrate 10 according to the embodiments of the present disclosure.

Optionally, the substrate 10 may further include a connecting line 106, and the connecting line 106 may be disposed on the side, distal from the base substrate 101, of the gate line 1024. An orthographic projection of one end 1061 of the connecting line 106 on the base substrate 101 may be overlapped with the orthographic projection of the first via hole 1031 on the base substrate 101, and an orthographic projection of the other end 1062 of the connecting line 106 on the base substrate 101 may be overlapped with an orthographic projection of a first electrode on the base substrate 101. The first electrode may be the source electrode 1021 or the drain electrode 1022 that is electrically connected to the pixel electrode 104 in the thin film transistor 102.

The material of the connecting line 106 may include a light-transmitting conductive material, such that the light transmittance of the substrate 10 can be improved, thereby increasing the aperture ratio of the display panel including the substrate 10. For example, the light-transmitting conductive material of the connecting line 106 may include indium tin oxide (ITO).

The material of the pixel electrode 104 may also include a light-transmitting conductive material, and may also be ITO.

As shown in FIG. 7, the extension direction f4 of the connecting line 106 may make an acute angle α with the extension direction f1 of the gate line 1024, such that one end of the connecting line 106 may be electrically connected to the pixel electrode 104, and the other end of the connecting line 106 may be electrically connected to the first electrode of the thin film transistor 102. One end of the connecting line 106 may be electrically connected to the pixel electrode 104 through the first via hole 1031.

It should be noted that since the extension direction of the connecting line 106 intersects the extension directions of positions C1-C2 and D1-D2 in FIG. 6, in the schematic structural diagram of the sections of the substrate at two different positions in the same gazing direction, the connecting line 106, the connecting line 106 shown in the schematic structural diagram of section along C1-C2 and the connecting line 106 shown in the schematic structural diagram of the section along D1-D2 are two parts of the same connecting line 106, and these two parts of the connecting line 106 are electrically connected, such that the pixel electrode 104 is electrically connected to either the source 1021 or the drain 1022 of the thin film transistor 102 through the first via hole 1031 and the connecting line 106.

Optionally, as shown in FIG. 6, the substrate may further include a light shielding pattern 107 which may be disposed on the side, proximal to the base substrate 101, of the active layer 1023. An orthographic projection of the light shielding pattern 107 on the base substrate 101 is overlapped with that the orthographic projection of the active layer 1023 on the base substrate 101. The light shielding pattern 107 may be configured to block light (such as light emitted from a backlight source on the display panel) from entering the active layer 1023, so as to prevent light from affecting the stability of the active layer 1023. The light shielding pattern 107 may be further configured to shield electrical properties of the active layer 1023 from the adverse influence of the film layer on the side of the light shielding pattern 107 distal from the active layer 1023 under the action of an electric field.

The surface of the light shielding pattern 107 facing the base substrate 101 is a reflective surface. When external light (e.g., light emitted from the backlight source on the display panel) irradiates the light shielding pattern 107, the light shielding pattern 107 can not only block the external light from irradiating the active layer 1023, but also reflect the external light to the substrate 10 or other film layers of the display panel. The other film layers can reflect the external light again, and at least part of the external light is reflected to the side of the light shielding pattern 107 distal from the base substrate 101. That is, at least part of the external light can be reflected out of the light-emitting surface of the display panel. Therefore, the backlight utilization rate of the display panel can be increased.

Optionally, a fourth insulating layer 112 may be disposed between the light shielding pattern 107 and the active layer 1023. The fourth insulating layer 112 may include at least one of an inorganic insulating layer and an organic insulating layer. For example, the fourth insulating layer 112 may be a composite film layer including an inorganic insulating layer and an organic insulating layer, and the organic insulating layer may be disposed on the side, distal from the base substrate 101, of the inorganic insulating layer. In this way, the fourth insulating layer 112 can protect the light shielding pattern 107 by means of the inorganic insulating layer so as to prevent the light shielding pattern from being damaged due to the corrosion by external moisture. The fourth insulating layer 112 may also improve the flatness of the active layer 1023 on the side of the fourth insulating layer 112 distal from the base substrate 101 by means of the organic insulating layer, so as to improve the film quality of the active layer 1023.

Figure 8:
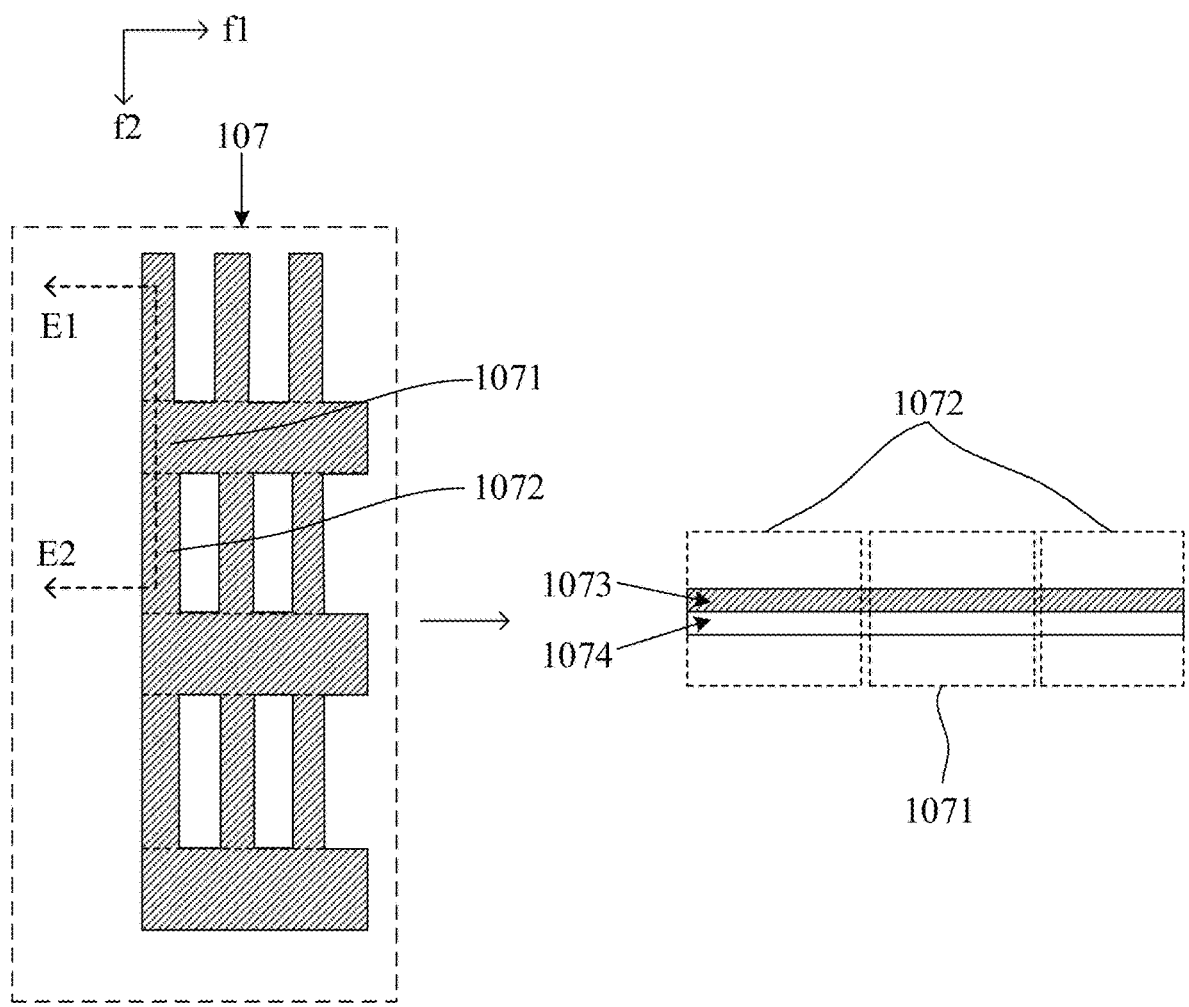
FIG. 8 is a schematic structural diagram of a light shielding pattern according to an embodiment of the present disclosure.

Optionally, FIG. 8 is a schematic structural diagram of a light shielding pattern according to an embodiment of the present disclosure, and shows a top view of the light shielding pattern and a schematic diagram of the section along E1-E2. The light shielding pattern 107 may include a composite film layer. The light shielding pattern 107 may include a first base 1073, and a reflective layer 1074 disposed on the side, facing the base substrate 101, of the first base 1073. The material of the first base 1073 includes at least one of titanium (Ti), tin (Sn) and molybdenum (MO), and the material of the reflective layer 1074 includes aluminum (Al). By providing the first base 1073, the flatness and the film quality of the light shielding pattern 107 are better; and by providing the reflective layer 1074, the reflectivity of the light shielding pattern 107 is higher, such that the durability of the light shielding pattern 107 is improved in the case that the reflectivity of the light shielding pattern 107 is higher.

Or, in an optional implementation, the material of the light shielding pattern 107 may include an aluminum alloy. Since the aluminum alloy material may have a better light reflecting effect while possessing good film quality, the light shielding pattern 107 may be of a single-layer structure to simplify the manufacturing process of the light shielding pattern 107.

For example, as shown in Table 1 below, Table 1 shows the related data of actually tested transmittance and aperture ratio of the light shielding pattern 107 made of different materials.

TABLE 1

| Aperture ratios of light shielding pattern | | | | | |
|---|---|---|---|---|---|
| Size (μm) of light shielding pattern in the first direction | 6.2 | 9.2 | 10.7 | 12.2 | 13.7 |
| Size μm) of light shielding pattern in the second direction | 2.3 | 1.8 | 1.8 | 3.3 | 3.3 |
| Aperture ratio of light shielding pattern | 38.80% | 32.50% | 26.60% | 12.90% | 9.20% |
| Transmittance of light shielding pattern made of molybdenum | 24.20% | 21.50% | 18.10% | 11.00% | 8.50% |
| Transmittance of light shielding pattern made of laminated aluminum/titanium | 26.90% | 24.00% | 20.40% | 12.10% | 9.70% |
| Transmittance of light shielding pattern made of laminated aluminum/molybdenum | 27.60% | 24.80% | 21.10% | 12.70% | 9.90% |
| Percentage of increase of aperture ratio of laminated aluminum/titanium compared with molybdenum | 10.80% | 11.40% | 12.50% | 10.50% | 14.40% |
| Percentage of increase of aperture ratio of laminated aluminum/molybdenum compared with molybdenum | 13.90% | 15.50% | 16.50% | 15.50% | 16.60% |

As can be seen from Table 1, by providing the light shielding pattern as a laminated structure including the reflective layer, the aperture ratio of the light shielding pattern is better, such that the aperture ratio of the display panel can be increased.

Optionally, as shown in FIG. 5 and FIG. 6, the active layer 1023 may include a source contact portion 10231, a drain contact portion 10232, and an intermediate portion 10233 disposed between the source contact portion 10231 and the drain contact portion 10232. The size of the source contact portion 10231 in the first direction f1 and the size of the drain contact portion 10232 in the first direction f1 are greater than the size of the intermediate portion 10233 in the first direction f1, and an orthographic projection of the active layer 1023 on the base substrate 101 may be in a shape with two wide ends and a narrow middle, such that the source contact portion 10231 of the active layer 1023 and the source 1021 of the thin film transistor 102 can be electrically connected better, and the drain contact portion 10232 of the active layer 1023 and the drain 1022 of the thin film transistor 102 can be electrically connected better.

The orthographic projection of the active layer 1023 on the base substrate 101 is at least partially overlapped with the orthographic projection of the light shielding pattern 107 on the base substrate 101. Furthermore, the orthographic projection of the active layer 1023 on the base substrate 101 is within the orthographic projection of the light shielding pattern 107 on the base substrate 101, such that the stability of the active layer 1023 is further prevented from being affected by external light, and the light shielding pattern 107 can further shield electrical properties of the active layer 1023 from the adverse influence of the film layer on the side of the light shielding pattern 107 distal from the active layer 1023 under the action of an electric field.

Optionally, as shown in FIG. 8, the light shielding pattern 107 may include a plurality of light shielding portions 1071 and a plurality of connecting portions 1072, and the light shielding portion 1071 may be connected to the connecting portion 1072. Two adjacent light shielding portions 1071 may be disposed on two sides of the connecting portion 1072, respectively. One ends of the two light shielding portions 1071 are connected to two sides of the connecting portion 1072, respectively. The light shielding portion 1071 and the connecting portion 1072 may be disposed on the same layer and may be manufacturing by a single patterning process.

The light shielding portion 1071 may be extended along the first direction f1, and the plurality of light shielding portions 1071 may be arranged along the second direction f2. The connecting portions 1072 are disposed on two sides of the light shielding portion 1071 in the second direction f2. The connecting portion 1072 is extended along the second direction f2, and the plurality of connecting portions 1072 are arranged along the first direction f1. The second direction f2 intersects the first direction f1. Since film layers with low light transmittance, such as the active layer 1023, the source 1201, the drain 1022 and the gate line 1024, are disposed on the side, distal from the base substrate 101, of the light shielding portion 1071 and the connecting portion 1072, and are overlapped with the light shielding pattern 107, by providing the light shielding portions 1072 and the connecting portions 1071 connecting the light shielding portions 1072 in the light shielding pattern 107, the reflective area of the light shielding pattern 107 can be increased on the premise that the light shielding pattern 107 does not adversely affect the aperture ratio of the display panel. Therefore, the backlight utilization ratio of the display panel can be increased, thereby increasing the aperture ratio of the display panel.

Figure 9:
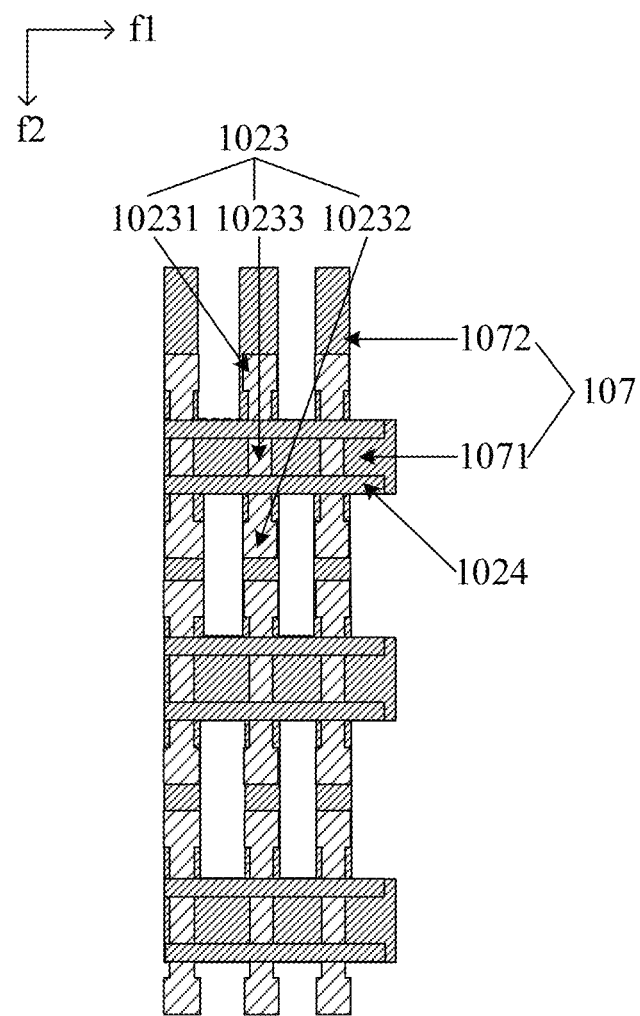
FIG. 9 is a schematic structural diagram of laminated gate line, active layer and light shielding pattern according to an embodiment of the present disclosure.

Optionally, FIG. 9 is a schematic structural diagram of laminated gate line, active layer and light shielding pattern according to an embodiment of the present disclosure. Referring to FIG. 6 and FIG. 9, edges, in the first direction f1, of an orthographic projection of the connecting portion 1072 of the light shielding pattern 107 on the base substrate 101 are flush with edges, in the first direction f1, of orthographic projections of the source contact portion 10231 and the drain contact portion 10232 of the active layer 1023 on the base substrate 101. The light transmittance of the source contact portion 10231 and the drain contact portion 10232 of the active layer 1023 is relatively low. The connecting portion 1072 of the light shielding pattern 107 is overlapped with the source contact portion 10231 and the drain contact portion 10232 of the active layer 1023 in the direction perpendicular to the base substrate 101 and edges of the connecting portion 1072 in the first direction f1 are flush with edges of the source contact portion 10231 and the drain contact portion 10232 in the first direction f1, which can prevent the connecting portion 1072 of the light shielding pattern 107 from adversely affecting the aperture ratio of the display panel.

Optionally, as shown in FIG. 6 and FIG. 9, an edge, in the second direction f2, of an orthographic projection of the light shielding portion 1071 of the light shielding pattern 107 on the base substrate 101 is flush with an edge, in the second direction f2, of an orthographic projection of the gate line 1024 on the base substrate 101. The light transmittance of the gate line 1024 is relatively low. The light shielding portion 1071 of the light shielding pattern 107 is overlapped with the gate line 1024 in the direction perpendicular to the base substrate 101 and the edge of the light shielding portion 1071 in the first direction f1 is flush with the edge of the gate line 1024 in the first direction f1, which can prevent the light shielding portion 1071 of the light shielding pattern 107 from adversely affecting the aperture ratio of the display panel.

Figure 10:
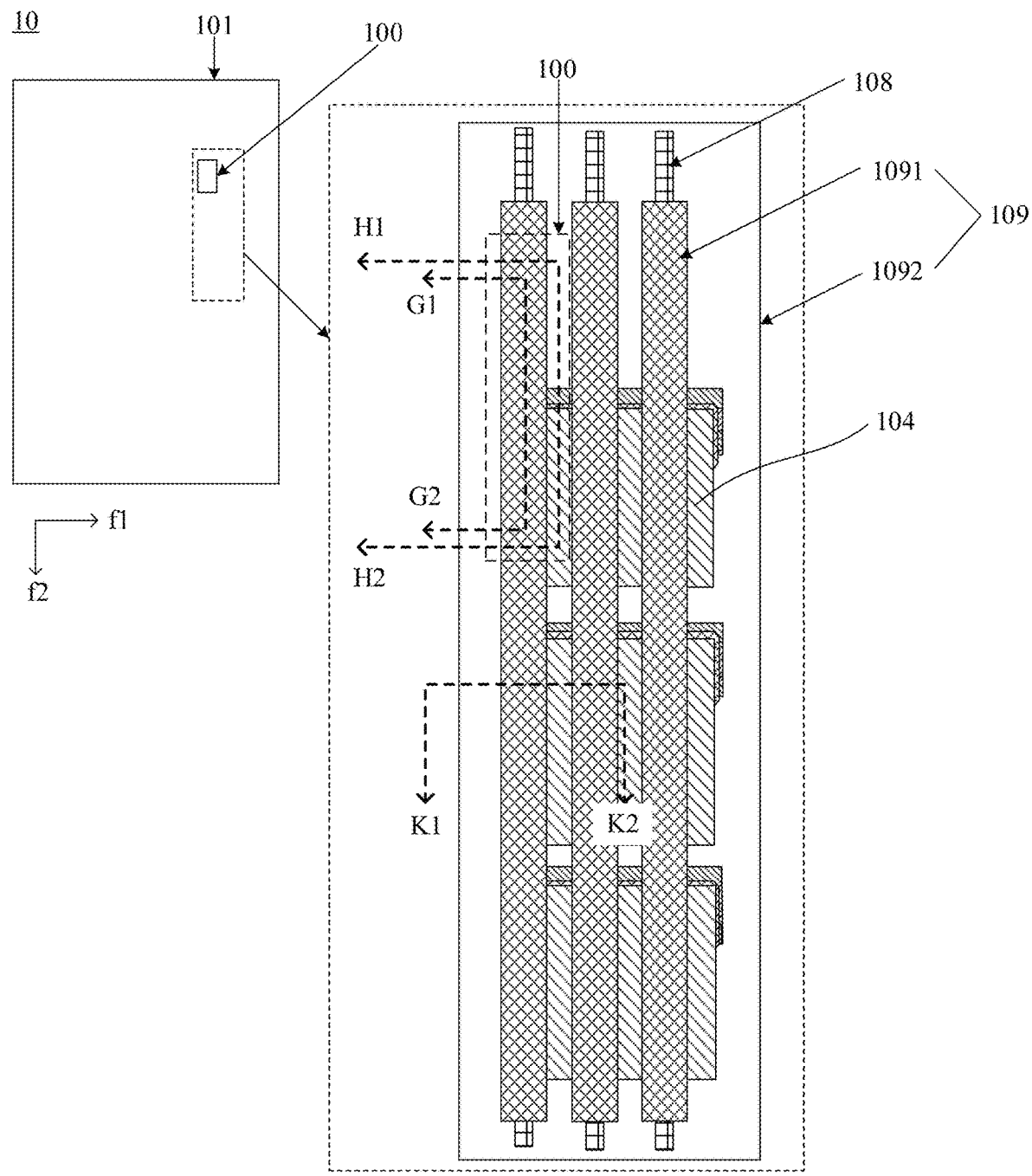
FIG. 10 is a schematic structural diagram of still another substrate according to an embodiment of the present disclosure.
Figure 11:
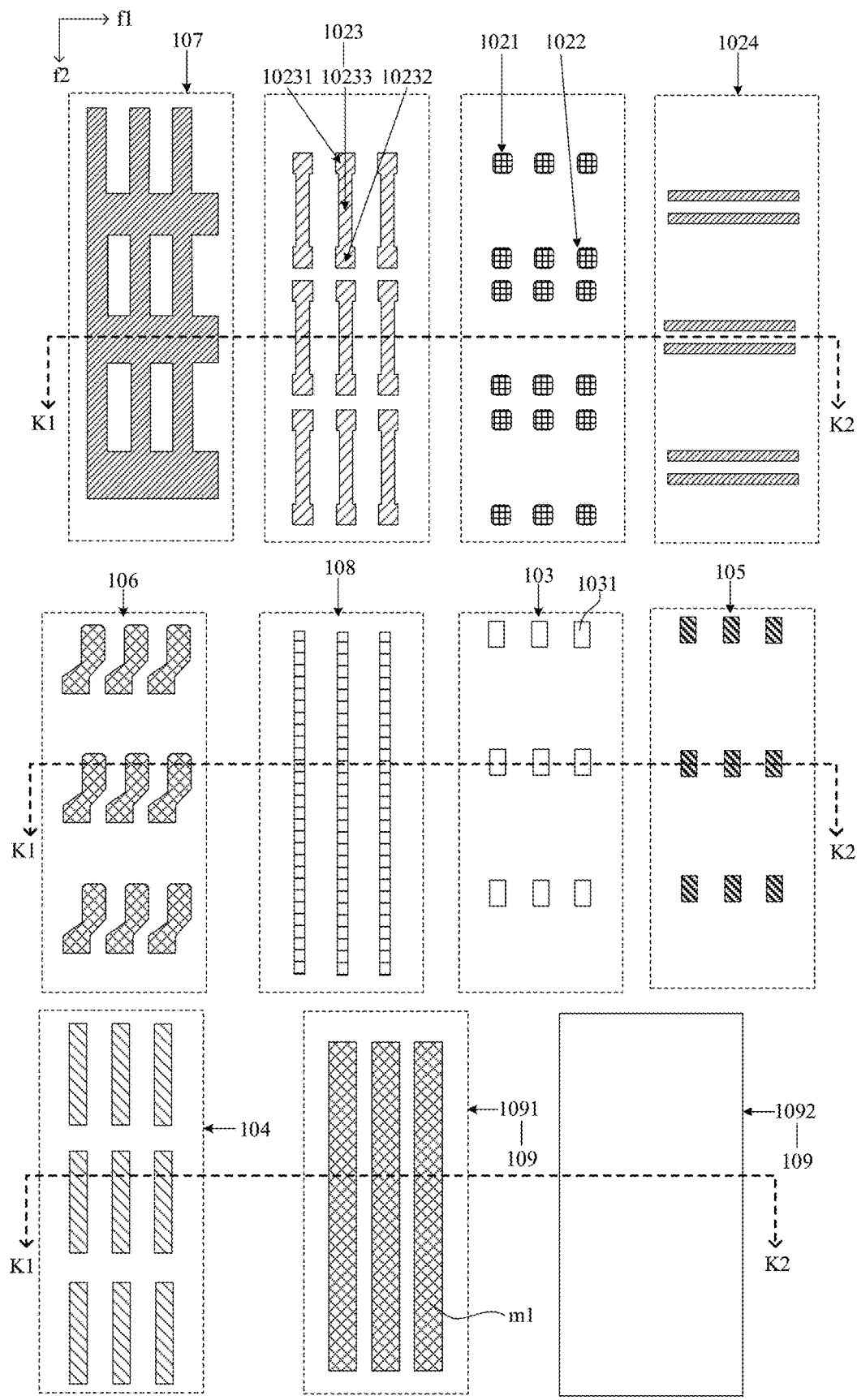
FIG. 11 is a schematic diagram of partial film layers of the substrate shown in FIG. 10.
Figure 12:
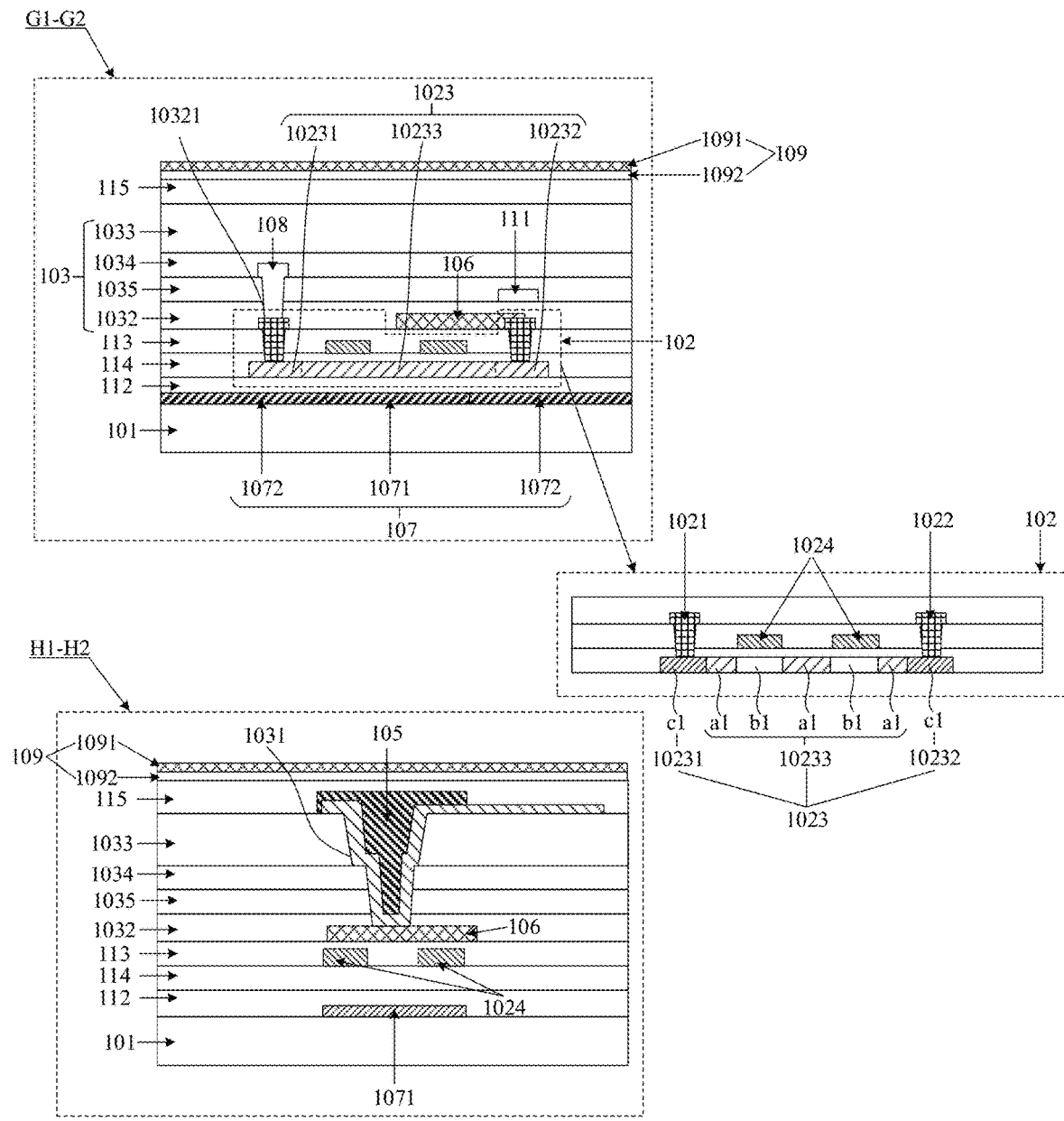
FIG. 12 is a schematic structural diagram of sections of the substrate shown in FIG. 10 along G1-G2 and H1-H2.
Figure 13:
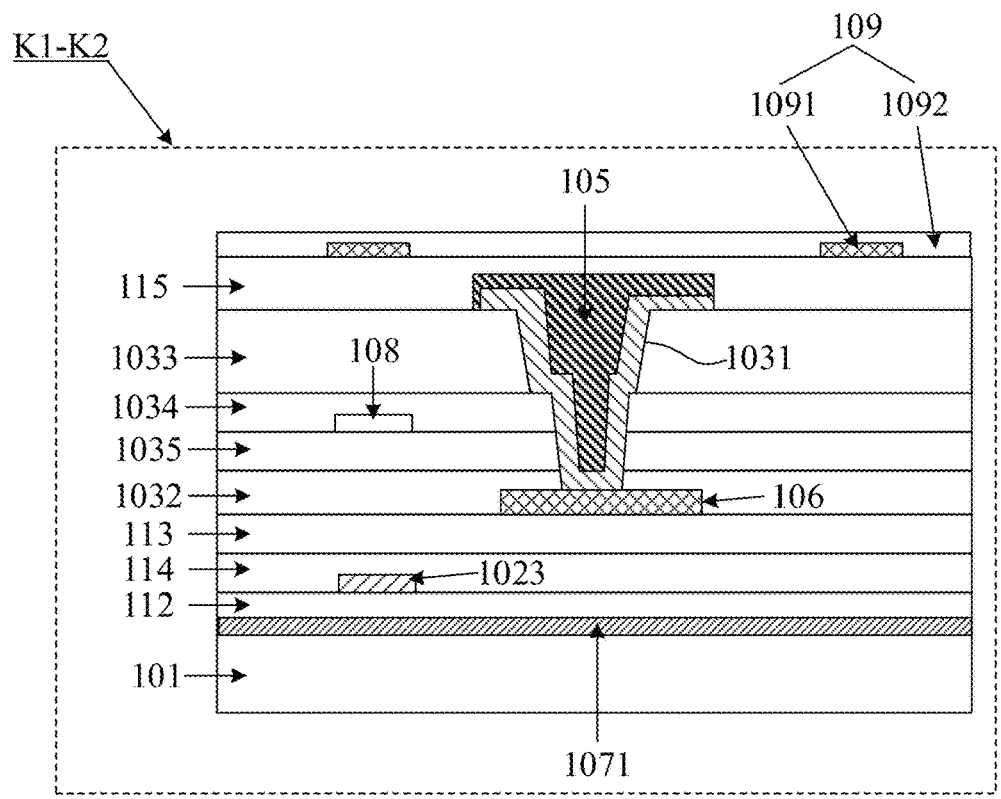
FIG. 13 is a schematic structural diagram of a section of the substrate shown in FIG. 10 along K1-K2.

FIG. 10 is a schematic structural diagram of another substrate according to an embodiment of the present disclosure; FIG. 11 is a schematic diagram of partial film layers of the substrate shown in FIG. 10; FIG. 12 is a schematic structural diagram of sections of the substrate shown in FIG. 10 along G1-G2 and H1-H2; and FIG. 13 is a schematic structural diagram of a section of the substrate shown in FIG. 10 along K1-K2. Since many film layers are laminated in FIG. 10, the position of K1-K2 is marked in the schematic structural diagram of the film layers shown in FIG. 11. Referring to FIG. 10 to FIG. 12, the substrate 10 may further include a data line 108. The data line may be disposed on the side, distal from the base substrate 101, of the source 1021 and the drain 1022 of the thin film transistor 102.

The insulating layer 103 may include a first insulating layer 1032 and a planarization layer 1033 which are sequentially laminated in the direction distal from the base substrate 101. The first insulating layer 1032 may be disposed on the side, distal from the base substrate 101, of the source 1021 and the drain 1022 of the thin film transistor 102, and the planarization layer 1033 is disposed on the side of the data line 108 distal from the base substrate 101. The data line 108 may be disposed between the first insulating layer 1032 and the planarization layer 1033.

A second via hole 10321 may be formed in the first insulating layer 1032, and the data line 108 may be electrically connected to either the source 1021 or the drain 1022 through the second via hole 10321.

Optionally, the insulating layer 103 may further include a second insulating layer 1034 disposed between the first insulating layer 1032 and the planarization layer 1033, and the second insulating layer 1034 may be disposed on the side of the data line 108 distal from the base substrate 101. The second insulating layer 1034 may be configured to protect the data line 108, so as to avoid a short circuit between the data line 108 and the pixel electrode 104.

Optionally, as shown in FIG. 11, the extension direction of the data line 108 may be parallel to the second direction f2, and the orthographic projection of the connecting portion 1072 of the light shielding pattern 107 on the base substrate 101 is within an orthographic projection of the data line 108 on the base substrate 101. The extension direction of the connecting portion 1072 of the light shielding pattern 107 may be the same as the extension direction of the data line 108. Since the light transmittance of the data line 108 is relatively low, the data line 108 covers the connecting portion 1072 of the light shielding pattern 107 in the direction perpendicular to the base substrate 101, such that the connecting portion 1072 of the light shielding pattern 107 is prevented from adversely affecting the light transmittance of the substrate 10, thereby preventing the connecting portion 1072 of the light shielding pattern 107 from adversely affecting the aperture ratio of the display panel.

Figure 14:
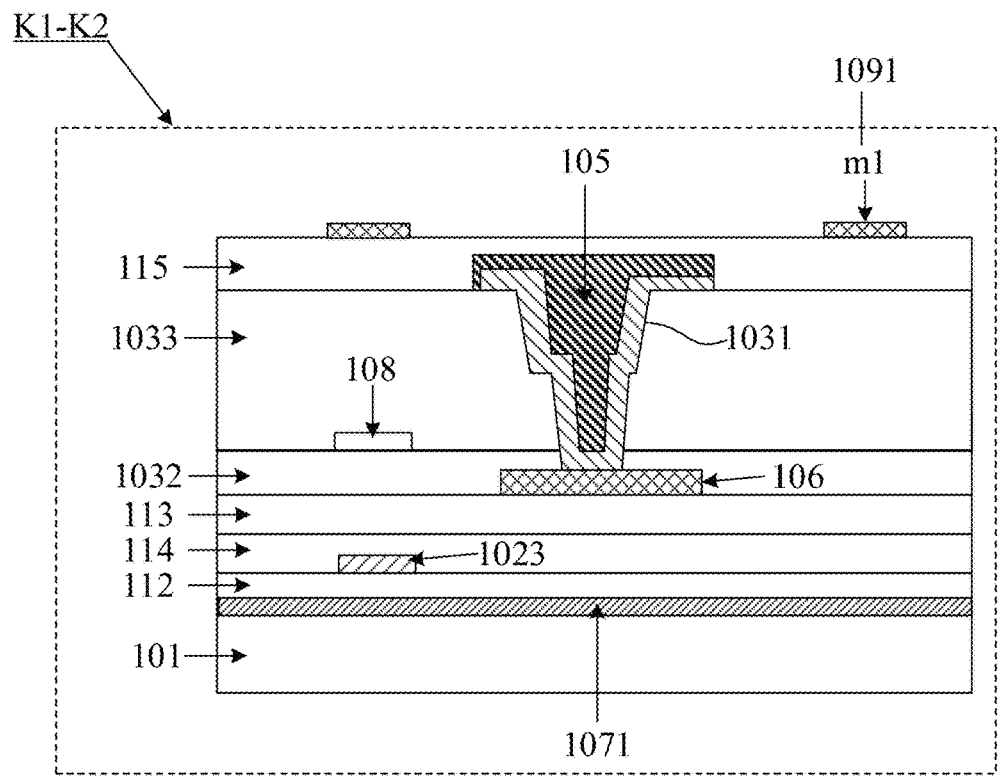
FIG. 14 is a schematic structural diagram of still another substrate according to an embodiment of the present disclosure.

Optionally, FIG. 14 is a schematic structural diagram of still another substrate according to an embodiment of the present disclosure. Referring to FIG. 13 and FIG. 14, the base substrate 101 may further include a common electrode pattern 109, which may be disposed on the side of the pixel electrode 104 distal from the base substrate 101. The pixel electrode 104 may drive liquid crystals in the liquid crystal layer of the display panel together with the common electrode pattern 109. The number of film layers in the substrate 10 shown in FIG. 14 is less than the number of film layers in the substrate 10 shown in FIG. 13, such that the processes for manufacturing the substrate 10 can be simplified.

The common electrode pattern 109 may include a first electrode portion 1091. The material of the first electrode portion 1091 may include metal. The first electrode portion 1091 includes a plurality of first strip-shaped electrodes m1. The orthographic projection of the connecting portion of the light shielding pattern 107 on the base substrate 101 may be within the orthographic projection of the first electrode portion 1091 on the base substrate 101. Since the sub-pixel structures in the display panel with high PPI have a relatively small size and the distance between adjacent sub-pixel structures is relatively short, light emitted from the sub-pixels is prone to cross color, which adversely affects the display effect of the display panel. The first electrode portion 1091 can prevent light emitted from a region where a sub-pixel structure 100 of one color is disposed from being exited from a region where an adjacent sub-pixel structure 100 of a different color is disposed, such that the cross-color problem of the display panel can be solved.

In addition, the connecting portion 1072 of the light shielding pattern 107 is overlapped with the first electrode portion 1091 in the direction perpendicular to the base substrate 101. Furthermore, the orthogonal projection of the connecting portion 1072 on the base substrate 101 may be within the orthogonal projection of the first electrode portion 1091 on the base substrate 101. By setting the connecting portion 1072 and the first electrode portion 1091 with relatively low light transmittance to be overlapped in the direction perpendicular to the base substrate 101, the light-tight area of the substrate 10 can be reduced, thereby increasing the aperture ratio of the display panel.

Optionally, as shown in FIG. 13, the orthographic projections of the data line 108 and the active layer 1023 on the base substrate 101 may be within the orthographic projection of the first electrode portion 1091 on the base substrate 101. Since the extension direction of the data line 108, the length direction of the active layer 1023 and the extension direction of the first electrode portion 1091 may be parallel to the second direction f2, and the light transmittance of the data line 108, the light transmittance of the active layer 1023 and the light transmittance of the first electrode portion 1091 is relatively low, the data line 108, the active layer 1023 and the first electrode portion 1091 with the relatively low light transmittance are overlapped in the direction perpendicular to the base substrate 101 in the embodiments of the present disclosure, such that the light-tight area of the substrate 10 is further reduced, thereby increasing the aperture ratio of the display panel.

Figure 15:
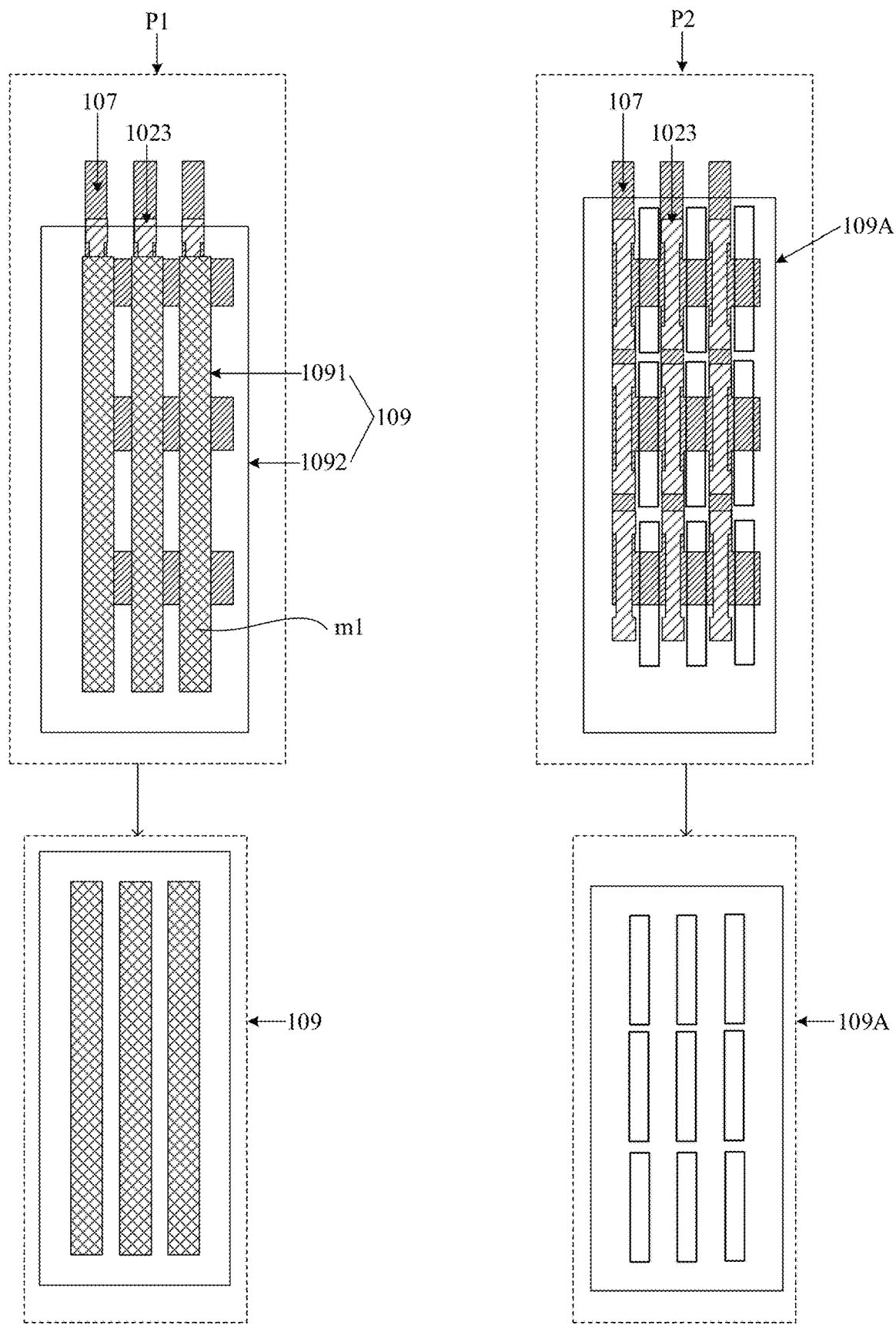
FIG. 15 is a schematic structural diagram of laminated light shielding pattern, active layer and common electrode pattern according to an embodiment of the present disclosure.

Optionally, FIG. 15 is a schematic structural diagram of laminated light shielding pattern, active layer and common electrode pattern according to an embodiment of the present disclosure. FIG. 15 shows the schematic structural diagram P1 of a laminated structure including the common electrode pattern 109 in the embodiments of the present disclosure, and the schematic structural diagram P2 of a laminated structure including a common electrode pattern 109A in the related art. The film structures indicated by the arrows in FIG. 15 are the structures of the film layer of the common electrode pattern 109 in the embodiments of the present disclosure and the structures of the film layer of the common electrode pattern 109A in the related art, respectively.

The common electrode pattern 109 may further include a transparent electrode layer 1092, and the first electrode portion 1091 may be disposed on the side of the transparent electrode layer 1092 proximal to the base substrate 101. The transparent electrode layer 1092 may be of a whole layer structure. In the common electrode pattern 109, the transparent electrode layer 1092 of the whole layer structure and the plurality of first strip-shaped electrodes m1 of the first electrode portion 1091 are be laminated, such that the common electrode pattern 109 is a slit electrode. By arranging slits in different directions and changing the pattern of the slit electrode, the liquid crystals in the display panel may be arranged in multiple directions in the horizontal direction of the pixel region, which can improve the uniformity of the luminance of an image displayed on the display panel, and reduce the color shift of the display panel. That is, the electric field generated by the slit electrodes on the same plane and the electric field generated by the transparent electrode layer 1092 of the whole layer structure may generate a multi-dimensional electric field, such that the liquid crystals between the slit electrodes and directly above the slit electrodes can rotate, thereby improving the working efficiency of the liquid crystals in the display panel, and increasing the light transmittance of the liquid crystals in the display panel.

Compared with the related art in which a plurality of openings are formed in the common electrode pattern 109A to form slit electrodes, the common electrode pattern 109 according to the embodiments of the present invention can not only form the slit electrodes, but also prevent light emitted from a region where a sub-pixel structure 100 of one color is disposed from being exited from a region where an adjacent sub-pixel structure 100 of a different color is disposed, such that the cross-color problem of the display panel can be solved, thereby improving the display effect of the display panel.

Figure 16:
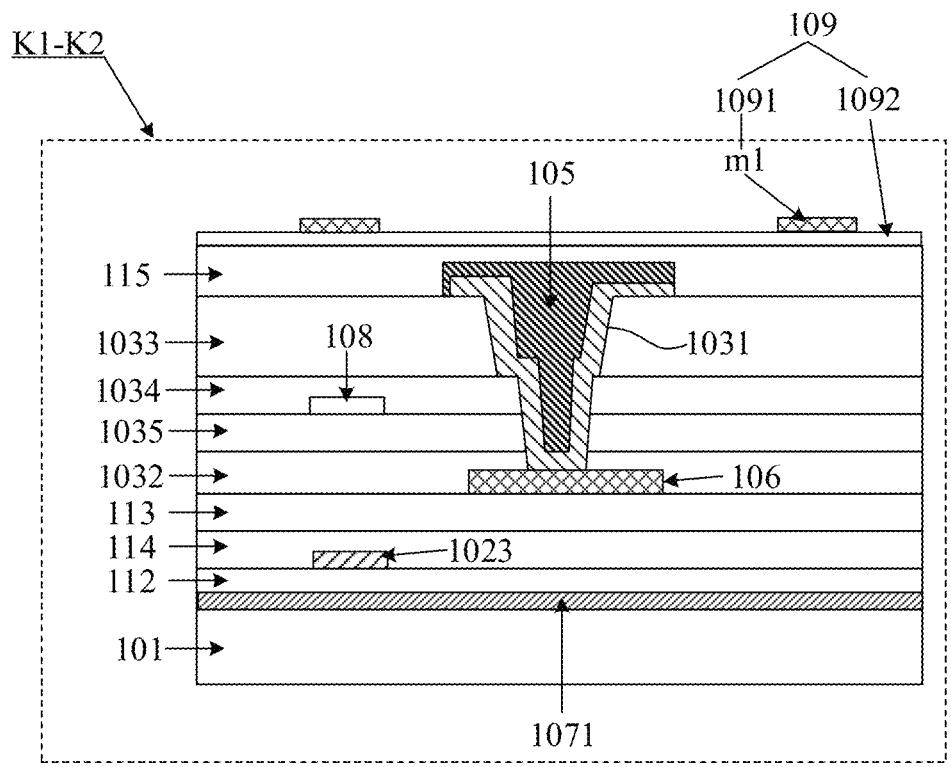
FIG. 16 is a schematic structural diagram of still another substrate according to an embodiment of the present disclosure.

Optionally, FIG. 16 is a schematic structural diagram of still another substrate according to an embodiment of the present disclosure. The common electrode pattern 109 may further include a transparent electrode layer 1092, and the first electrode portion 1091 is disposed on the side of the transparent electrode layer 1092 distal from the base substrate 101. In this way, the transparent electrode layer 1092 of the whole layer structure and the plurality of first strip-shaped electrodes m1 of the first electrode portion 1091 may be laminated, such that the common electrode pattern 109 can be a slit electrode, and meanwhile, the transparent electrode layer 1092 can protect the first electrode portion 1091 to prevent the first electrode portion 1091 from being damaged due to the corrosion by external moisture. The material of the transparent electrode layer 1092 may include indium tin oxide.

Figure 17:
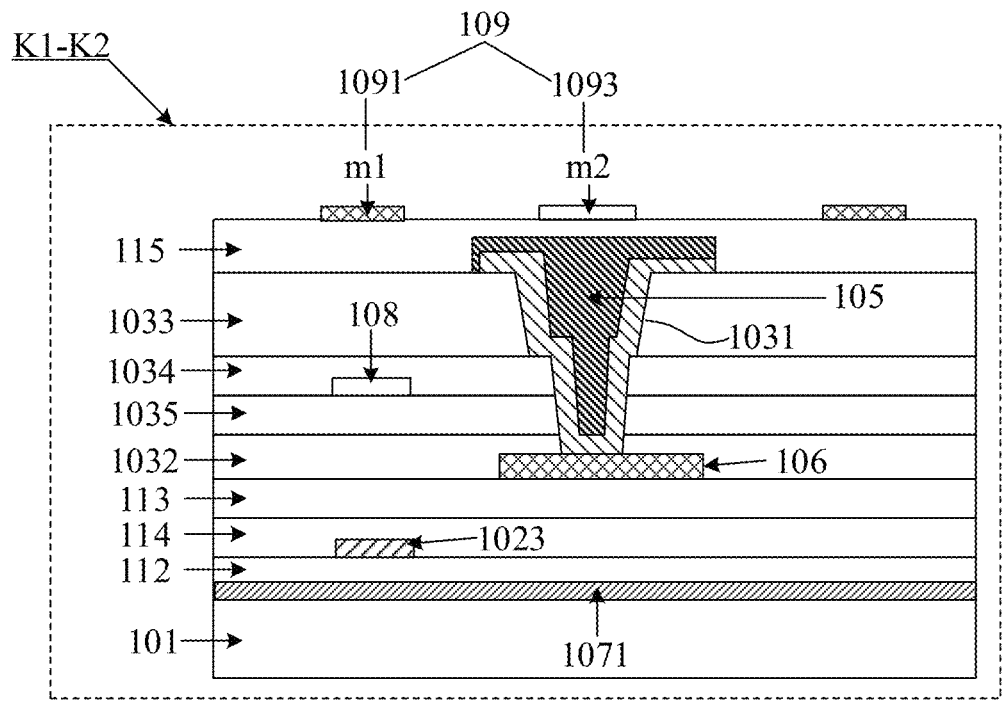
FIG. 17 is a schematic structural diagram of still another substrate according to an embodiment of the present disclosure.

Optionally, FIG. 17 is a schematic structural diagram of still another substrate according to an embodiment of the present disclosure. The common electrode pattern 109 may further include a second electrode portion 1093. The material of the second electrode portion 1093 may include a transparent conductive material; and the second electrode portion 1093 may include a plurality of second strip-shaped electrodes m2, and the first strip-shaped electrodes m1 and the second strip-shaped electrodes m2 are alternately arranged. By arranging the second strip-shaped electrodes m2 and the first strip-shaped electrodes m1 alternately, the common electrode pattern 109 may be a slit electrode. In addition, the second strip-shaped electrodes m2 and the first strip-shaped electrodes m1 may be disposed on the same layer, such that the size of the substrate 10 in the direction perpendicular to the base substrate 101 can be reduced, thereby reducing the thickness of the display panel including the substrate 10. The material of the second electrode portion 1093 may include indium tin oxide.

Optionally, as shown in FIG. 12, the substrate 10 may further include a compensation electrode 111, and the insulating layer 103 may include a first insulating layer 1032, a third insulating layer 1035, a second insulating layer 1034 and a planarization layer 1033 which are sequentially laminated in the direction distal from the base substrate 101. The first insulating layer 1032 may be disposed on the side, distal from the base substrate 101, of the source 1021 and the drain 1022. The compensation electrode 111 may be disposed between the first insulating layer 1032 and the third insulating layer 1035, the data line 108 may be disposed between the third insulating layer 1035 and the second insulating layer 1034, and the common electrode pattern 109 may be disposed on the side of the planarization layer 1033 distal from the base substrate 101.

The compensation electrode 111 is electrically connected to the common electrode pattern 109, and an orthogonal projection of the compensation electrode 111 on the base substrate 101 is overlapped with the orthogonal projection of the data line 108 on the base substrate 101. Since an input signal of the compensation electrode 111 is a stable common electrode signal (Vcom), i.e., the charge distribution on the compensation electrode 111 is relatively stable, but the voltage on the data line 108 changes, such that shielding capacitance is generated between the compensation electrode 111 and the data line 108. Under the electrostatic shielding effect, the charge distribution on the data line 108 can be driven such that charges on the data line 108 is redistributed and stabilized, thereby effectively shielding coupling capacitance and reducing an adverse risk that the data line 108 interferes with other signal lines or film layers (e.g., the pixel electrode 104).

Optionally, as shown in FIG. 3, at least one of the plurality of sub-pixel structures 100 includes a first filling block 105 protruding from the first via hole 1031. The part, protruding from the first via hole 1031, of the first filling block 105 may be in contact with a support column in the liquid crystal layer, to prevent the support column in the liquid crystal layer from being displaced. The liquid crystal layer of the display panel may include an upper substrate, a lower substrate and liquid crystals disposed between the upper substrate and the lower substrate. Since the support column may be arranged between the upper substrate and the lower substrate and the support column may play an isolation role, the gap between the upper substrate and the lower substrate can be kept uniformly. The first filling block 105 may serve as a barrier structure of the support column, to prevent the liquid crystal layer of the display panel from being damaged due to the displacement of the support column.

Optionally, as shown in FIG. 3, the distance L between the surface s1 of the side of the first filling block 105 distal from the base substrate 101 and the surface s2 of the side of the insulating layer 103 distal from the base substrate 101 in the thickness direction f0 of the substrate (the thickness direction of the substrate may be a direction perpendicular to the base substrate 101) is greater than 0 μm and less than 1 μm. In this way, the flatness of the film layer on the side of the insulating layer 103 distal from the base substrate 101 is better. In addition, the part, above the insulating layer 103, of the first filling block 105 can block the support column, thereby preventing the display effect from being adversely affected due to damage of the structure of the substrate caused by random sliding of the support column.

Figure 18:
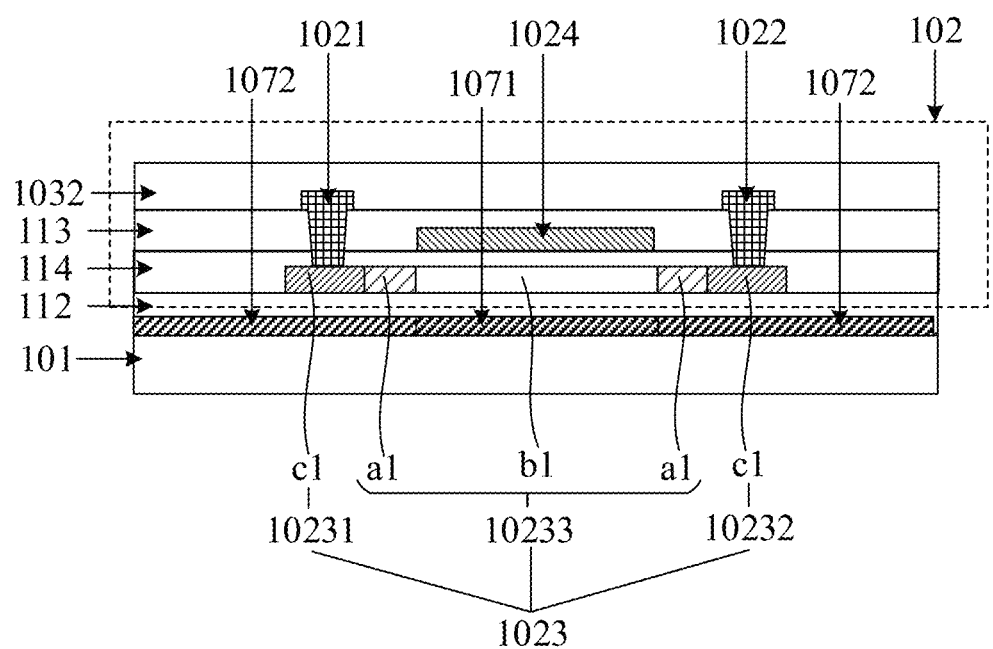
FIG. 18 is a schematic structural diagram of a thin film transistor according to an embodiment of the present disclosure.

Optionally, FIG. 18 is a schematic structural diagram of a thin film transistor according to an embodiment of the present disclosure. The intermediate portion 10233 of the active layer 1023 of the thin film transistor 102 includes two lightly drain doping (LDD) regions a1 and a channel region b1, and the LDD regions a1 may be disposed on two sides of the channel region b1. The channel region b1 may be an undoped region. The source contact portion 10231 and the drain contact portion 10232 may be heavily drain doping (HDD) regions c1, the source 1021 and the drain 1022 are electrically connected to the HDD regions c1 of the active layer 1023, such that the contact resistance can be reduced. Therefore, the source 1021 and the drain 1022 may be in good electrical connection to the active layer 1023, and thus the thin film transistor has better electrical characteristics.

Here, the ion implantation concentration in the LDD region may range from $1\times10^{13}$ ions/cm$^2$ to $9\times10^{13}$ ions/cm$^2$, and the ion implantation concentration in the HDD region may range from $1\times10^{14}$ ions/cm$^2$ to $9\times10^{14}$ ions/cm$^2$. Phosphorus ions may be used as doped ions during ion implantation.

Meanwhile, as the semiconductor region of the thin film transistor 102 becomes shorter and shorter, it's likely to cause a short-channel effect, which results in abnormal characteristics of the thin film transistor 102, such as higher cut-off voltage Vth and higher leakage current Ioff. Addition of the LDD region a1 between the HDD region c1 and the undoped region (channel region b1) is equivalent to connection of a resistor in series between the source 1021 and the drain 1022 and the channel region b1. Therefore, the horizontal electric field of the channel is reduced and the leakage current is inhibited, thereby avoiding the above abnormalities of the thin film transistor 102.

An orthographic projection of the channel region b1 on the base substrate 101 may be within the orthographic projection of the light shielding portion 1071 on the base substrate 101, and orthographic projections of the source contact portion 10231, the drain contact portion 10232 and the two LDD regions a1 on the base substrate 101 are within the orthographic projection of the connecting portion 1072 on the base substrate 101.

The thin film transistor 102 may include a single-gate thin film transistor. By arranging two LDD regions a1 with high resistance at preset positions on two sides of the channel region b1 of the thin film transistor 102, the acceleration distance of electrons in the active layer 1023 under the action of an electric field can be shortened, and thus the leakage current of the thin film transistor can be inhibited. In the embodiments of the present disclosure, the length of the LDD region a1 may be controlled the electric field strength of the channel region b1 of the substrate 10, or based on the characteristic requirements, such as an on-state current or off-state current of the thin film transistor (such as a low-temperature polysilicon thin film transistor), such that the aperture ratio of the display panel can be increased on the premise of meeting the characteristic requirements of the channel region b1 of the thin film transistor 102.

Optionally, as shown in FIG. 12, the intermediate portion 10233 includes three LDD regions a1 and two channel regions b1 which are alternately arranged. Orthographic projections of the two channel regions b1 and an orthographic projection of the LDD region a1 between the two channel regions b1 on the base substrate 101 are within the orthographic projection of the light shielding portion 1071 on the base substrate 101, and an orthographic projection of the source contact portion 10231 on the base substrate 101, an orthographic projection of the drain contact portion 10232 on the base substrate 101 and orthographic projections of the LDD regions a1 on two sides of the two channel regions b1 are within the orthographic projection of the connecting portion 1072 on the base substrate 101. The thin film transistor 102 may include a dual-gate thin film transistor. By arranging the plurality of LDD regions a1 with high resistance at present positions between and on the two sides of the channel regions b1 of the thin film transistor 102, the acceleration distance of electrons in the active layer 1023 under the action of the electric field can be shortened, such that the leakage current of the thin film transistor can be inhibited.

One of the LDD regions a1 may be disposed in the middle of the active layer 1023 in the direction parallel to the plate surface of the base substrate 101. In this way, when electrons are transmitted in the two undoped regions (channel regions b1) whose orthographic projections on the base substrate 101 overlap the orthographic projection of the gate line 1024 on the base substrate 101, the electrons inevitably pass through the LDD region a1 between the two undoped regions (channel regions b1), which can reduce the transmission speed and kinetic energy of the electrons, thereby inhibiting the leakage current.

In the embodiments of the present disclosure, the length of the LDD region a1 can be controlled based on the characteristic requirements, such as the on-state current or off-state current, of the thin film transistor (e.g., a low-temperature polysilicon thin film transistor) of the substrate 10, so as to increase the aperture ratio of the display panel on the premise of meeting the characteristic requirements of the channel regions of the thin film transistor 102. Since the orthographic projections of the two channel regions b1 on the base substrate 101 and the orthographic projection of the LDD region a1 between the two channel regions b1 on the base substrate 101 are within the orthographic projection of the light shielding portion 1071 on the base substrate 101, when the sizes of the two channel regions b1 and the size of the LDD region a1 between the two channel regions b1 are relatively small, the size of the light shielding portion 1071 can be correspondingly reduced, and thus the aperture ratio of the display panel can be reduced. For example, the channel region b1 of the thin film transistor 102 may have a width less than 1.5 μm and a length less than 2 μm.

Figure 19:
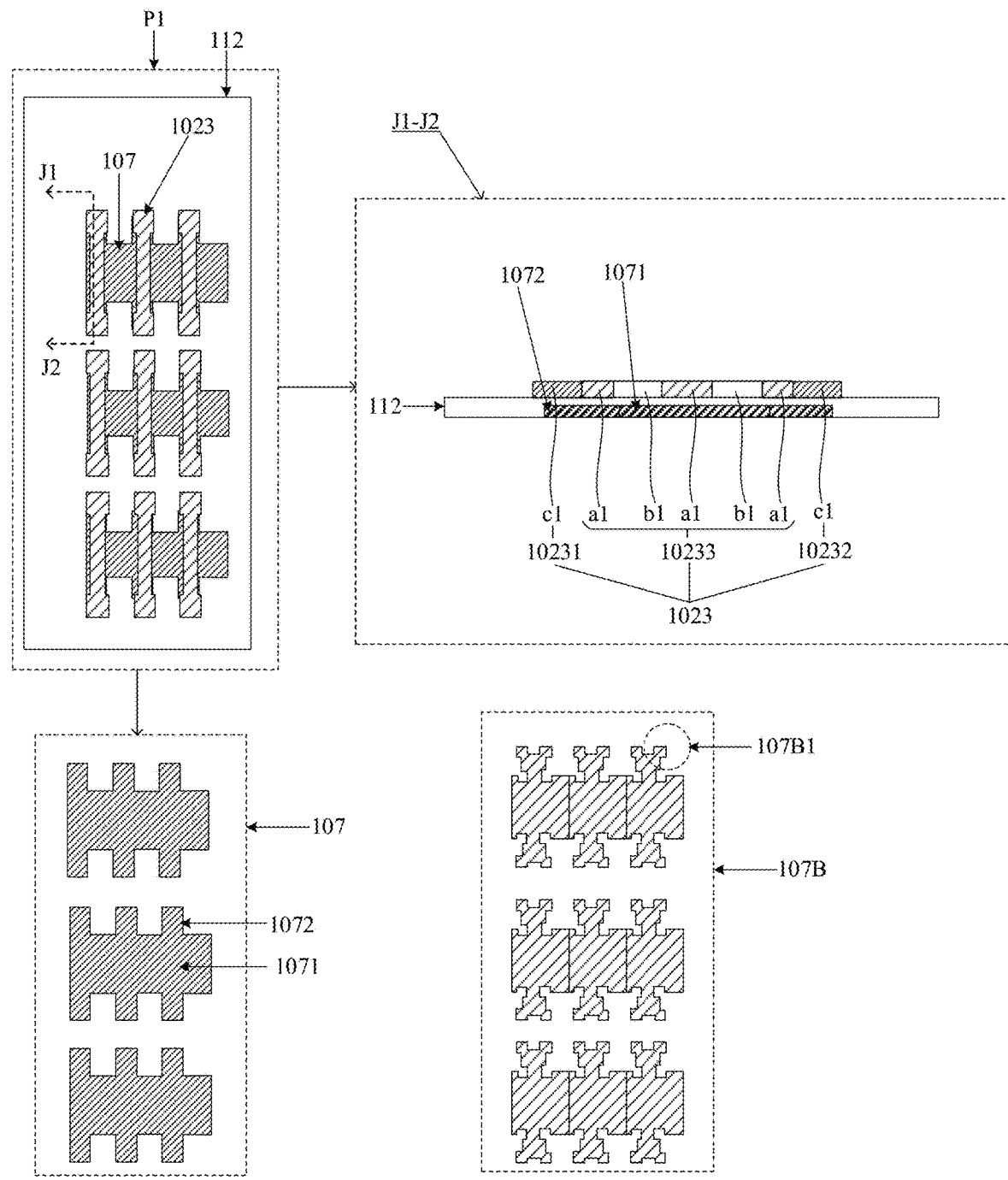
FIG. 19 is a schematic structural diagram of still another substrate according to an embodiment of the present disclosure.

Optionally, FIG. 19 is a schematic structural diagram of still another substrate according to an embodiment of the present disclosure. FIG. 19 shows a schematic diagram of a laminated structure of the thin film transistor 102 and the light shielding pattern 107 and a schematic structural diagram of a section of the laminated structure along the position J1-J2. FIG. 19 further shows the shape of a light shielding pattern mask 107B used for manufacturing the light shielding pattern 107 of this shape. When the mask is used, it may be by using an opaque pattern template to cover a selected region of a specified film. The selected region may be free of irradiation by exposure light, such that etching or diffusion in subsequent steps may only be performed in regions other than the selected region. The size of the light shielding pattern mask 107B may be larger than the size of the light shielding pattern 107, and a convex region 107B1 may be formed at the edge of the light shielding pattern mask 107B, such that the acquired light shielding pattern may have the shape of the light shielding pattern 107 shown in FIG. 19.

The intermediate portion 10233 may include three LDD regions a1 and two channel regions b1, and the LDD regions a1 and the channel regions b1 are alternately arranged.

Orthographic projections of the two channel regions b1 on the base substrate 101 and an orthographic projection of the LDD region a1 between the two channel regions b1 on the base substrate 101 are within the orthographic projection of the light shielding portion 1071 on the base substrate 101, and the orthographic projection of the connecting portion 1072 on the base substrate 101 is within orthographic projections of the source contact portion 10231, the drain contact portion 10232 and the LDD regions a1 on two sides of the two channel regions b1 on the base substrate 101. The connecting portion 1072 may only be connected to the light shielding portion 1071 disposed at one end of the connecting portion 1072, to reduce the size of the connecting portion 1072. Therefore, on the premise that the active layer 1023 has a smaller size, the size of the connecting portion 1072 can be further reduced, thereby further increasing the aperture ratio of the display panel.

Figure 20:
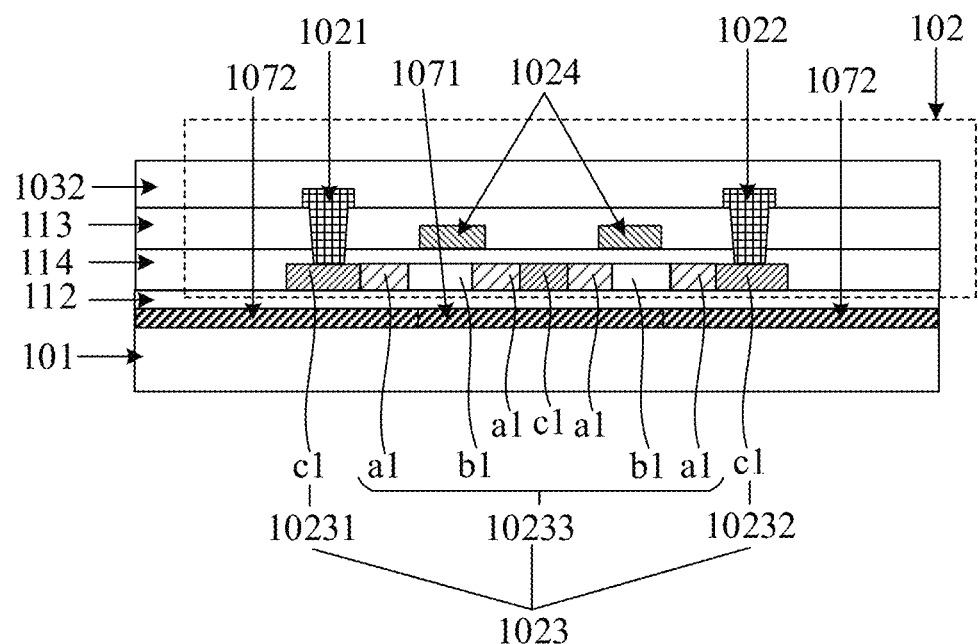
FIG. 20 is a schematic structural diagram of another thin film transistor according to an embodiment of the present disclosure.

Optionally, FIG. 20 is a schematic structural diagram of another thin film transistor according to an embodiment of the present disclosure. The intermediate portion 10233 includes four LDD regions a1, two channel regions b1 and a HDD region c1. The LDD regions a1 and the channel regions b1 are alternately arranged, and the HDD region c1 is disposed between the two LDD regions a1 which are between the two channel regions b1. An orthographic projection of the intermediate portion 10233 on the base substrate 101 is within the orthographic projection of the light shielding portion 1071 on the base substrate 101. With this arrangement, the size of the thin film transistor 102 can be effectively reduced, and thus the aperture ratio of the display panel can be increased. In addition, the overall power consumption can be reduced while the display luminance is improved.

Optionally, the substrate 10 may further include a gate insulating layer 113, a fifth insulating layer 114 and a sixth insulating layer 115. The gate insulating layer 113 may be disposed between the active layer 1023 and the gate line 1024, the fifth insulating layer 114 may be disposed between the gate line 1024 and the connecting line 106, and the sixth insulating layer 115 may be disposed between the filling block 105 and the common electrode pattern 109.

In summary, the embodiment of the present disclosure provides a substrate. The thin film transistor in the substrate can be electrically connected to the pixel electrode through the first via hole in the insulating layer. In addition, by arranging the filling block in the first via hole of the insulating layer, the flatness of the film layer above the first via hole of the insulating layer is good, thereby improving the quality of the film layer above the insulating layer.

Figure 21:
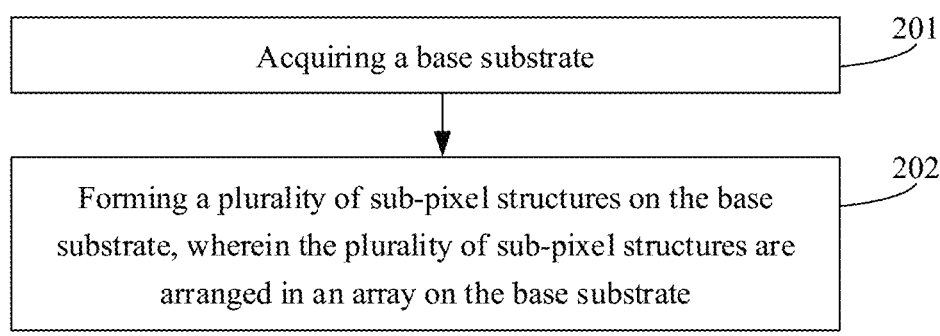
FIG. 21 is a flowchart of a method for manufacturing a substrate according to an embodiment of the present disclosure.

FIG. 21 is a flowchart of a method for manufacturing a substrate according to an embodiment of the present disclosure. The method may be applied to manufacture the substrate described in any of the above embodiments. Referring to FIG. 21, the method may include the following steps.

In step 201, a base substrate is acquired.

In step 202, a plurality of sub-pixel structures are formed on the base substrate, wherein the plurality of sub-pixel structures are arranged in an array on the base substrate.

Figure 22:
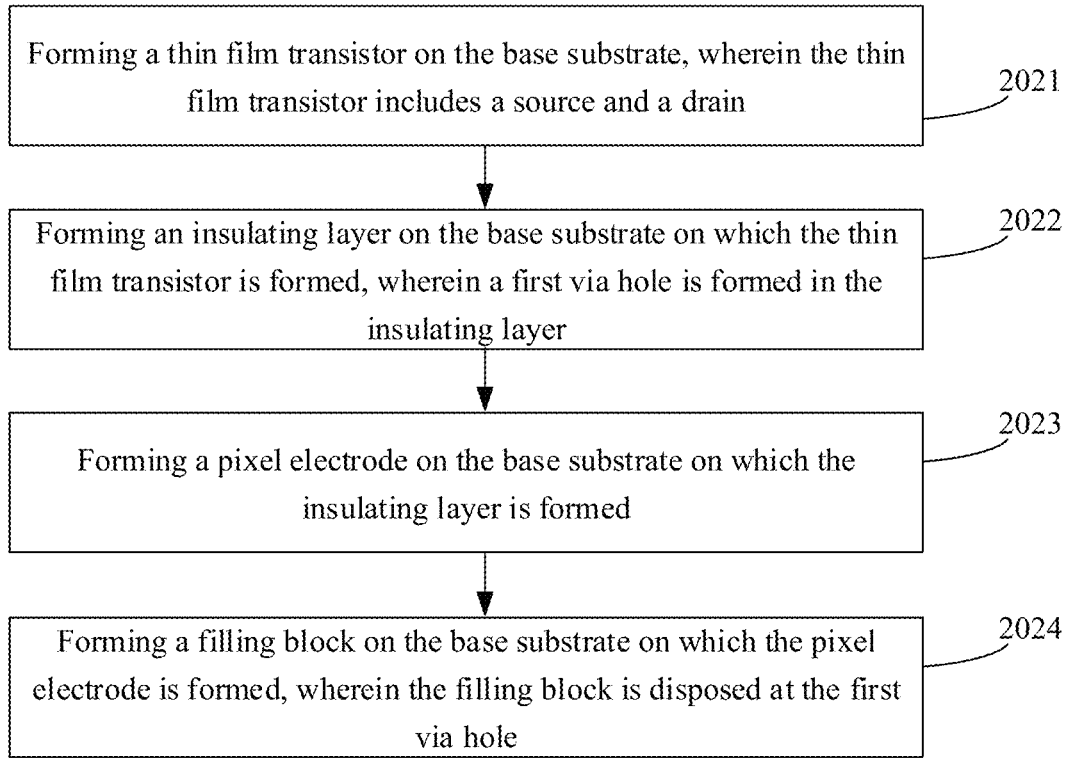
FIG. 22 is a flowchart of a method for manufacturing a sub-pixel structure according to an embodiment of the present disclosure.

Here, as shown in FIG. 22, step 202 may include the following four sub-steps.

In sub-step 2021, a thin film transistor is formed on the base substrate, wherein the thin film transistor includes a source and a drain.

In sub-step 2022, an insulating layer is formed on the base substrate on which the thin film transistor is formed, wherein a first via hole is formed in the insulating layer.

In sub-step 2023, a pixel electrode is formed on the base substrate on which the insulating layer is formed.

Here, the pixel electrode is electrically connected to either the source or the drain through the first via hole.

In sub-step 2024, a filling block is formed on the base substrate on which the pixel electrode is formed, wherein the filling block is disposed at the first via hole.

In summary, the embodiment of the present disclosure provides a method for manufacturing a substrate. The thin film transistor in the substrate can be electrically connected to the pixel electrode through the first via hole in the insulating layer. In addition, by arranging the filling block in the first via hole of the insulating layer, the flatness of the film layer above the first via hole of the insulating layer is good, thereby improving the quality of the film layer above the insulating layer.

Figure 23:
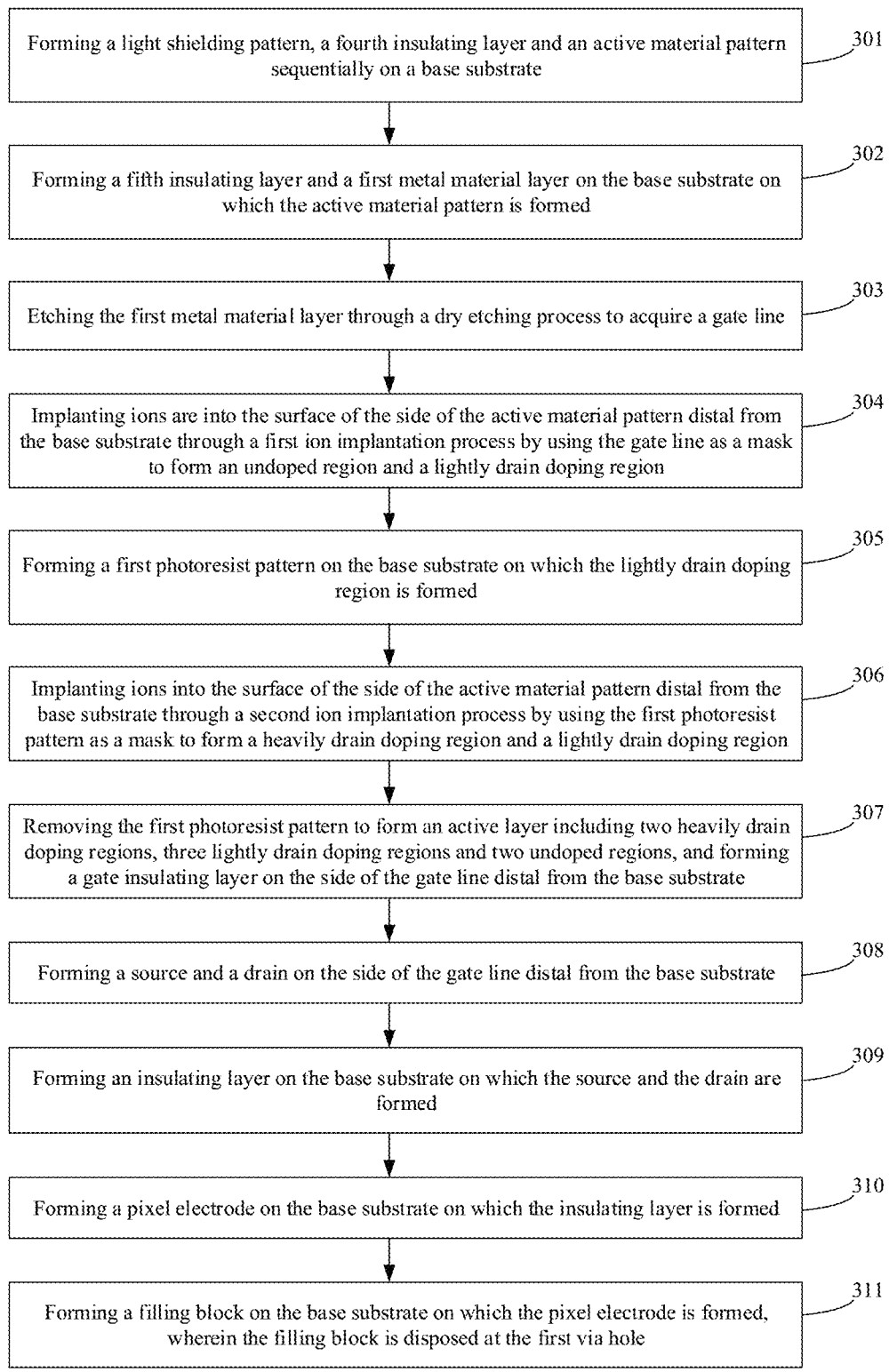
FIG. 23 is a flowchart of another method for manufacturing a substrate according to an embodiment of the present disclosure.
Figure 24:
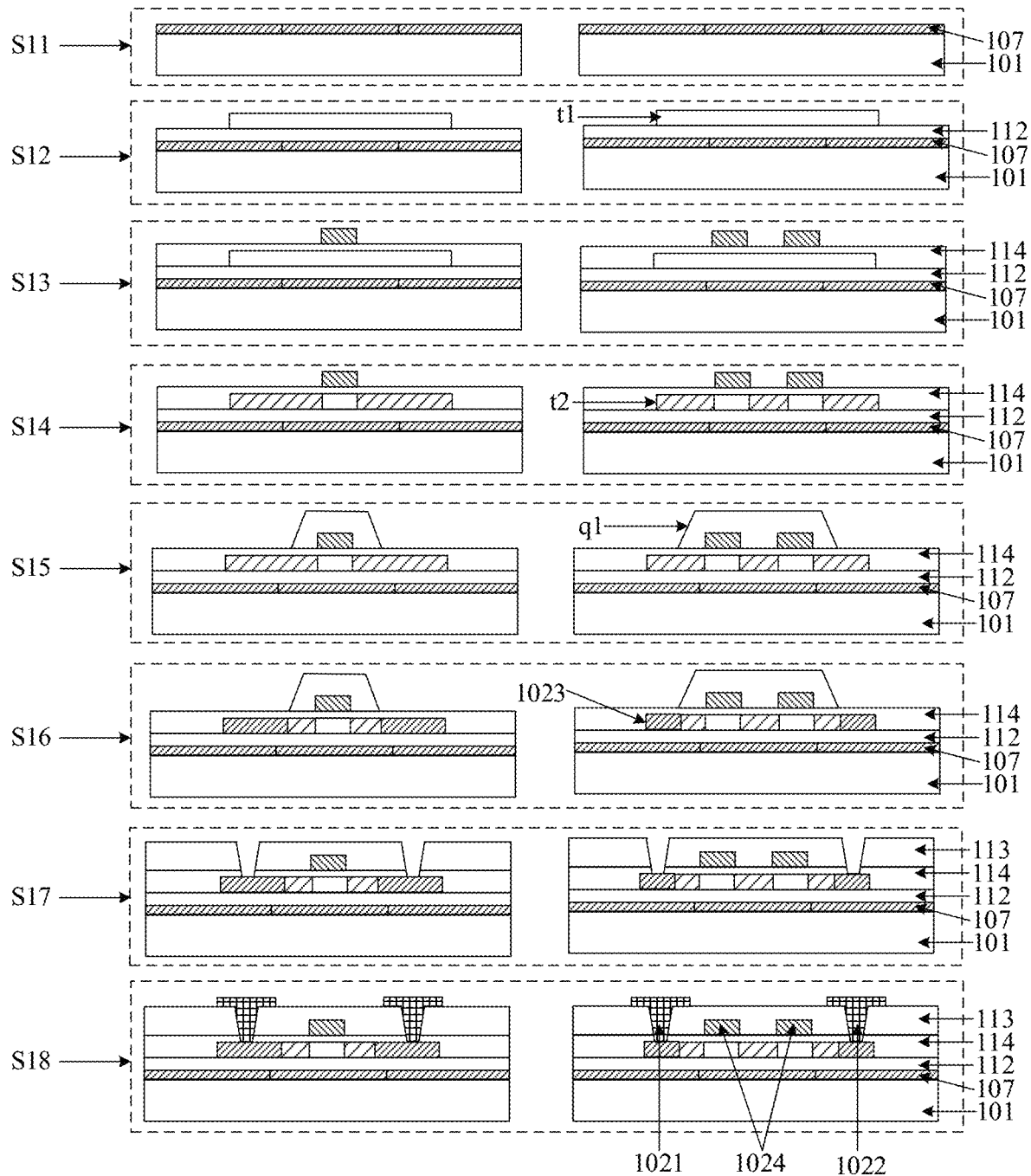
FIG. 24 is a schematic structural diagram of a substrate in the manufacturing process corresponding to FIG. 23.

FIG. 23 is a flowchart of another method for manufacturing a substrate according to an embodiment of the present disclosure. The method may be applied to manufacture the substrates according to the above embodiments, for example, the substrate as shown in FIG. 12. FIG. 24 is a schematic structural diagram of a base substrate in the manufacturing process corresponding to FIG. 23. The process for manufacturing the substrate shown in FIG. 23 may be made reference to FIG. 24. The method may include the following steps.

In step 301, a light shielding pattern, a fourth insulating layer and an active material pattern are sequentially formed on a base substrate.

The base substrate may be a flexible substrate, which may be made of a flexible material (for example, polyimide (PI)). Or, the base substrate may be a glass substrate. As shown in S11 and S12 in FIG. 24, the light shielding pattern 107 and the active material pattern t1 may be sequentially formed on the base substrate 101. The active material pattern t1 may be an active material pattern with the shape of an active layer formed by performing preliminary patterning on an active material but without ion doping.

In step 302, a fifth insulating layer and a first metal material layer are formed on the base substrate on which the active material pattern is formed.

The first metal material layer may be a gate thin film. The fifth insulating layer 114 may be configured to insulate the light shielding pattern 107 from the active material pattern t1.

In step 303, the first metal material layer is etched through a dry etching process to acquire a gate line.

By performing the dry etching process, the accuracy of the size of the gate line 1024 can be well controlled, such that the size of the gate line 1024 can be relatively small. As shown in S13 in FIG. 24, the first metal material layer is processed through the dry etching process to acquire the gate line 1024.

In step 304, ions are implanted into the surface of the side of the active material pattern distal from the base substrate through a first ion implantation process by using the gate line as a mask to form an undoped region and a lightly drain doping region.

The ion implantation process is a process in which ion beams accelerated to be with high energy are implanted into a surface layer of a semiconductor material to change physical and chemical properties of the surface layer. For example, boron, phosphorus or arsenic may be implanted into silicon to change the conductivity of a silicon surface. The depth and concentration of implanted ions can be accurately controlled by the ion implantation process.

As shown in S14 in FIG. 24, the ions are implanted into the surface of the side of the active material pattern t1 distal from the base substrate 101 through the first ion implantation process to form an active material pattern t2 including the undoped region and the lightly drain doping region. Here, the region, overlapped with the gate line 1024 in the direction perpendicular to the base substrate 101, of the active material pattern t2 may be the undoped region.

In step 305, a first photoresist pattern is formed on the base substrate on which the lightly drain doping region is formed.

The first photoresist pattern may cover part of the active material pattern in the direction perpendicular to the base substrate. As shown in S15 in FIG. 24, the first photoresist pattern q1 covers the partial region in the middle of the active material pattern t2 in the direction perpendicular to the base substrate 101.

In step 306, ions are implanted into the surface of the side of the active material pattern distal from the base substrate through a second ion implantation process by using the first photoresist pattern as a mask to form a heavily drain doping region and a lightly drain doping region.

The ion implantation process may be performed again on the partial region, uncovered by the first photoresist pattern, of the active material pattern, such that the uncovered region forms the heavily drain doping region. As shown in S16 in FIG. 24, a second ion implantation process may be performed on an edge region of the active material pattern t2 that is not covered by the first photoresist pattern q1 in the direction perpendicular to the base substrate 101. Through the above two ion implantation processes, the active layer 1023 including two heavily drain doping regions, three lightly drain doping regions and two undoped regions may be formed.

In step 307, the first photoresist pattern is removed to form an active layer including two heavily drain doping regions, three lightly drain doping regions and two undoped regions, and a gate insulating layer is formed on the side of the gate line distal from the base substrate.

As shown in S17 in FIG. 24, after the gate line 1024 is formed, the gate insulating layer 113 may be formed on the side of the gate line 1024 distal from the base substrate 101, such that the gate line 1024 is insulated from the source 1021 and the drain 1022 which are later formed. A via hole may be formed in the gate insulating layer 113.

In 308, a source and a drain are formed on the side of the gate line distal from the base substrate.

As shown in S18 in FIG. 24, after the gate line 1024 is formed, a source-drain thin film may be formed on the side of the gate line 1024 distal from the base substrate 101. Here, the material of the source-drain thin film may be a metal material, and may cover the entire base substrate 101. After the source-drain thin film is formed, the source-drain thin film may be patterned through a photo-etching process to acquire the source 1021 and the drain 1022. In this implementation, the source 1021 and the drain 1022 are formed by the same patterning process.

An orthographic projection of the source 1021 on the base substrate 101 is overlapped with an orthographic projection of one heavily drain doping region of the active layer 1023 on the base substrate 101. An orthographic projection of the drain 1022 on the base substrate 101 is overlapped with an orthographic projection of the other heavily drain doping region of the active layer 1023 on the base substrate 101. In addition, the source 1021 and the drain 1022 may be electrically connected to the active layer 1023 through the via hole in the gate insulating layer 113.

In step 309, an insulating layer is formed on the base substrate on which the source and the drain are formed.

The insulating layer may be of a single-layer structure or a multi-layer structure, and a first via hole may be formed in the insulating layer.

In step 310, a pixel electrode is formed on the base substrate on which the insulating layer is formed.

The pixel electrode may be electrically connected to either the source or the drain through the first via hole. The material of the pixel electrode may include indium tin oxide.

In step 311, a filling block is formed on the base substrate on which the pixel electrode is formed. The filling block is disposed at the first via hole.

The filling block 105 may be disposed in the first via hole to fill up the first via hole, such that the flatness of the film layer on the side of the insulating layer distal from the base substrate is good.

Figure 25:
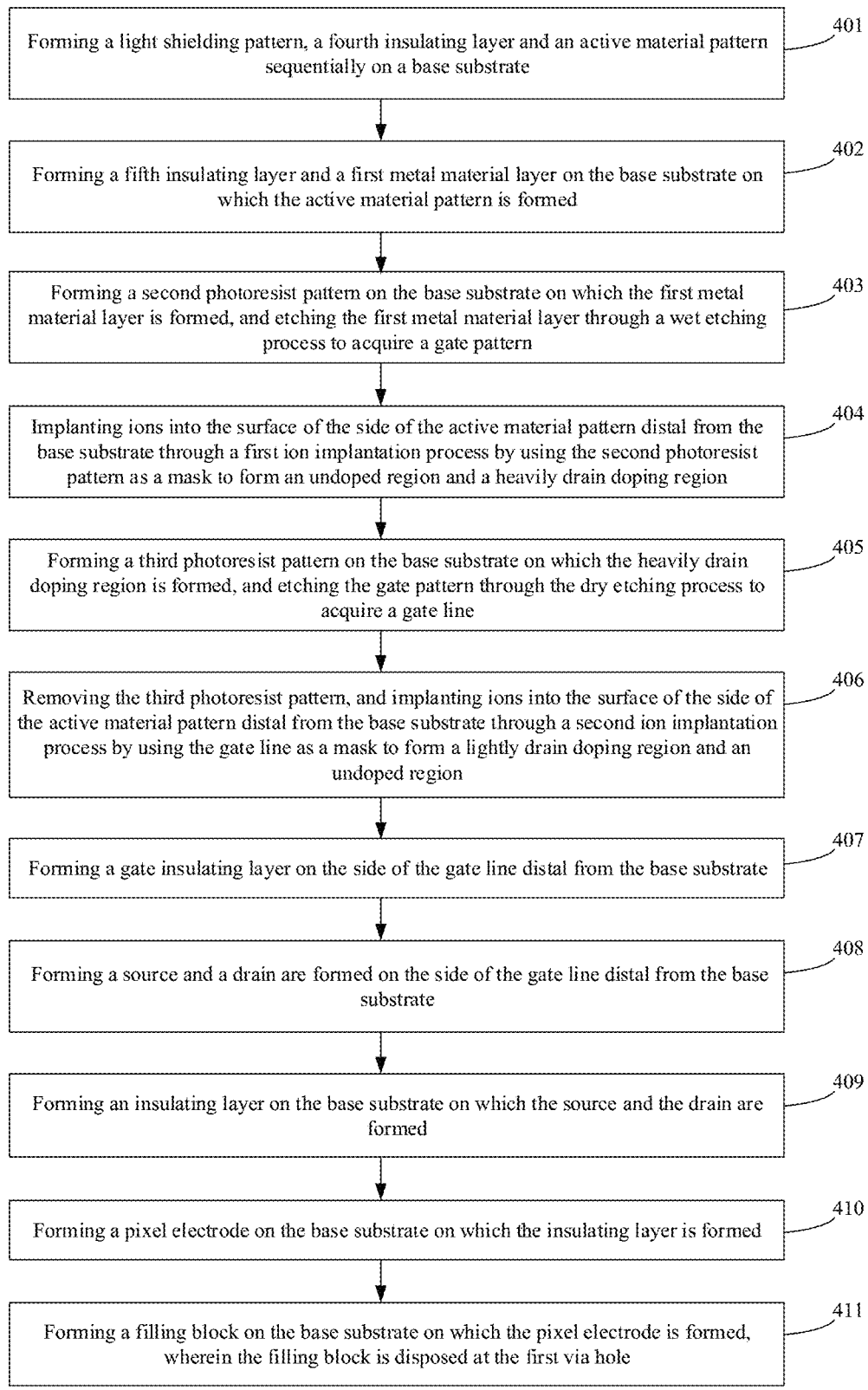
FIG. 25 is a flowchart of still another method for manufacturing a substrate according to an embodiment of the present disclosure.
Figure 26:
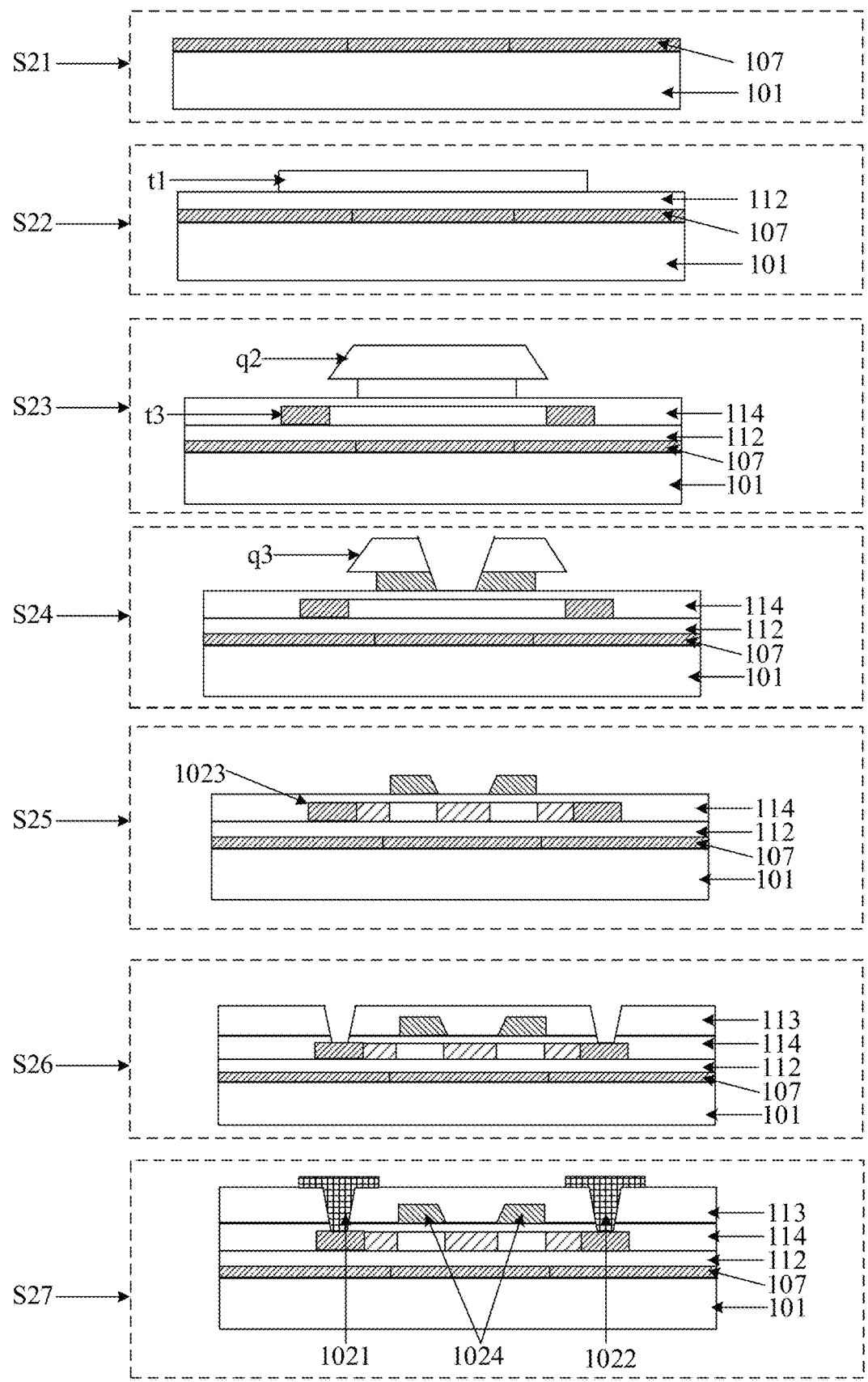
FIG. 26 is a schematic structural diagram of a substrate in the manufacturing process corresponding to FIG. 25.

FIG. 25 is a flowchart of still another method for manufacturing a substrate according to an embodiment of the present disclosure. The method may be applied to manufacture the substrates according to the above embodiments, for example, the substrate as shown in FIG. 12. FIG. 26 is a schematic structural diagram of the base substrate in the manufacturing process corresponding to FIG. 25. The process for manufacturing the substrate shown in FIG. 25 may be made reference to FIG. 26. The method may include the following steps.

In step 401, a light shielding pattern, a fourth insulating layer and an active material pattern are formed sequentially on a base substrate.

The base substrate may be a flexible substrate, which may be made of a flexible material (such as polyimide (PI)). Or, the base substrate may be a glass substrate. As shown in S21 and S22 in FIG. 26, the light shielding pattern 107 and the active material pattern t1 may be sequentially formed on the base substrate 101. The active material pattern t1 may be an active material pattern with the shape of an active layer formed by performing preliminary patterning on an active material but without ion doping.

In step 402, a fifth insulating layer and a first metal material layer are formed on the base substrate on which the active material pattern is formed.

The first metal material layer may be a gate thin film. The fifth insulating layer 114 may be configured to insulate the light shielding pattern 107 from the active material pattern t1.

In step 403, a second photoresist pattern is formed on base substrate on which the first metal material layer is formed, and the first metal material layer is etched through a wet etching process to acquire a gate pattern.

First, the wet etching may be performed on the first metal material layer to acquire a side edge of the gate line. As shown in S23 in FIG. 26, an orthographic projection of the second photoresist pattern q2 on the base substrate 101 covers a partial region of the active material pattern, and an edge region of the active material pattern is exposed in the direction perpendicular to the base substrate 101. Since the first metal material layer is processed by the wet etching process, an orthographic projection of the acquired gate pattern on the base substrate 101 may be within an orthographic projection of the second photoresist pattern q2 on the base substrate 101.

In 404, ions are implanted into the surface of the side of the active material pattern distal from the base substrate through a first ion implantation process by using the second photoresist pattern as a mask to form an undoped region and a heavily drain doping region.

As shown in S23 shown in FIG. 26, ions are implanted into the surface of the side of the active material pattern t1 distal from the base substrate 101 through the first ion implantation process to form an active material pattern t3 including the heavily drain doping region and the lightly drain doping region. Here, the region, overlapped with the second photoresist pattern q2 in the direction perpendicular to the base substrate 101, of the active material layer t3 may be the undoped region.

In step 405, a third photoresist pattern is formed on the base substrate on which the heavily drain doping region is formed, and the gate pattern may be etched through the dry etching process to acquire a gate line.

As shown in S24 in FIG. 26, since the gate line 1024 is processed by two different etching processes, the side surface of one side of the acquired gate line 1024 may be perpendicular to the plate surface of the base substrate 101, and a slope angle between the side surface of the other side of the gate line 1024 and a bottom surface, facing the base substrate 101, of the gate line 1024 may be relatively small, which can improve the flatness of the film layer on the gate line 1024.

In step 406, the third photoresist pattern is removed, and ions are implanted into the surface of the side of the active material pattern distal from the base substrate through a second ion implantation process by using the gate line as a mask to form a lightly drain doping region and an undoped region.

In this way, an active layer including two heavily drain doping regions, three lightly drain doping regions and two undoped regions may be acquired.

The ion implantation process may be performed on a part region, uncovered by the gate line, of the active material pattern, such that the uncovered region forms the lightly drain doping region. As shown in S25 in FIG. 26, one iron implantation process may be performed on three regions of the active material pattern t3 which are not covered by the gate line 1024 in the direction perpendicular to the base substrate 101. Through the above two ion implantation processes, the active layer 1023 including two heavily drain doping regions, three lightly drain doping regions and two undoped regions may be formed.

In step 407, a gate insulating layer is formed on the side of the gate line distal from the base substrate.

As shown in S26 in FIG. 26, after the gate line 1024 is formed, the gate insulating layer 113 may be formed on the side of the gate line 1024 distal from the base substrate 101, such that the gate line 1024 is insulated from the source 1021 and the drain 1022 later formed. A via hole may be formed in the gate insulating layer 113.

In step 408, a source and a drain are formed on the side of the gate line distal from the base substrate.

Step 408 may be made reference to step 307 in the embodiment shown in FIG. 23, and details are not repeated in the embodiment of the present disclosure. For the schematic structural diagram of the formed base substrate after step 408, reference may be made to S27 in FIG. 26.

In step 409, an insulating layer is formed on the base substrate on which the source and the drain are formed.

The insulating layer may be of a single-layer structure or a multi-layer structure, and a first via hole may be formed in the insulating layer.

In step 410, a pixel electrode is formed on the base substrate on which the insulating layer is formed.

The pixel electrode may be electrically connected to either the source or the drain through the first via hole. The material of the pixel electrode may include indium tin oxide.

In step 411, a filling block is formed on the base substrate on which the pixel electrode is formed. The filling block is disposed at the first via hole.

The filling block may be disposed in the first via hole to fill up the first via hole, such that the flatness of the film layer on the side of the insulating layer distal from the base substrate is good.

Figure 27:
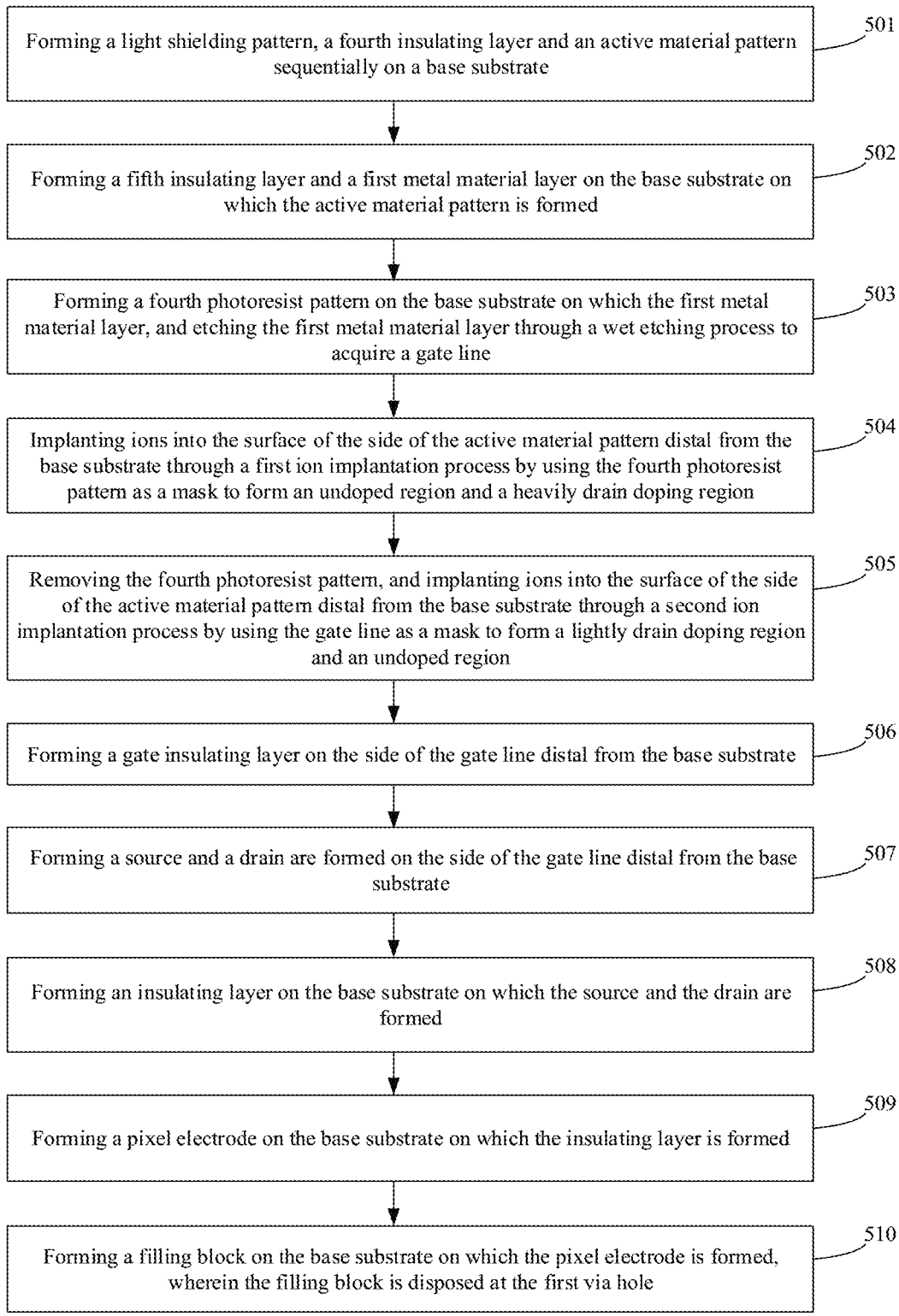
FIG. 27 is a flowchart of still another method for manufacturing a substrate according to an embodiment of the present disclosure.
Figure 28:
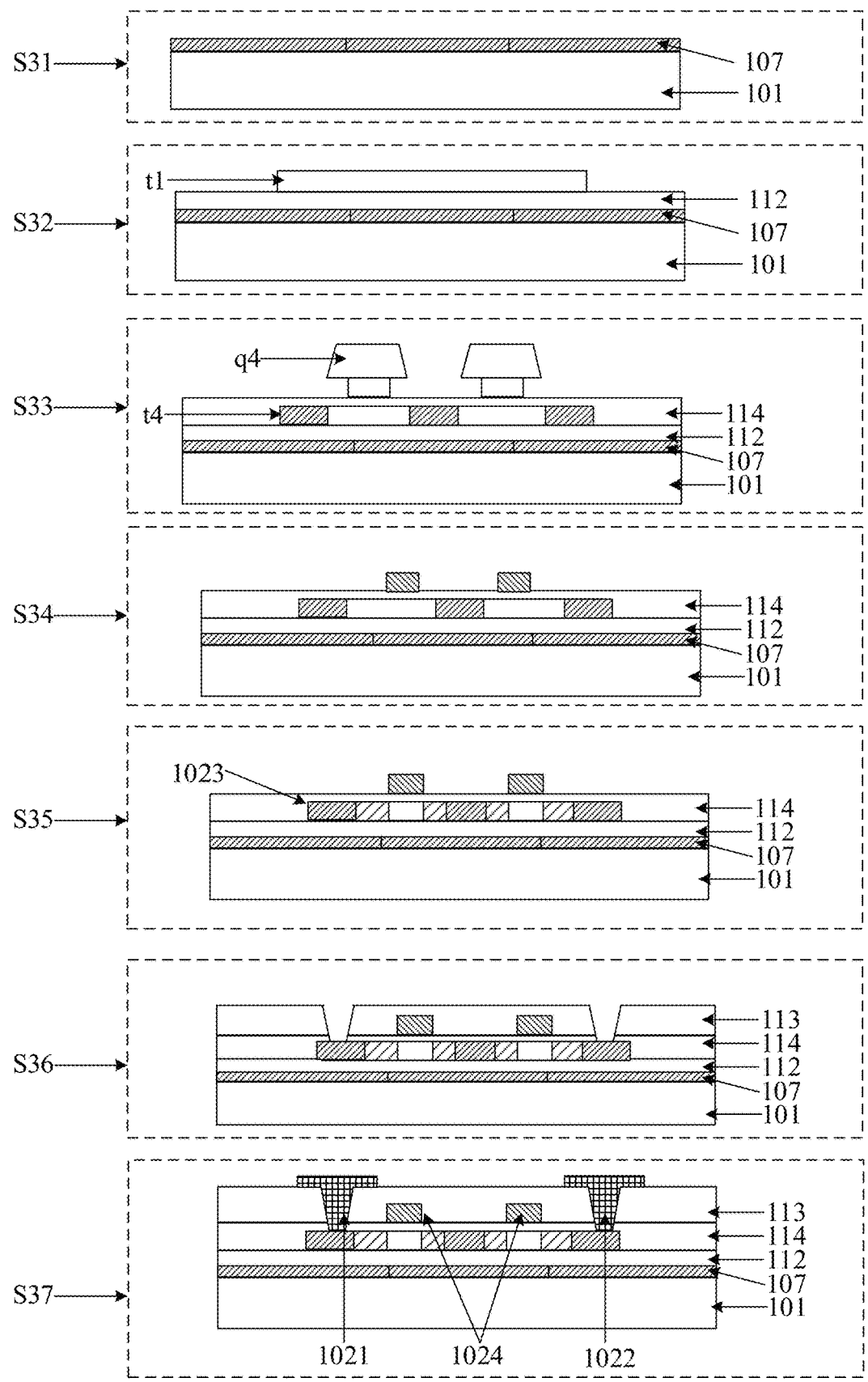
FIG. 28 is a schematic structural diagram of a substrate in the manufacturing process corresponding to FIG. 27.

FIG. 27 is a flowchart of still another method for manufacturing a substrate according to an embodiment of the present disclosure. The method may be applied to manufacture the substrates according to the above embodiments, for example, the substrate as shown in FIG. 20. FIG. 28 is a schematic structural diagram of the base substrate in the manufacturing process corresponding to FIG. 27. The process for manufacturing the substrate shown in FIG. 27 may be made reference to FIG. 28. The method may include the following steps.

In 501, a light shielding pattern, a fourth insulating layer and an active material pattern are sequentially formed on the base substrate.

Step 501 may be made reference to step 301 in the embodiment shown in FIG. 23, and details are not repeated in the embodiment of the present disclosure. For the schematic structural diagram of the formed base substrate after step 501, reference may be made to S31 and S32 in FIG. 28.

In step 502, a fifth insulating layer and a first metal material layer are formed on the base substrate on which the active material pattern is formed.

The first metal material layer may be a gate thin film. The fifth insulating layer 114 may be configured to insulate the light shielding pattern 107 from the active material pattern t1.

In step 503, a fourth photoresist pattern is formed on the base substrate on which the first metal material layer is formed, and the first metal material layer is etched through a wet etching process to acquire a gate line.

For the schematic structural diagram of the formed base substrate after step 503, reference may be made to S33 in FIG. 28. The fourth photoresist pattern q4 may include two parts of photoresist, and there is a preset distance between the two parts of photoresist so as to form two gate lines 1024 on the base substrate 101.

In 504, ions are implanted into the surface of the side of the active material pattern distal from the base substrate through a first ion implantation process by using the fourth photoresist pattern as a mask to form an undoped region and a heavily drain doping region.

As shown in S33 in FIG. 28, the region, overlapped with the fourth photoresist pattern q4 in the direction perpendicular to the base substrate 101, of the active material pattern t4 is an undoped region.

In step 505, the fourth photoresist pattern is removed, and ions are implantation into the surface of the side of the active material pattern distal from the base substrate through a second ion implantation process by using the gate line as a mask to form a lightly drain doping region and an undoped region, so as to acquire an active layer including three heavily drain doping regions, four lightly drain doping regions and two undoped regions.

For the schematic structural diagram of the formed base substrate after step 505, reference may be made to S34 and S35 in FIG. 28, and the active layer 1023 may include three heavily drain doping regions, four lightly drain doping regions and two undoped regions.

In step 506, a gate insulating layer is formed on the side of the gate line distal from the base substrate.

As shown in S36 in FIG. 28, after the gate line 1024 is formed, the gate insulating layer 113 may be formed on the side of the gate line 1024 distal from the base substrate 101, such that the gate line 1024 is insulated from the source 1021 and the drain 1022 later formed. A via hole may be formed in the gate insulating layer 113.

In step 507, a source and a drain are formed on the side of the gate line distal from the base substrate.

Step 507 may be made reference to step 307 in the embodiment shown in FIG. 23, and details are not repeated in the embodiment of the present disclosure. For the schematic structural diagram of the formed base substrate after step 507, reference may be made to S37 in FIG. 28.

In step 508, an insulating layer is formed on the base substrate on which the source and the drain are formed.

The insulating layer may be of a single-layer structure or a multi-layer structure, and a first via hole may be formed in the insulating layer.

In step 509, a pixel electrode is formed on the base substrate on which the insulating layer is formed.

The pixel electrode may be electrically connected to either the source or the drain through the first via hole. The material of the pixel electrode may include indium tin oxide.

In step 510, a filling block is formed on the base substrate on which the pixel electrode is formed. The filling block is disposed at the first via hole.

The filling block may be disposed in the first via hole to fill up the first via hole, such that the flatness of the film layer on the side of the insulating layer distal from the base substrate is good.

Figure 29:
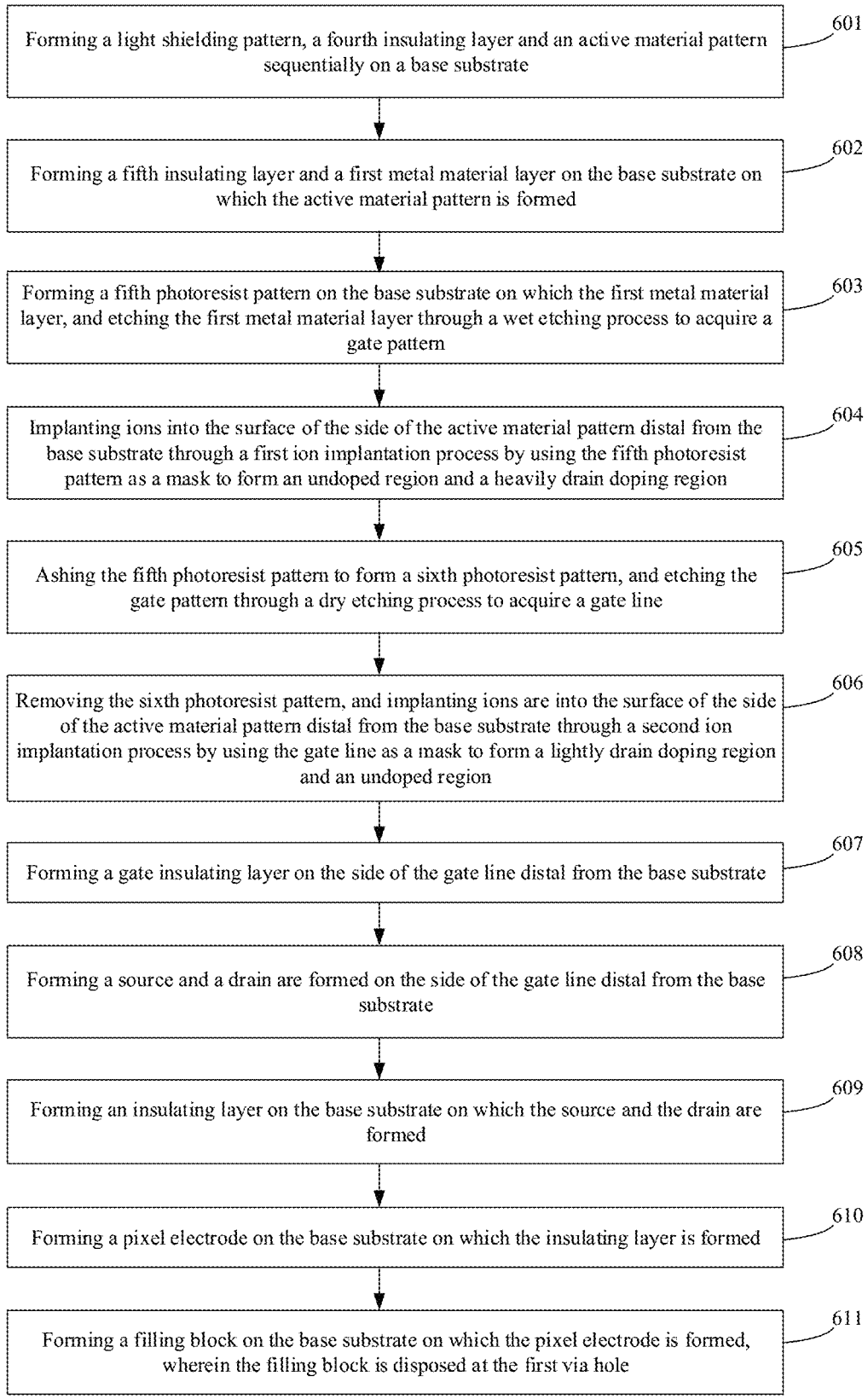
FIG. 29 is a flowchart of still another method for manufacturing a substrate according to an embodiment of the present disclosure.
Figure 30:
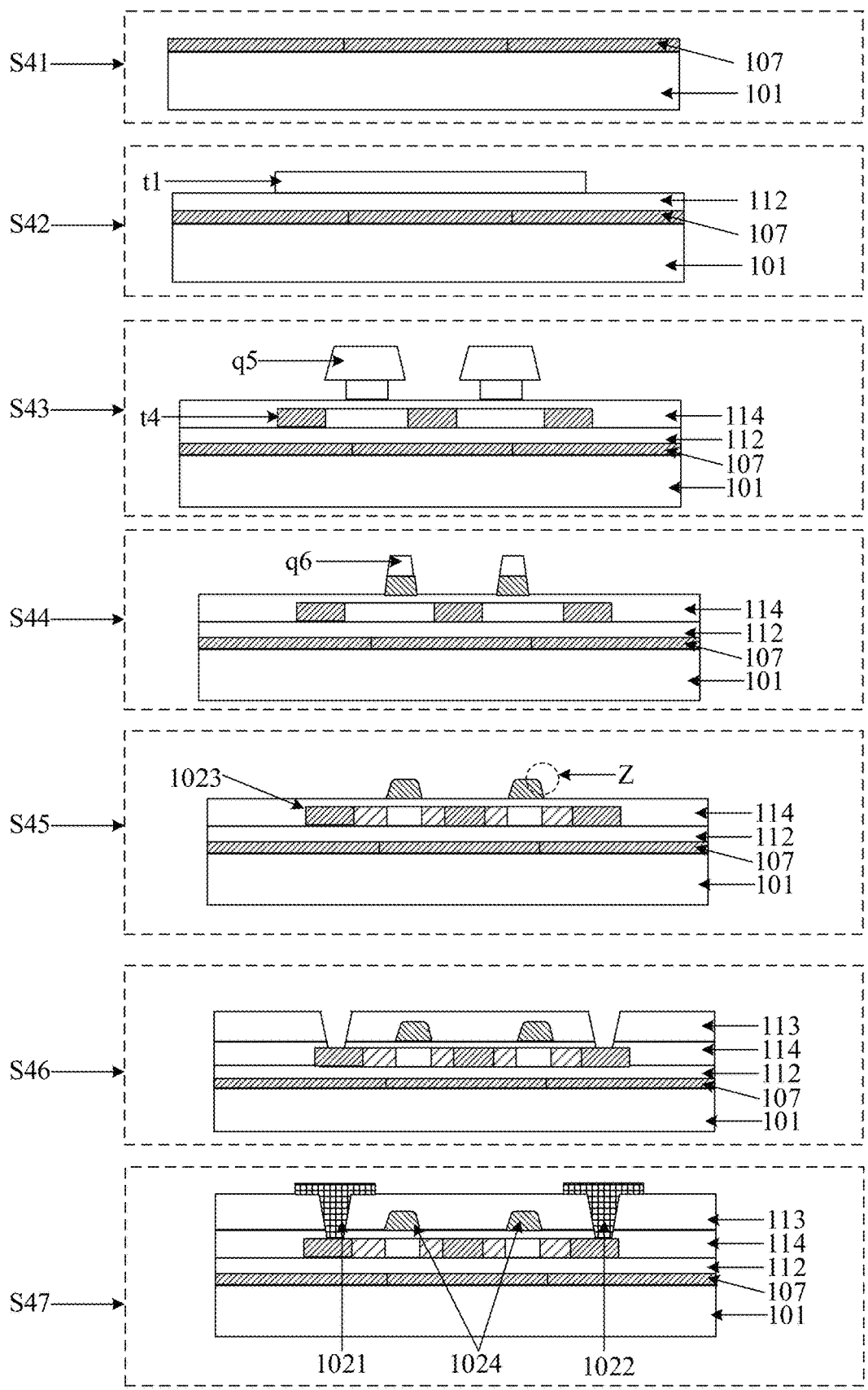
FIG. 30 is a schematic structural diagram of a substrate in the manufacturing process corresponding to FIG. 29.

FIG. 29 is a flowchart of still another method for manufacturing a substrate according to an embodiment of the present disclosure. The method may be applied to manufacture the substrates according to the above embodiments, for example, the substrate as shown in FIG. 20. FIG. 30 is a schematic structural diagram of the base substrate in the manufacturing process corresponding to FIG. 29. The process for manufacturing the substrate shown in FIG. 29 may be made reference to FIG. 30. The method may include the following steps.

In step 601, a light shielding pattern, a fourth insulating layer and an active material pattern are sequentially formed on a base substrate.

Step 601 may be made reference to step 301 in the embodiment shown in FIG. 23, and details are not repeated in the embodiment of the present disclosure. For the schematic structural diagram of the formed base substrate after step 601, reference may be made to S41 and S42 in FIG. 30.

In step 602, a fifth insulating layer and a first metal material layer are formed on the base substrate on which the active material pattern is formed.

The first metal material layer may be a gate thin film. The fifth insulating layer 114 may be configured to insulate the light shielding pattern 107 from the active material pattern t1.

In step 603, a fifth photoresist pattern is formed on the base substrate on which the first metal material layer is formed, and the first metal material layer is etched through a wet etching process to acquire a gate pattern.

For the schematic structural diagram of the formed base substrate after step 603, reference may be made to S43 in FIG. 30. The fifth photoresist pattern q5 may include two parts of photoresist, and there is a preset distance between the two parts of photoresist to form two gate patterns on the base substrate 101.

In step 604, ions are implant into the surface of the side of the active material pattern distal from the base substrate through a first ion implantation process by using the fifth photoresist pattern as a mask to form an undoped region and a heavily drain doping region.

As shown in S43 in FIG. 30, the region, overlapped with the fifth photoresist pattern q5 in the direction perpendicular to the base substrate 101, of the active material pattern t4 is an undoped region.

In step 605, the fifth photoresist pattern is ashed to form a sixth photoresist pattern, and the gate pattern is etched through a dry etching process to acquire a gate line.

As shown in S45 in FIG. 30, the formed gate pattern may be modified by the dry etching process, such that the top corner on the side, distal from the base substrate 101, of the gate line 1024 is a rounded corner Z. In this way, the flatness of the film layer above the gate line 1024 is good.

In step 606, the sixth photoresist pattern is removed, and ions are implanted into the surface of the side of the active material pattern distal from the base substrate through a second ion implantation process by using the gate line as a mask to form the lightly drain doping regions and the undoped region, so as to acquire an active layer including three heavily drain doping regions, four lightly drain doping regions and two undoped regions.

For the schematic structural diagram of the formed base substrate after step 606, reference may be made to S44 in FIG. 30, and the active layer 1023 may include three heavily drain doping regions, four lightly drain doping regions and two undoped regions.

In step 607, a gate insulating layer is formed on the side of the gate line distal from the base substrate.

As shown in S46 in FIG. 30, after the gate line 1024 is formed, the gate insulating layer 113 may be formed on the side of the gate line 1024 distal from the base substrate 101, such that the gate line 1024 is insulated from the source 1021 and the drain 1022 later formed. A via hole may be formed in the gate insulating layer 113.

In step 608, a source and a drain are formed on the side of the gate line distal from the base substrate.

Step 608 may be made reference to step 307 in the embodiment shown in FIG. 23, and details are not repeated in the embodiment of the present disclosure. For the schematic structural diagram of the formed base substrate after step 608, reference may be made to S47 in FIG. 30.

In step 609, an insulating layer is formed on the base substrate on which the source and the drain are formed.

The insulating layer may be of a single-layer structure or a multi-layer structure, and a first via hole may be formed in the insulating layer.

In step 610, a pixel electrode is formed on the base substrate on which the insulating layer is formed.

The pixel electrode may be electrically connected to either the source or the drain through the first via hole. The material of the pixel electrode may include indium tin oxide.

In step 611, a filling block is formed on the base substrate on which the pixel electrode is formed. The filling block is disposed at the first via hole.

The filling block may be disposed in the first via hole to fill up the first via hole, such that the flatness of the film layer on the side of the insulating layer distal from the base substrate is good.

Figure 31:
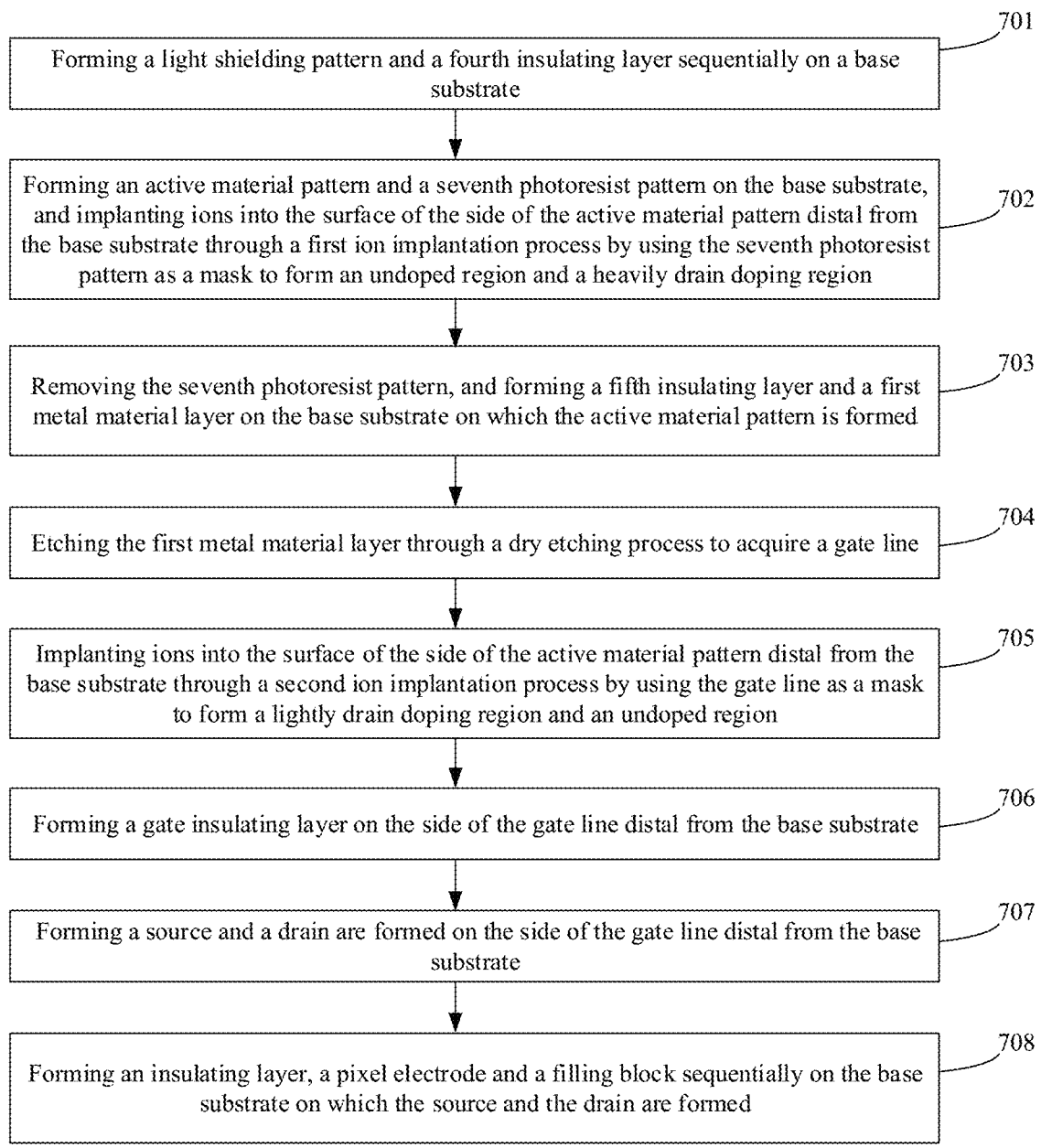
FIG. 31 is a flowchart of still another method for manufacturing a substrate according to an embodiment of the present disclosure.
Figure 32:
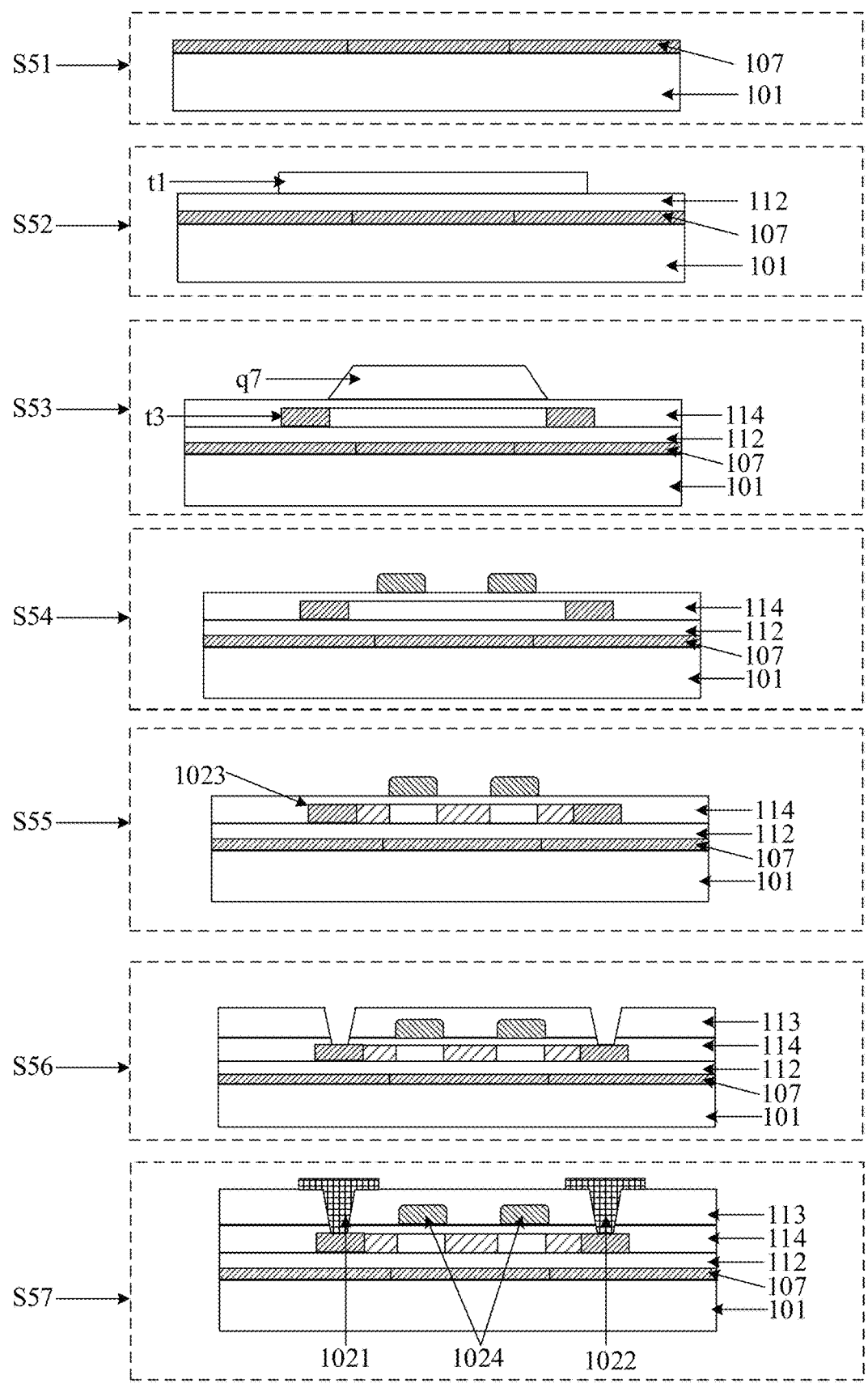
FIG. 32 is a schematic structural diagram of a substrate in the manufacturing process corresponding to FIG. 31.

FIG. 31 is a flowchart of still another method for manufacturing a substrate according to an embodiment of the present disclosure. The method may be applied to manufacture the substrates according to the above embodiments, for example, the substrate as shown in FIG. 12. FIG. 32 is a schematic structural diagram of the base substrate in the manufacturing process corresponding to FIG. 31. The process for manufacturing the substrate shown in FIG. 31 may be made reference to FIG. 32. The method may include the following steps.

In step 701, a light shielding pattern and a fourth insulating layer are formed sequentially on a base substrate.

Step 701 may be made reference to step 301 in the embodiment shown in FIG. 23, and details are not repeated in the embodiment of the present disclosure. For the schematic structural diagram of the formed base substrate after step 701, reference may be made to S51 and S52 in FIG. 32.

In step 702, an active material pattern and a seventh photoresist pattern are formed on the base substrate, and ions are implanted into the surface of the side of the active material pattern distal from the base substrate through a first ion implantation process by using the seventh photoresist pattern as a mask to form an undoped region and a heavily drain doping region.

As shown in S53 in FIG. 32, the region, overlapped with the seventh photoresist pattern q7 in the direction perpendicular to the base substrate 101, of the active material pattern is an undoped region.

In step 703, the seventh photoresist pattern is removed, and a fifth insulating layer and a first metal material layer are formed on the base substrate on which the active material pattern is formed.

As shown in S53 in FIG. 32, the first metal material layer may be a gate thin film. The fifth insulating layer 114 may be configured to insulate the light shielding pattern 107 from the active material pattern t3.

In step 704, the first metal material layer is etched through a dry etching process to acquire a gate line.

By performing the dry etching process, the accuracy of the size of the gate line 1024 can be well controlled, such that the size of the gate line 1024 can be relatively small. As shown in S54 in FIG. 32, the first metal material layer is processed through the dry etching process to acquire the gate line 1024.

In step 705, ions are implanted into the surface of the side of the active material pattern distal from the base substrate through a second ion implantation process by using the gate line as a mask to form a lightly drain doping region and an undoped region, so as to acquire an active layer including two heavily drain doping regions, three lightly drain doping regions and two undoped regions.

As shown in S55 in FIG. 32, ions are implanted into the surface of the side of the active material pattern distal from the base substrate 101 through the second ion implantation process by using the gate line 1024 as a mask to form the lightly drain doping regions a1 and the undoped region, thereby acquiring the active layer 1023 including two heavily drain doping regions, three lightly drain doping regions and two undoped regions.

In step 706, a gate insulating layer is formed on the side of the gate line distal from the base substrate.

As shown in S56 in FIG. 30, after the gate line 1024 is formed, the gate insulating layer 113 may be formed on the side of the gate line 1024 distal from the base substrate 101, such that the gate line 1024 is insulated from the source 1021 and the drain 1022 later formed. A via hole may be formed in the gate insulating layer 113.

In step 707, a source and a drain are formed on the side of the gate line distal from the base substrate.

Step 707 may be made reference to step 307 in the embodiment shown in FIG. 23, and details are not repeated in the embodiment of the present disclosure. For the schematic structural diagram of the formed base substrate after step 707, reference may be made to S57 in FIG. 32.

In step 708, an insulating layer, a pixel electrode and a filling block are sequentially formed on the base substrate on which the source and the drain are formed.

The insulating layer may be of a single-layer structure or a multi-layer structure, and a first via hole may be formed in the insulating layer. The pixel electrode may be electrically connected to either the source or the drain through the first via hole. The material of the pixel electrode may include indium tin oxide. The filling block may be disposed in the first via hole to fill up the first via hole, such that the flatness of the film layer on the side of the insulating layer distal from the base substrate is good.

Figure 33:
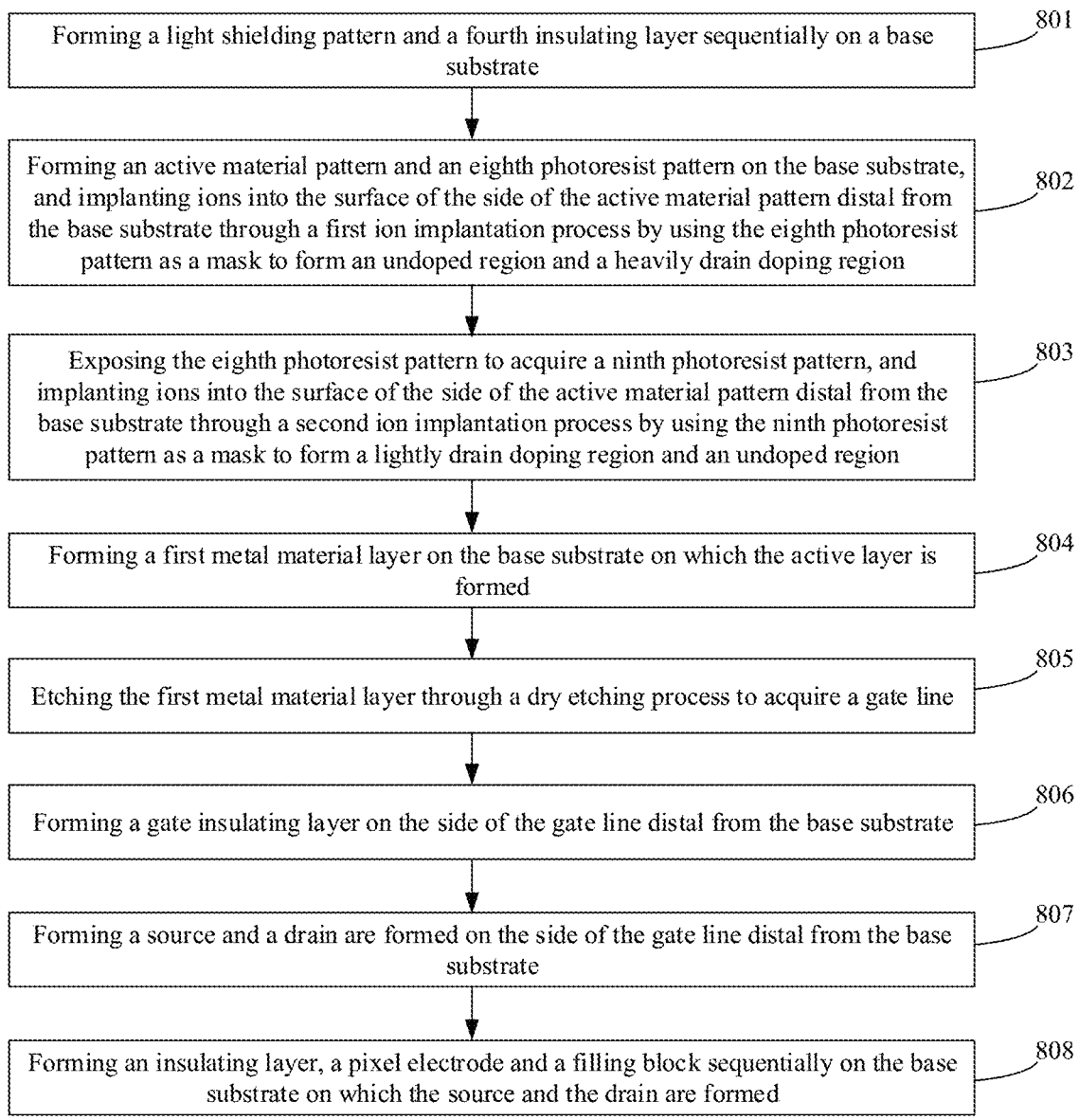
FIG. 33 is a flowchart of still another method for manufacturing a substrate according to an embodiment of the present disclosure.
Figure 34:
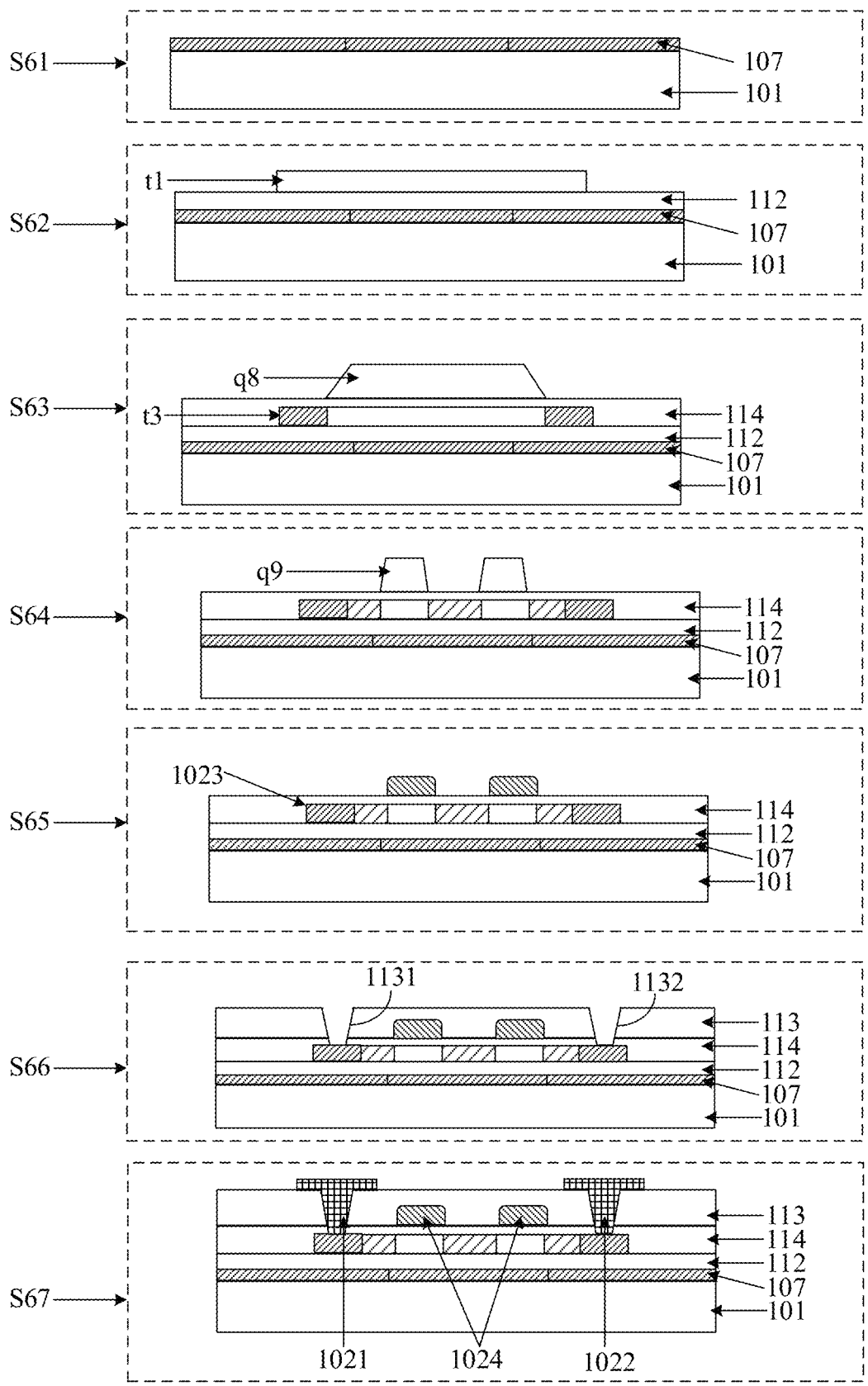
FIG. 34 is a schematic structural diagram of a substrate in the manufacturing process corresponding to FIG. 32.

FIG. 33 is a flowchart of still another method for manufacturing a substrate according to an embodiment of the present disclosure. The method may be applied to manufacture the substrates according to the above embodiments, for example, the substrate as shown in FIG. 12. FIG. 34 is a schematic structural diagram of the base substrate in the manufacturing process corresponding to FIG. 32. The process for manufacturing the substrate shown in FIG. 33 may be made reference to FIG. 34. The method may include the following steps.

In step 801, a light shielding pattern and a fourth insulating layer are sequentially formed on a base substrate.

Step 801 may be made reference to step 301 in the embodiment shown in FIG. 23, and details are not repeated in the embodiment of the present disclosure. For the schematic structural diagram of the formed base substrate after step 801, reference may be made to S61 and S62 in FIG. 34.

In step 802, an active material pattern and an eighth photoresist pattern are formed on the base substrate, and ions are implanted into the surface of the side of the active material pattern distal from the base substrate through a first ion implantation process by using the eighth photoresist pattern as a mask to form an undoped region and a heavily drain doping region.

As shown in S63 in FIG. 34, the region, overlapped with the eighth photoresist pattern q8 in the direction perpendicular to the base substrate 101, of the active material pattern is an undoped region. Before the eighth photoresist pattern q8 is formed, a fifth insulating layer 114 may be formed. The fifth insulating layer 114 may be configured to insulate the light shielding pattern 107 from the active material pattern t3.

In step 803, the eighth photoresist pattern is exposed to acquire a ninth photoresist pattern, and ions are implanted into the surface of the side of the active material pattern distal from the base substrate through a second ion implantation process by using the ninth photoresist pattern as a mask to form a lightly drain doping region and an undoped region, so as to acquire an active layer including two heavily drain doping regions, two lightly drain doping regions and two undoped regions.

As shown in S64 in FIG. 34, the region, overlapped with the ninth photoresist pattern q9 in the direction perpendicular to the base substrate 101, of the active material pattern is an undoped region.

In step 804, a first metal material layer is formed on the base substrate on which the active layer is formed.

The first metal material layer may be a gate thin film.

In step 805, the first metal material layer is etched through a dry etching process to acquire a gate line.

By performing the dry etching process, the accuracy of the size of the gate line 1024 can be well controlled, such that the size of the gate line 1024 can be relatively small. As shown in S65 in FIG. 34, the first metal material layer is processed through the dry etching process to acquire the gate line 1024.

In step 806, a gate insulating layer is formed on the side of the gate line distal from the base substrate.

As shown in S66 in FIG. 34, after the gate line 1024 is formed, the gate insulating layer 113 may be formed on the side of the gate line 1024 distal from the base substrate 101, such that the gate line 1024 is insulated from the source 1021 and the drain 1022 later formed.

A third via hole 1131 and a fourth via hole 1132 are formed in the fifth insulating layer 114 and the gate insulating layer 113, and the third via hole 1131 and the fourth via hole 1132 are on the side of the heavily drain doping region distal from the base substrate.

In step 807, a source and a drain are formed on the side of the gate insulating layer distal from the base substrate.

A source/drain layer is formed on the base substrate 101 on which the gate insulating layer 113 is formed, and the source/drain layer includes a source and a drain. The source 1021 and the drain 1022 may be electrically connected to two heavily drain doping regions through the third via hole 1131 and the fourth via hole 1132, respectively. For the schematic structural diagram of the formed base substrate after step 807, reference may be mad to S67 in FIG. 34.

In step 808, an insulating layer, a pixel electrode and a filling block are sequentially formed on the base substrate on which the source and the drain are formed.

The insulating layer may be of a single-layer structure or a multi-layer structure, and a first via hole may be formed in the insulating layer. The pixel electrode may be electrically connected to either the source or the drain through the first via hole. The material of the pixel electrode may include indium tin oxide. The filling block may be disposed in the first via hole to fill up the first via hole, such that the flatness of the film layer on the side of the insulating layer distal from the base substrate is good.

In summary, the embodiments of the present disclosure provide a method for manufacturing a substrate. The thin film transistor in the substrate may be electrically connected to the pixel electrode through the first via hole in the insulating layer. In addition, by arranging the filling block in the first via hole of the insulating layer, the flatness of the film layer above the first via hole of the insulating layer is good. Therefore, the quality of the film layer above the insulating layer can be improved.

The embodiments of the present disclosure further provide a display panel. The display panel may include a base substrate, and the above substrate disposed on the base substrate. The substrate may be the substrate provided in the above embodiments.

Optionally, the display panel may be a liquid crystal display device, an organic light-emitting diode (OLED) display device (for example, an active-matrix organic light-emitting diode (AMOLED)), electronic paper, a mobile phone, a tablet computer, a TV, a display, a notebook computer, a digital photo frame, a navigator, or any other product or component having a display function and a fingerprint identification function.

The term "at least one of A and B" in the present disclosure is merely intended to describe an association relationship among associated objects, and may indicate three relationships. For example, "at least one of A and B" may mean that A exists alone, A and B exist concurrently, or B exists alone. Similarly, "at least one of A, B and C" may indicate seven relationships, which may mean that A exists alone, B exists alone, C exists alone, A and B exist concurrently, A and C exist concurrently, C and B exist concurrently, and A, B and C exist concurrently. Similarly, "at least one of A, B, C and D" indicates fifteen relationships which may mean A exists alone, B exists alone, C exists alone, D exists alone, A and B exist concurrently, A and C exist concurrently, A and D exist concurrently, C and B exist concurrently, D and B exist concurrently, C and D exist concurrently, A, B, and C exist concurrently, A, B, and D exist concurrently, A, C, and D exist concurrently, B, C, and D exist concurrently, and A, B, C, and D exist concurrently.

It should be noted that in the accompanying drawings, the dimensions of layers and regions may be exaggerated for the clarity of illustration. Moreover, it is to be understood that when an element or a layer is referred to as "on" another element or layer, the element or layer may be directly arranged on the other element, or there may be an intermediate layer. In addition, it is to be understood that when an element or a layer is referred to as "below" another element or layer, the element or layer may be directly arranged below the other element, or there may be more than one intermediate layer or element. In addition, understandably, when a layer or an element is referred to as "between" two layers or two elements, the layer or element may be the only layer between the two layers or two elements, or there may be more than one intermediate layer or element. Similar reference numerals indicate similar elements throughout.

The terms "first", "second", "third" and "fourth" used in the present disclosure are merely used for descriptive purpose, but not denote or imply any relative importance. The term "a plurality of" means two or more, unless otherwise expressly specified.

The above descriptions are merely optional embodiments of the present disclosure, but are not intended to limit the present disclosure. Any modifications, equivalent substitutions, improvements and the like made within the spirit and principle of the present disclosure should be included within the scope of protection of the present disclosure.

What is claimed is:

1. A substrate, comprising:
  a base substrate; and
  a plurality of sub-pixel structures arranged in an array on the base substrate,
  wherein the sub-pixel structure comprises:
    a thin film transistor disposed on the base substrate, the thin film transistor comprising a source and a drain;
    an insulating layer disposed on a side of the thin film transistor distal from the base substrate, a first via hole being formed in the insulating layer;
    a pixel electrode disposed on a side of the insulating layer distal from the base substrate, the pixel electrode being electrically connected to either the source or the drain through the first via hole; and
    a filling block disposed at the first via hole,
  wherein the thin film transistor further comprises an active layer and a gate line; wherein the active layer is disposed on a side, proximal to the base substrate, of the source and the drain, and the active layer is electrically connected to the source and the drain; and the gate line is disposed on a side of the active layer distal from the base substrate, and an orthographic projection of the gate line on the base substrate is overlapped with an orthographic projection of the active layer on the base substrate; and
  wherein an orthographic projection of a center of the first via hole on the base substrate is between orthographic projections of two active lavers adjacent in a first direction on the base substrate, the first direction being parallel to an extension direction of the gate line.

2. The substrate according to claim 1, wherein the base substrate further comprises a connecting line disposed on a side of the gate line distal from the base substrate; wherein
  an orthographic projection of one end of the connecting line on the base substrate is overlapped with an orthographic projection of the first via hole on the base substrate, and an orthographic projection of the other end of the connecting line on the base substrate is overlapped with an orthographic projection of a first electrode on the base substrate, the first electrode being the source or drain that is electrically connected to the pixel electrode; and
  a material of the connecting line comprises a light-transmitting conductive material, one end of the connecting line is electrically connected to the pixel electrode, and the other end of the connecting line is electrically connected to the first electrode.

3. The substrate according to claim 1,
  further comprising:
  a light shielding pattern disposed on a side of the active layer proximal to the base substrate, wherein an orthographic projection of the light shielding pattern on the base substrate is overlapped with the orthographic projection of the active layer on the base substrate, and a surface of the light shielding pattern facing the base substrate is a reflective surface.

4. The substrate according to claim 3, wherein the light shielding pattern comprises: a first base, and a reflective layer disposed on a surface of the first base facing the base substrate; wherein
  a material of the first base comprises at least one of titanium, tin and molybdenum, and a material of the reflective layer comprises aluminum; or
  a material of the light shielding pattern comprises an aluminum alloy.

5. The substrate according to claim 3, wherein the active layer comprises a source contact portion, a drain contact portion, and an intermediate portion disposed between the source contact portion and the drain contact portion; wherein
  a size of the source contact portion in a first direction and a size of the drain contact portion in the first direction are greater than a size of the intermediate portion in the first direction; and the orthographic projection of the active layer on the base substrate is at least partially overlapped with the orthographic projection of the light shielding pattern on the base substrate; an extension direction of the gate line being parallel to the first direction.

6. The substrate according to claim 5, wherein the light shielding pattern comprises a plurality of light shielding portions and a plurality of connecting portions; wherein
the light shielding portion is connected to the connecting portion, the light shielding portion is extended along the first direction, and the plurality of light shielding portions are arranged along a second direction; and
the connecting portions are disposed on two sides of the light shielding portion in the second direction, the connecting portion is extended along the second direction, and the plurality of connecting portions are arranged along the first direction;
wherein the second direction intersects the first direction.

7. The substrate according to claim 6, wherein
edges, in the first direction, of an orthographic projection of the connecting portion on the base substrate are flush with edges, in the first direction, of orthographic projections of the source contact portion and the drain contact portion of the active layer on the base substrate.

8. The substrate according to claim 6, further comprising; a data line disposed on a side, distal from the base substrate, of the source and the drain; wherein the insulating layer comprises a first insulating layer and a planarization layer sequentially laminated in a direction distal from the base substrate, wherein
the first insulating layer is disposed on the side, distal from the base substrate, of the source and the drain; and
the planarization layer is disposed on a side of the data line distal from the base substrate;
wherein a second via hole is formed in the first insulating layer, and the data line is electrically connected to either the source or the drain through the second via hole.

9. The substrate according to claim 8, wherein the insulating layer further comprises a second insulating layer disposed between the first insulating layer and the planarization layer, wherein the second insulating layer is disposed on the side of the data line distal from the base substrate.

10. The substrate according to claim 6, further comprising a common electrode pattern disposed on a side of the pixel electrode distal from the base substrate; wherein
the common electrode pattern comprises a first electrode portion, wherein a material of the first electrode portion comprises metal, the first electrode portion comprises a plurality of first strip-shaped electrodes, and an orthographic projection of the connecting portion on the base substrate is within an orthographic projection of the first electrode portion on the base substrate.

11. The substrate according to claim 10, further comprising a data line disposed on a side, distal from the base substrate, of the source and the drain, wherein an orthographic projection of the data line on the base substrate and the orthographic projection of the active layer on the base substrate are within the orthographic projection of the first electrode portion on the base substrate.

12. The substrate according to claim 10, wherein the common electrode pattern further comprises a second electrode portion; wherein
a material of the second electrode portion comprises a light-transmitting conductive material, the second electrode portion comprises a plurality of second strip-shaped electrodes, and the first strip-shaped electrodes and the second strip-shaped electrodes are alternately arranged.

13. The substrate according to claim 10, further comprising a compensation electrode and a data line; wherein the insulating layer comprises a first insulating layer, a third insulating layer, a second insulating layer and a planarization layer which are sequentially laminated along a direction distal from the base substrate; wherein
the first insulating layer is disposed on a side, distal from the base substrate, of the source and the drain;
the compensation electrode is disposed between the first insulating layer and the third insulating layer;
the data line is disposed between the third insulating layer and the second insulating layer;
the common electrode pattern is disposed on a side of the planarization layer distal from the base substrate; and
the compensation electrode is electrically connected to the common electrode pattern, and an orthogonal projection of the compensation electrode on the base substrate is overlapped with an orthogonal projection of the data line on the base substrate.

14. The substrate according to claim 1, wherein at least one of the plurality of sub-pixel structures comprises a first filling block protruding from the first via hole.

15. The substrate according to claim 6, wherein there is one of:
the intermediate portion comprises two lightly drain doping regions and a channel region, the lightly drain doping regions being disposed on two sides of the channel region; wherein an orthographic projection of the channel region on the base substrate is within an orthographic projection of the light shielding portion on the base substrate, and orthographic projections of the source contact portion, the drain contact portion and the two lightly drain doping regions on the base substrate are within an orthographic projection of the connecting portion on the base substrate;
the intermediate portion comprises three lightly drain doping regions and two channel regions, the lightly drain doping regions and the channel regions being alternately arranged; wherein orthographic projections of the two channel regions on the base substrate and an orthographic projection of the lightly drain doping region between the two channel regions on the base substrate are within an orthographic projection of the light shielding portion on the base substrate, and orthographic projections of the source contact portion, the drain contact portion and the lightly drain doping regions on two sides of the two channel regions on the base substrate are within an orthographic projection of the connecting portion on the base substrate;
the intermediate portion comprises three lightly drain doping regions and two channel regions, the lightly drain doping regions and the channel regions being alternately arranged; wherein orthographic projections of the two channel regions on the base substrate and an orthographic projection of the lightly drain doping region between the two channel regions on the base substrate are within an orthographic projection of the light shielding portion on the base substrate, and an orthographic projection of the connecting portion on the base substrate is within orthographic projections of the source contact portion, the drain contact portion and the lightly drain doping regions on two sides of the two channel regions on the base substrate; or
the intermediate portion comprises four lightly drain doping regions, two channel regions and one heavily drain doping region, the lightly drain doping regions and the channel regions being alternately arranged, and the heavily drain doping region being disposed between the two lightly drain doping regions between the two channel regions; wherein an orthographic projection of the intermediate portion on the base substrate is within an orthographic projection of the light shielding portion on the base substrate.

16. A method for manufacturing a substrate, comprising:
acquiring a base substrate; and
forming a plurality of sub-pixel structures on the base substrate, the plurality of sub-pixel structures being arranged in an array on the base substrate;
wherein forming the sub-pixel structure on the base substrate comprises:
- forming a thin film transistor on the base substrate, the thin film transistor comprising a source and a drain; wherein the thin film transistor further comprises an active layer and a gate line: wherein the active layer is disposed on a side, proximal to the base substrate, of the source and the drain, and the active layer is electrically connected to the source and the drain; and the gate line is disposed on a side of the active layer distal from the base substrate, and an orthographic projection of the gate line on the base substrate is overlapped with an orthographic projection of the active layer on the base substrate;
- forming an insulating layer on the base substrate on which the thin film transistor is formed, a first via hole being formed in the insulating layer, wherein an orthographic projection of a center of the first via hole on the base substrate is between orthographic projections of two active layers adjacent in a first direction on the base substrate, the first direction being parallel to an extension direction of the gate line;
- forming a pixel electrode on the base substrate on which the insulating layer is formed, the pixel electrode being electrically connected to either the source or the drain through the first via hole; and
- forming a filling block on the base substrate on which the pixel electrode is formed, the filling block being disposed at the first via hole.

17. The method for manufacturing the substrate according to claim 16, wherein there is one of:
forming the thin film transistor on the base substrate comprises:
- forming an active material pattern on the base substrate;
- forming a fifth insulating layer and a first metal material layer on the base substrate on which the active material pattern is formed;
- processing the first metal material layer through a dry etching process to acquire the gate line;
- implanting ions into a surface of a side of the active material pattern distal from the base substrate through a first ion implantation process by using the gate line as a mask to form an undoped region and a lightly drain doping region;
- forming a first photoresist pattern on the base substrate on which the lightly drain doping region is formed;
- implanting ions into the surface of the side of the active material pattern distal from the base substrate through a second ion implantation process by using the first photoresist pattern as a mask to form a heavily drain doping region and a lightly drain doping region, and
- removing the first photoresist pattern to form the active layer comprising two heavily drain doping regions, three lightly drain doping regions and two undoped regions;

forming the thin film transistor on the base substrate comprises:
- forming an active material pattern on the base substrate;
- forming a fifth insulating layer and a first metal material layer on the base substrate on which the active material pattern is formed;
- forming a second photoresist pattern on the base substrate on which first metal material layer is formed and processing the first metal material layer through a wet etching process to acquire a gate pattern;
- implanting ions into a surface of a side of the active material pattern distal from the base substrate through a first ion implantation process by using the second photoresist pattern as a mask to form an undoped region and a heavily drain doping region;
- forming a third photoresist pattern on the base substrate on which the heavily drain doping region is formed, and processing the gate pattern through a dry etching process to acquire the gate line; and
- removing the third photoresist pattern, and implanting ions into the surface of the side of the active material pattern distal from the base substrate through a second ion implantation process by using the gate line as a mask to form a lightly drain doping region and an undoped region, so as to acquire the active layer comprising two heavily drain doping regions, three lightly drain doping regions and two undoped regions;

forming the thin film transistor on the base substrate comprises:
- forming an active material pattern on the base substrate;
- forming a fifth insulating layer and a first metal material layer on the base substrate on which the active material pattern is formed;
- forming a fourth photoresist pattern on the base substrate on which formed first metal material layer is formed and processing the first metal material layer through a wet etching process to acquire the gate line;
- implanting ions into a surface of a side of the active material pattern distal from the base substrate through a first ion implantation process by using the fourth photoresist pattern as a mask to form an undoped region and a heavily drain doping region; and
- removing the fourth photoresist pattern, and implanting ions into the surface of the side of the active material pattern distal from the base substrate through a second ion implantation process by using the gate line as a mask to form a lightly drain doping regions and an undoped region, so as to acquire the active layer comprising three heavily drain doping regions, four lightly drain doping regions and two undoped regions;

forming the thin film transistor on the base substrate comprises:
- forming an active material pattern on the base substrate;
- forming a fifth insulating layer and a first metal material layer on the base substrate on which the active material pattern is formed;

forming a fifth photoresist pattern on the base substrate on which first metal material layer is formed;

processing the first metal material layer through a wet etching process to acquire a gate pattern;

implanting ions into a surface of a side of the active material pattern distal from the base substrate through a first ion implantation process by using the fifth photoresist pattern as a mask to form an undoped region and a heavily drain doping region;

ashing the fifth photoresist pattern to form a sixth photoresist pattern, and processing the gate pattern through a dry etching process to acquire the gate line; and removing the sixth photoresist pattern, implanting ions into the surface of the side of the active material pattern distal from the base substrate through a second ion implantation process by using the gate line as a mask to form a lightly drain doping region and an undoped region, so as to acquire the active layer comprising three heavily drain doping regions, four lightly drain doping regions and two undoped regions;

forming the thin film transistor on the base substrate comprises:

forming an active material pattern and a seventh photoresist pattern on the base substrate;

implanting ions into a surface of a side of the active material pattern distal from the base substrate through a first ion implantation process by using the seventh photoresist pattern as a mask to form an undoped region and a heavily drain doping region;

removing the seventh photoresist pattern, and forming a fifth insulating layer and a first metal material layer on the base substrate on which the active material pattern is formed;

processing the first metal material layer through a dry etching process to acquire the gate line; and implanting ions into the surface of the side of the active material pattern distal from the base substrate through a second ion implantation process by using the gate line as a mask to form a lightly drain doping region and an undoped region, so as to acquire the active layer comprising two heavily drain doping regions, three lightly drain doping regions and two undoped regions; or forming the thin film transistor on the base substrate comprises:

forming an active material pattern and an eighth photoresist pattern on the base substrate;

implanting ions into a surface of a side of the active material pattern distal from the base substrate through a first ion implantation process by using the eighth photoresist pattern as a mask to form an undoped region and a heavily drain doping region;

exposing the eighth photoresist pattern to acquire a ninth photoresist pattern, and implanting ions into the surface of the side of the active material pattern distal from the base substrate through a second ion implantation process by using the ninth photoresist pattern as a mask to form a lightly drain doping region and an undoped region, so as to acquire the active layer comprising two heavily drain doping regions, three lightly drain doping regions and two undoped regions, forming a fifth insulating layer and a first metal material layer on the base substrate on which the active layer is formed; and processing the first metal material layer through a dry etching process to acquire the gate line.

18. The method for manufacturing the substrate according to claim 17, wherein forming the thin film transistor on the base substrate further comprises:

forming a gate insulating layer on the base substrate on which the gate line is formed;

forming a third via hole and a fourth via hole in the gate insulating layer and the fifth insulating layer, the third via hole and the fourth via hole being on a side of the heavily drain doping region distal from the base substrate; and forming a source/drain layer on the base substrate on which the gate insulating layer is formed, wherein the source/drain layer comprises a source and a drain which are electrically connected to the heavily drain doping region through the third via hole and the fourth via hole respectively.

19. A display panel, comprising: a first base substrate, and a substrate, wherein the substrate is disposed on the first base substrate, and the substrate comprises:

a second base substrate; and a plurality of sub-pixel structures arranged in an array on the second base substrate, wherein the sub-pixel structure comprises:

a thin film transistor disposed on the second base substrate, the thin film transistor comprising a source and a drain;

an insulating layer disposed on a side of the thin film transistor distal from the second base substrate, a first via hole being formed in the insulating layer;

a pixel electrode disposed on a side of the insulating layer distal from the second base substrate, the pixel electrode being electrically connected to either the source or the drain through the first via hole; and a filling block disposed at the first via hole, wherein the thin film transistor further comprises an active layer and a gate line; wherein the active layer is disposed on a side, proximal to the base substrate, of the source and the drain, and the active layer is electrically connected to the source and the drain; and the gate line is disposed on a side of the active layer distal from the base substrate, and an orthographic projection of the gate line on the base substrate is overlapped with an orthographic projection of the active layer on the base substrate; and wherein an orthographic projection of a center of the first via hole on the base substrate is between orthographic projections of two active layers adjacent in a first direction on the base substrate, the first direction being parallel to an extension direction of the gate line.

* * * * *